(12) United States Patent
Chang et al.

(10) Patent No.: US 11,653,500 B2
(45) Date of Patent: May 16, 2023

(54) MEMORY ARRAY CONTACT STRUCTURES

(71) Applicant: Taiwan Semiconductor Manufacturing Co., Ltd., Hsinchu (TW)

(72) Inventors: Chih-Yu Chang, New Taipei (TW); Meng-Han Lin, Hsinchu (TW); Sai-Hooi Yeong, Zhubei (TW); Bo-Feng Young, Taipei (TW); Yu-Ming Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/125,435

(22) Filed: Dec. 17, 2020

(65) Prior Publication Data

US 2021/0408046 A1    Dec. 30, 2021

Related U.S. Application Data

(60) Provisional application No. 63/044,101, filed on Jun. 25, 2020.

(51) Int. Cl.
*H01L 27/11597* (2017.01)
*H01L 29/78* (2006.01)
*G11C 11/22* (2006.01)
*H01L 27/11587* (2017.01)
*H01L 23/535* (2006.01)
(Continued)

(52) U.S. Cl.
CPC .... *H01L 27/11597* (2013.01); *G11C 11/2255* (2013.01); *H01L 23/535* (2013.01);
(Continued)

(58) Field of Classification Search
CPC ......... H01L 27/11578; H01L 27/11585; H01L 27/1159; H01L 27/11597; H01L 29/66787; H01L 29/6684; H01L 29/78648
See application file for complete search history.

(56) References Cited

U.S. PATENT DOCUMENTS 10,868,042 B1 * 12/2020 Zhang .............. H01L 27/11597
2007/0072439 A1    3/2007 Akimoto et al.
(Continued)

FOREIGN PATENT DOCUMENTS

CN    108401468 A  *  8/2018 ............. B82Y 10/00
JP    201703328 A    6/2017
(Continued)

OTHER PUBLICATIONS

Park, J. et al., "A hybrid ferroelectric-flash memory cells," J. Appl. Phys. 116, 124512, Sep. 29, 2014, 8 pages.

*Primary Examiner* — Matthew E Warren
(74) *Attorney, Agent, or Firm* — Slater Matsil, LLP

(57) ABSTRACT

A memory cell includes a transistor including a memory film extending along a word line; a channel layer extending along the memory film, wherein the memory film is between the channel layer and the word line; a source line extending along the memory film, wherein the memory film is between the source line and the word line; a first contact layer on the source line, wherein the first contact layer contacts the channel layer and the memory film; a bit line extending along the memory film, wherein the memory film is between the bit line and the word line; a second contact layer on the bit line, wherein the second contact layer contacts the channel layer and the memory film; and an isolation region between the source line and the bit line.

20 Claims, 59 Drawing Sheets

(51) Int. Cl.
  *H01L 27/1159* (2017.01)
  *H01L 29/66* (2006.01)
(52) U.S. Cl.
  CPC .... *H01L 27/1159* (2013.01); *H01L 27/11587* (2013.01); *H01L 29/6684* (2013.01); *H01L 29/66787* (2013.01); *H01L 29/78391* (2014.09)

(56) References Cited

U.S. PATENT DOCUMENTS

| | | |
|---|---|---|
| 2008/0265235 A1* | 10/2008 | Kamigaichi .......... H01L 27/249 257/E47.001 |
| 2016/0086970 A1 | 3/2016 | Peng |
| 2016/0322368 A1 | 11/2016 | Sun et al. |
| 2017/0148517 A1 | 5/2017 | Harari |
| 2017/0154894 A1 | 6/2017 | Yoshimizu et al. |
| 2017/0301684 A1 | 10/2017 | Park et al. |
| 2019/0067325 A1 | 2/2019 | Yano |
| 2019/0295626 A1 | 9/2019 | Ikeda et al. |
| 2020/0026990 A1 | 1/2020 | Lue |
| 2020/0105773 A1 | 4/2020 | Morris et al. |
| 2020/0343252 A1* | 10/2020 | Lai .................... H01L 27/11578 |
| 2021/0036019 A1* | 2/2021 | Sharangpani ..... H01L 27/11587 |
| 2022/0037362 A1* | 2/2022 | Lin .................. H01L 29/40111 |

FOREIGN PATENT DOCUMENTS

| | | | |
|---|---|---|---|
| JP | 2019504479 A | 2/2019 | |
| TW | 201913963 A | 4/2019 | |
| WO | WO-2019152226 A1 * | 8/2019 | ......... G11C 16/0483 |

* cited by examiner

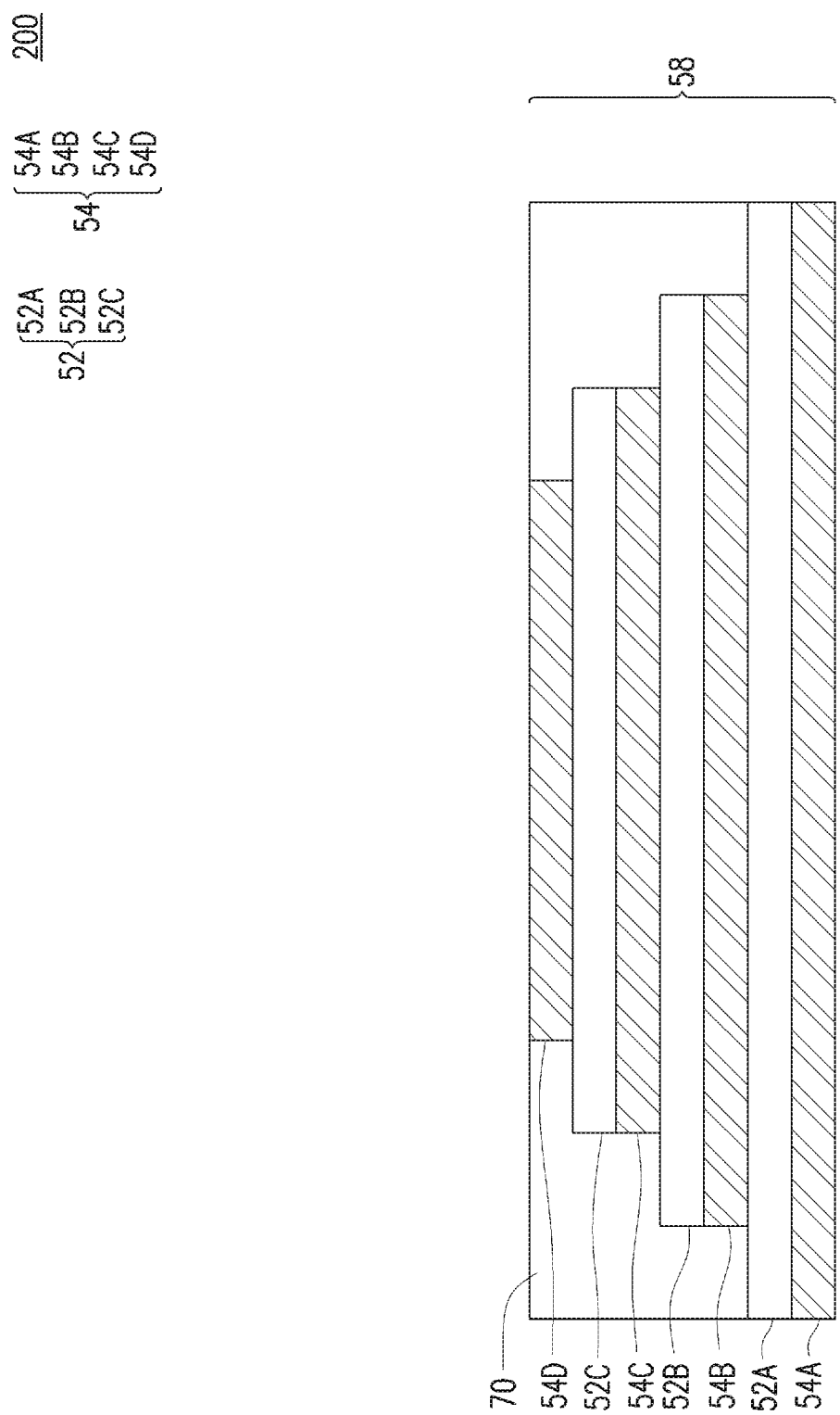

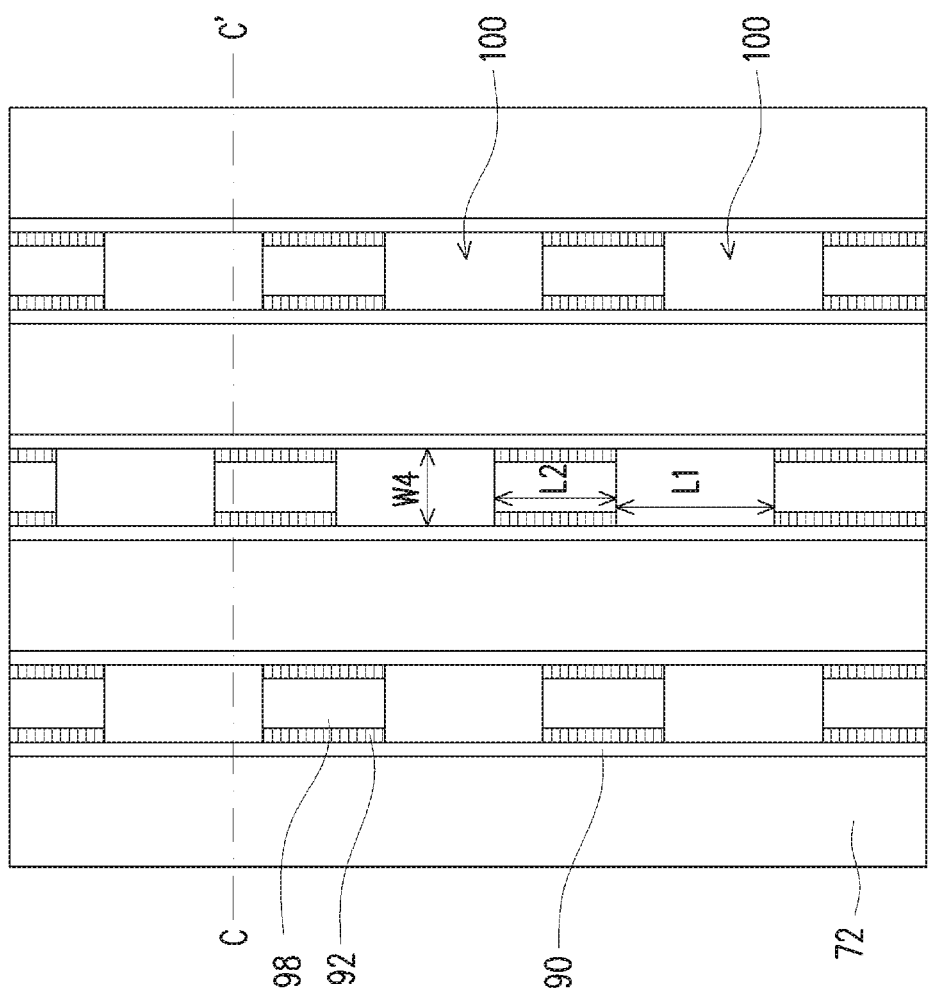

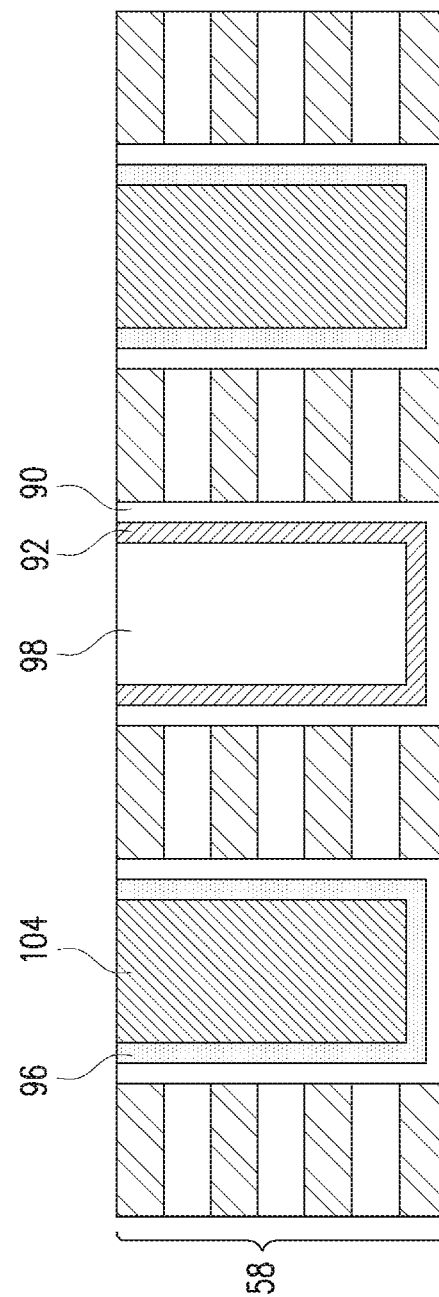

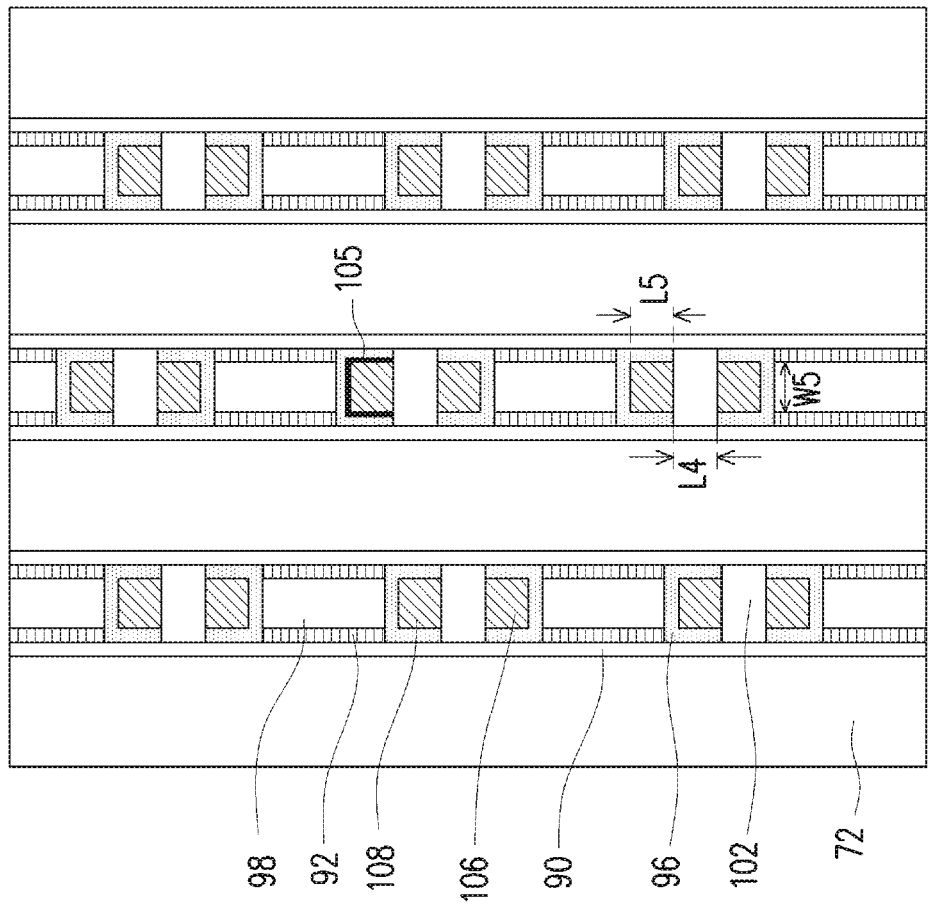

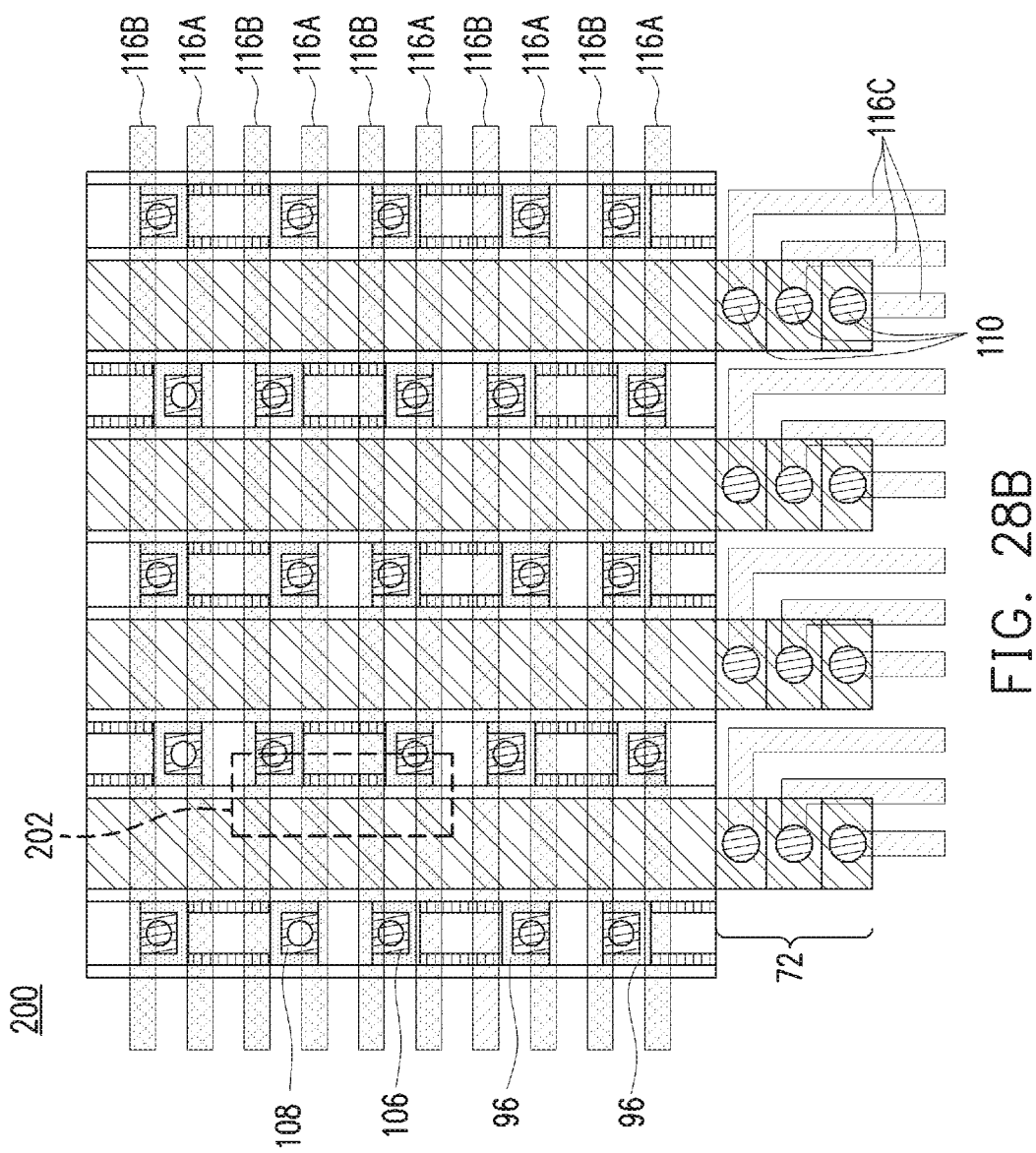

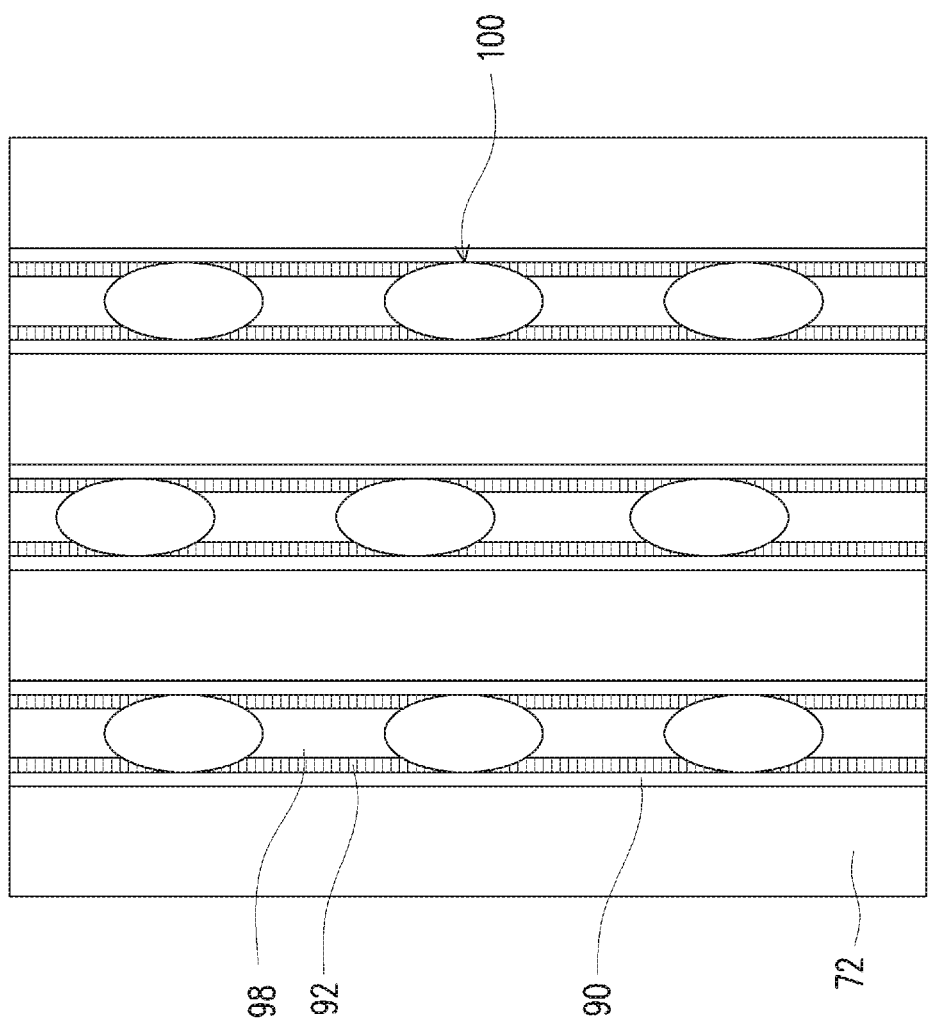

MEMORY ARRAY CONTACT STRUCTURES

PRIORITY CLAIM AND CROSS-REFERENCE

This application claims the benefit of U.S. Provisional Application No. 63/044,101, filed on Jun. 25, 2020, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4, 5, 6, 7, 8, 9, 10, 11, 12A, 12B, 13, 14A, 14B, 15, 16, 17A, 17B, 18A, 18B, 19A, 19B, 20, 21A, 21B, 21C, 22A, 22B, 22C, 23A, 23B, 23C, 24A, 24B, 24C, 25A, 25B, 25C, 26A, 26B, 26C, 27, 28A, 28B, 28C, and 28D illustrate varying views of intermediate steps in the manufacture of a memory array, in accordance with some embodiments.

FIGS. 29, 30, 31, and 32 illustrate varying views of intermediate steps in the manufacture of a memory array, in accordance with some embodiments.

DETAILED DESCRIPTION

Figure 1A:
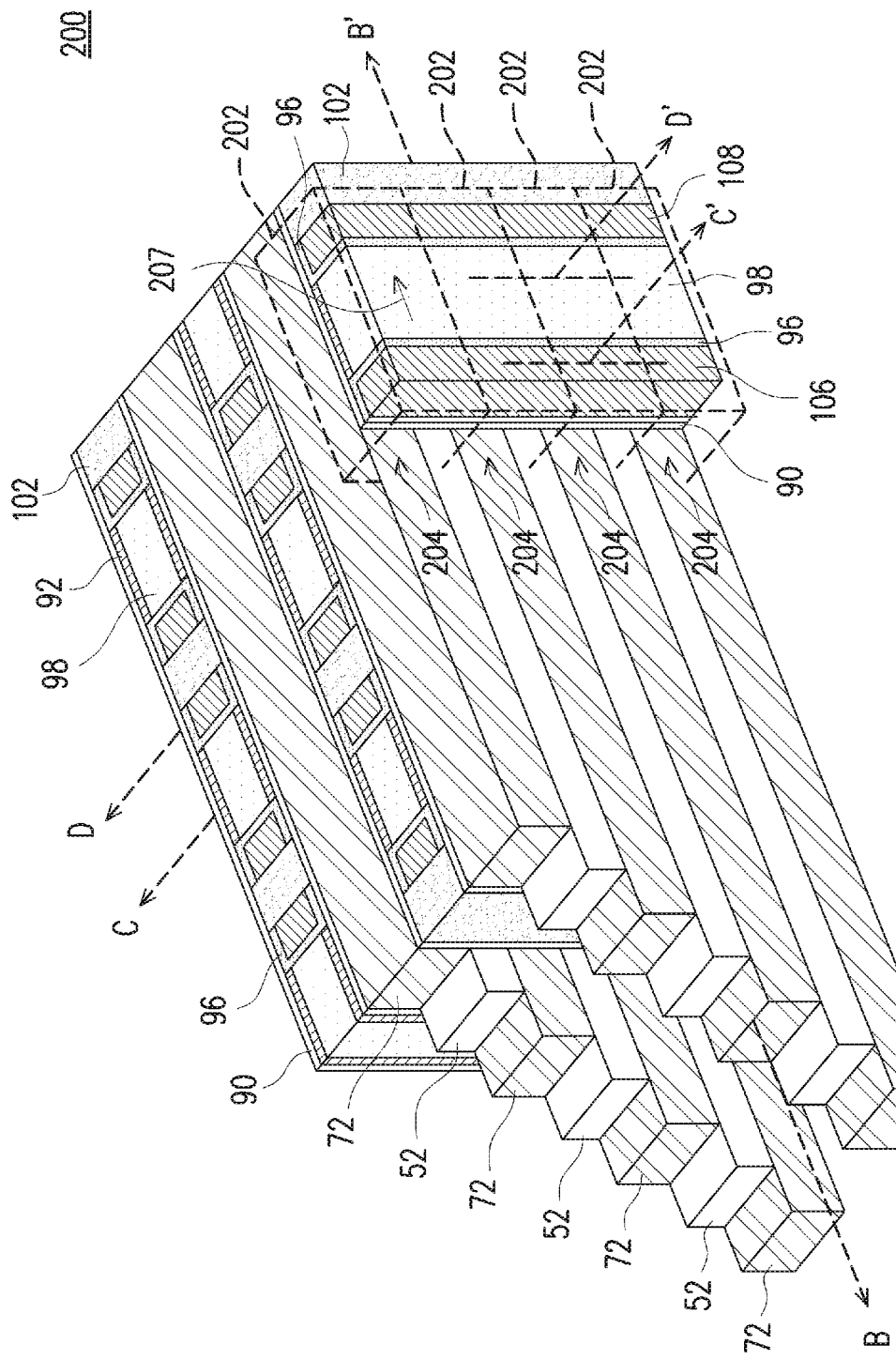
FIGS. 1A, 1B, and 1C illustrate a perspective view, a circuit diagram, and a top down view of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes a transistor having a word line region acting as a gate electrode, a bit line region acting as a first source/drain electrode, and a source line region acting as a second source/drain electrode. Each transistor further includes an insulating memory film (e.g., as a gate dielectric) and an oxide semiconductor (OS) channel region. In some embodiments, trenches are etched in which the source/drain electrodes of each transistor are formed. In some cases, the etching for the trenches may also etch some of the material of the OS channel regions. Etching of the OS channel regions can decrease device performance and reduce device efficiency. For example, this etching of the OS material can reduce the contact area between each source/drain electrode and the OS channel region, which can increase the contact resistance between the source/drain electrodes and the OS channel region. In some embodiments of the present disclosure, a refill layer of OS material is deposited within the trenches before forming the source/drain electrodes. This refill layer compensates for possible etching of the OS channel regions during trench formation, and increases the contact area between the source/drain electrodes and the OS channel regions. In some cases, the refill layer may be a different material than the OS channel region, and the refill layer material may be a material that reduces the contact resistance between the OS channel region and the source/drain electrodes. In this manner, the resistance between the source/drain electrodes and the OS channel regions can be improved, which can improve device performance and efficiency.

Figure 1B:
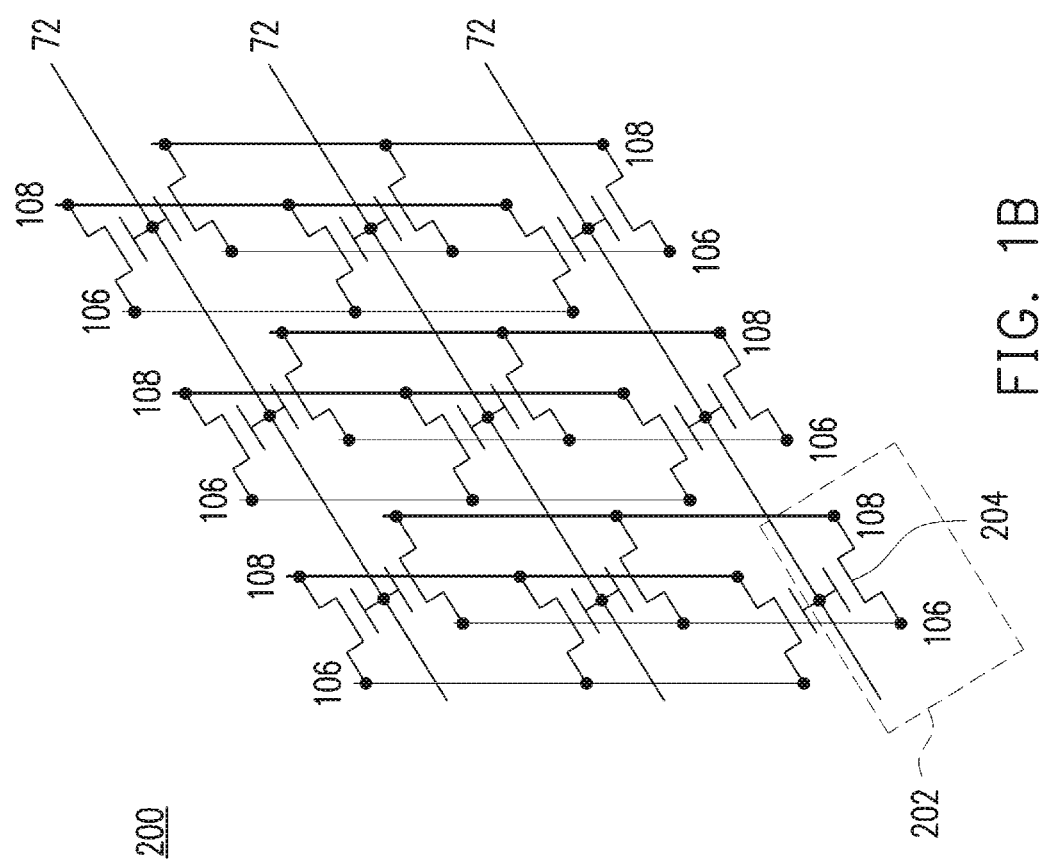
Figure 1C:
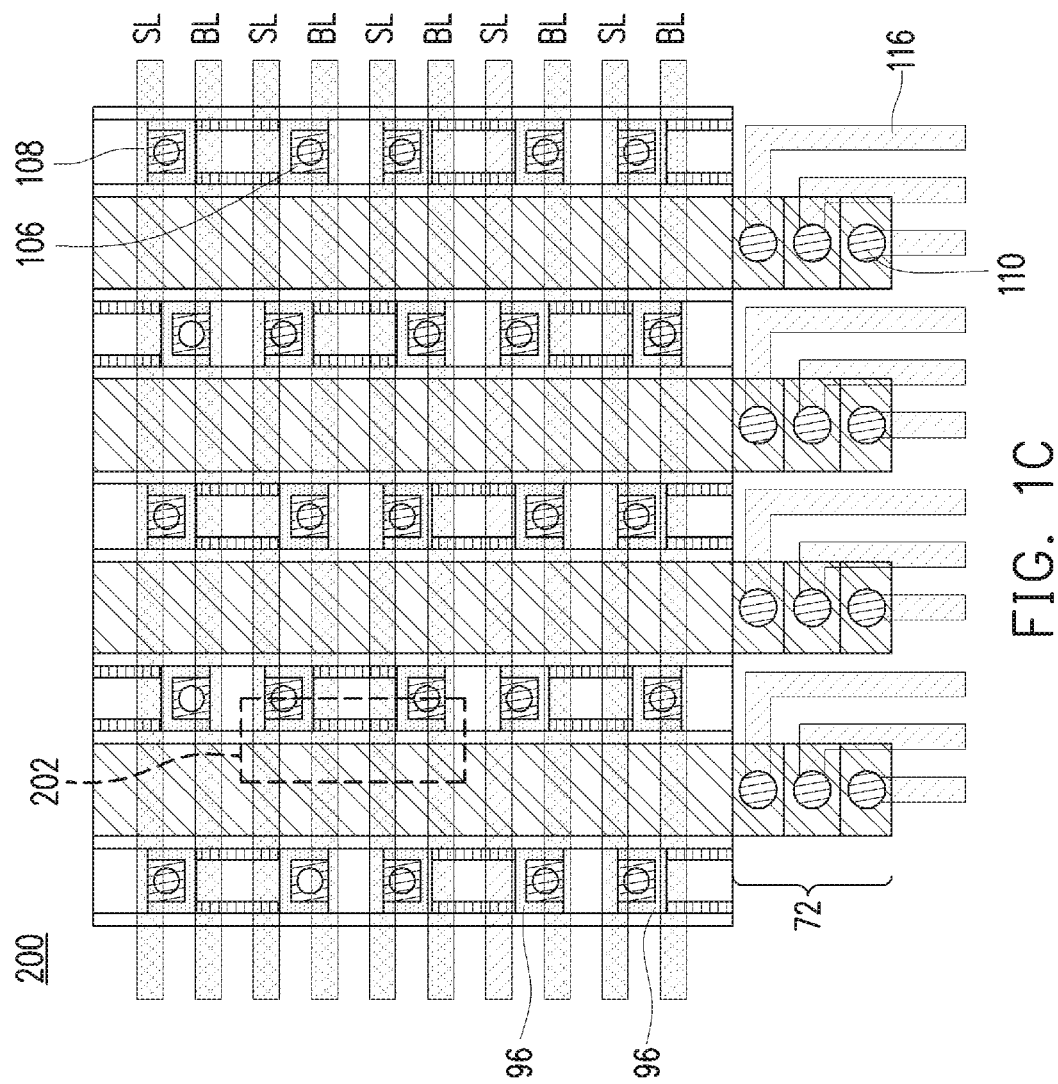

FIGS. 1A, 1B, and 1C illustrate examples of a memory array according to some embodiments. FIG. 1A illustrates an example of a portion of the memory array 200 in a three-dimensional view; FIG. 1B illustrates a circuit diagram of the memory array 200; and FIG. 1C illustrates a top down view (e.g., a plan view) of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as above one or more active devices (e.g., transistors or the like) formed on a semiconductor substrate.

In some embodiments, the memory array 200 is a memory array, such as a NOR memory array, a NAND memory array, or the like. Other types of memory arrays are possible. Each memory cell 202 may include a transistor 204 with an insulating memory film 90 as a gate dielectric. The transistor 204 may be, for example, a thin film transistor (TFT) or another type of transistor. In some embodiments, a gate of each transistor 204 is electrically coupled to a respective word line (e.g., conductive line 72), a first source/drain region of each transistor 204 is electrically coupled to a respective bit line (e.g., conductive line 106), and a second source/drain region of each transistor 204 is electrically coupled to a respective source line (e.g., conductive line 108), which electrically couples the second source/drain region to ground. The memory cells 202 in a same horizontal row of the memory array 200 may share a common word line (e.g., 72), while the memory cells 202 in a same vertical column of the memory array 200 may share a common source line (e.g., 108) and a common bit line (e.g., 106).

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, as shown in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72 (see, for example, FIGS. 28A-D).

The memory array 200 further includes a plurality of conductive lines 106 (e.g., bit lines) and conductive lines 108 (e.g., source lines). The conductive lines 106 and 108 may each extend in a direction perpendicular to the conductive lines 72. A dielectric material 98 is disposed between and isolates adjacent ones of the conductive lines 106 and the conductive lines 108. Pairs of the conductive lines 106 and 108 along with an intersecting conductive line 72 define boundaries of each memory cell 202, and a dielectric material 102 is disposed between and isolates adjacent pairs of the conductive lines 106 and 108. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

As discussed above, the memory array 200 may also include an oxide semiconductor (OS) layer 92. The OS layer 92 may provide channel regions for the transistors 204 of the memory cells 202. For example, when an appropriate voltage (e.g., higher than a respective threshold voltage ($V_{th}$) of a corresponding transistor 204) is applied through a corresponding conductive line 72, a region of the OS layer 92 that intersects the conductive line 72 may allow current to flow from the conductive lines 106 to the conductive lines 108 (e.g., in the direction indicated by arrow 207). Accordingly, the OS layer 92 may be considered a channel layer in some cases.

In some embodiments, a refill layer 96 at least partially surrounds the conductive lines 106 and the conductive lines 108. The refill layer 96 may comprise the same material as the material of the OS layer 92, or may comprise one or more materials different from the material of the OS layer 92. The refill layer 96 may extend between the conductive lines 106/108 and surfaces of the OS layer 92. In this manner, the refill layer 96 may provide contacts between the conductive lines 106/108 and the channel regions for the transistors 204. Accordingly, in some cases the refill layer 96 may be considered a "contact layer" or a "contact interface layer." In some cases, a combination of the OS layer 92 and the refill layer 96 may provide the channel regions for the transistors 204. The refill layer 96 is described in greater detail below for FIGS. 23A-C.

A memory film 90 is disposed between the conductive lines 72 and the OS layer 92, and the memory film 90 may provide gate dielectrics for the transistors 204. In some embodiments, the memory film 90 comprises a ferroelectric material, such as a hafnium oxide, hafnium zirconium oxide, silicon-doped hafnium oxide, or the like. Accordingly, the memory array 200 may also be referred to as a Ferroelectric Random Access Memory (FeRAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the memory cells 202), and a continuous region of the memory film 90 may extend across a plurality of memory cells 202. Depending on a polarization direction of a particular region of the memory film 90, a threshold voltage of a corresponding transistor 204 varies, and a digital value (e.g., 0 or 1) can be stored. For example, when a region of the memory film 90 has a first electrical polarization direction, the corresponding transistor 204 may have a relatively low threshold voltage, and when the region of the memory film 90 has a second electrical polarization direction, the corresponding transistor 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory film 90 corresponding to the memory cell 202. The write voltage can be applied, for example, by applying appropriate voltages to a corresponding conductive line 72 (e.g., the word line) and the corresponding conductive lines 106/108 (e.g., the bit line/source line). By applying the write voltage across the portion of the memory film 90, a polarization direction of the region of the memory film 90 can be changed. As a result, the corresponding threshold voltage of the corresponding transistor 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the word line). Depending on the polarization direction of the corresponding region of the memory film 90, the transistor 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Reference Cross-section B-B' is along a longitudinal axis of conductive lines 72 and in a direction, for example, parallel to the direction of current flow of the transistors 204. Reference cross-section C-C' is perpendicular to cross-section B-B' and is parallel to a longitudinal axis of the conductive lines 72. Reference cross-section C-C' extends through the conductive lines 106 and/or the conductive lines 108. Reference cross-section D-D' is parallel to reference cross-section C-C' and extends through the dielectric material 102. Subsequent figures refer to these reference cross-sections for clarity.

Figure 2:
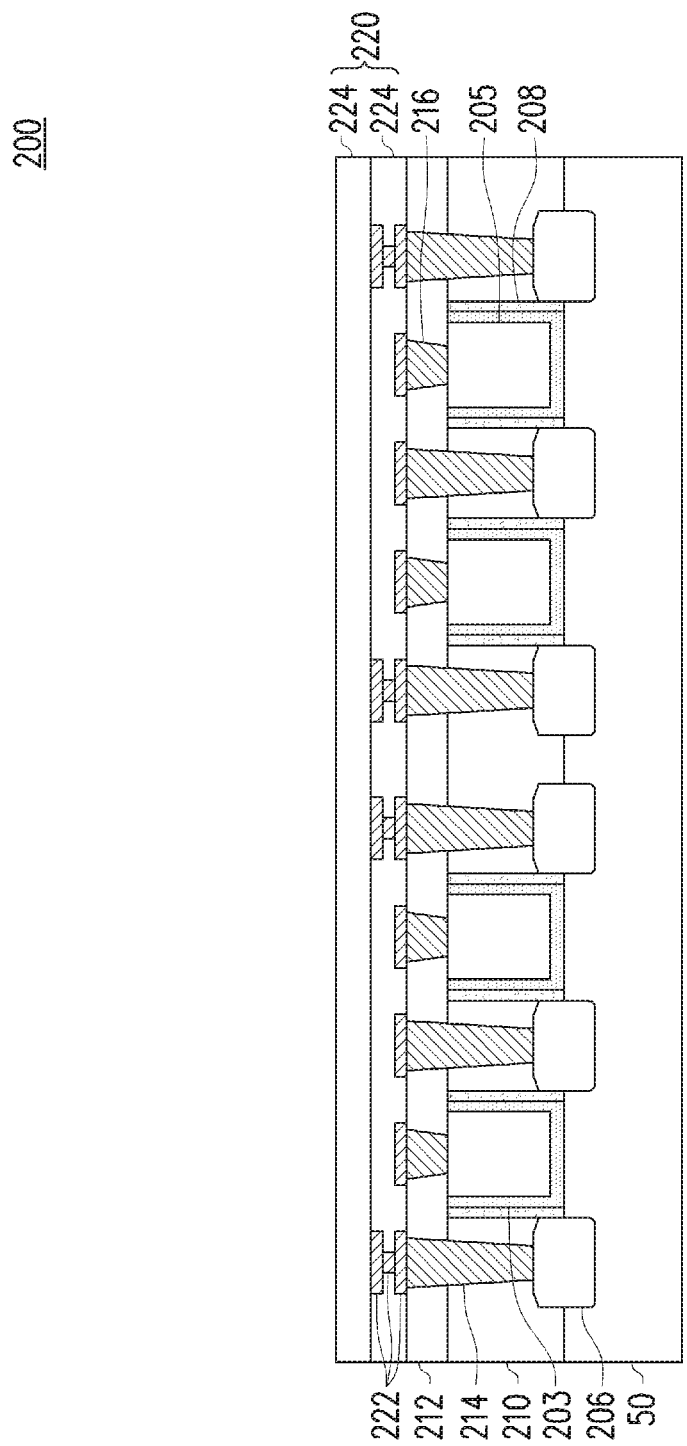

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 203 over top surfaces of the substrate 50 and gate electrodes 205 over the gate dielectric layers 203. Source/drain regions 206 are disposed in the substrate 50 on opposite sides of the gate dielectric layers 203 and the gate electrodes 205. Gate spacers 208 are formed along sidewalls of the gate dielectric layers 203 and separate the source/drain regions 206 from the gate electrodes 205 by appropriate lateral distances. In some embodiments, the transistors may be planar field effect transistors (FETs), fin field effect transistors (FinFETs), nano-field effect transistors (nanoFETs), or the like.

A first ILD 210 surrounds and isolates the source/drain regions 206, the gate dielectric layers 203, and the gate electrodes 205 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 205. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 220 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
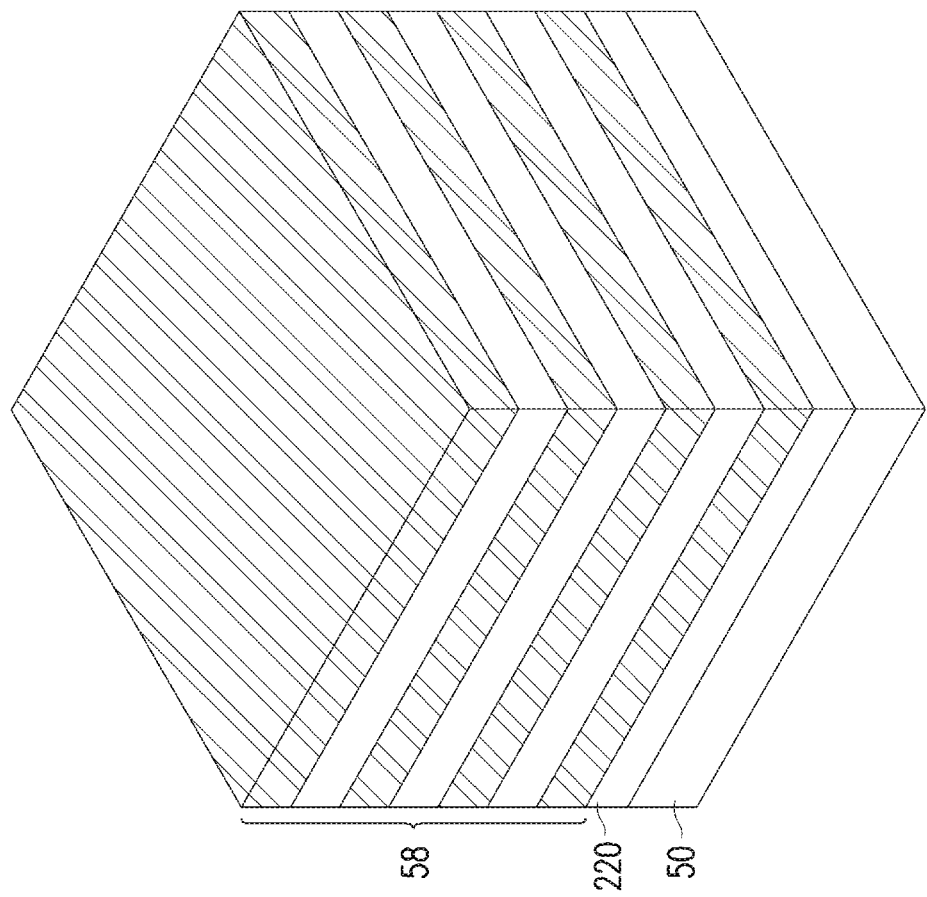
Figure 3B:
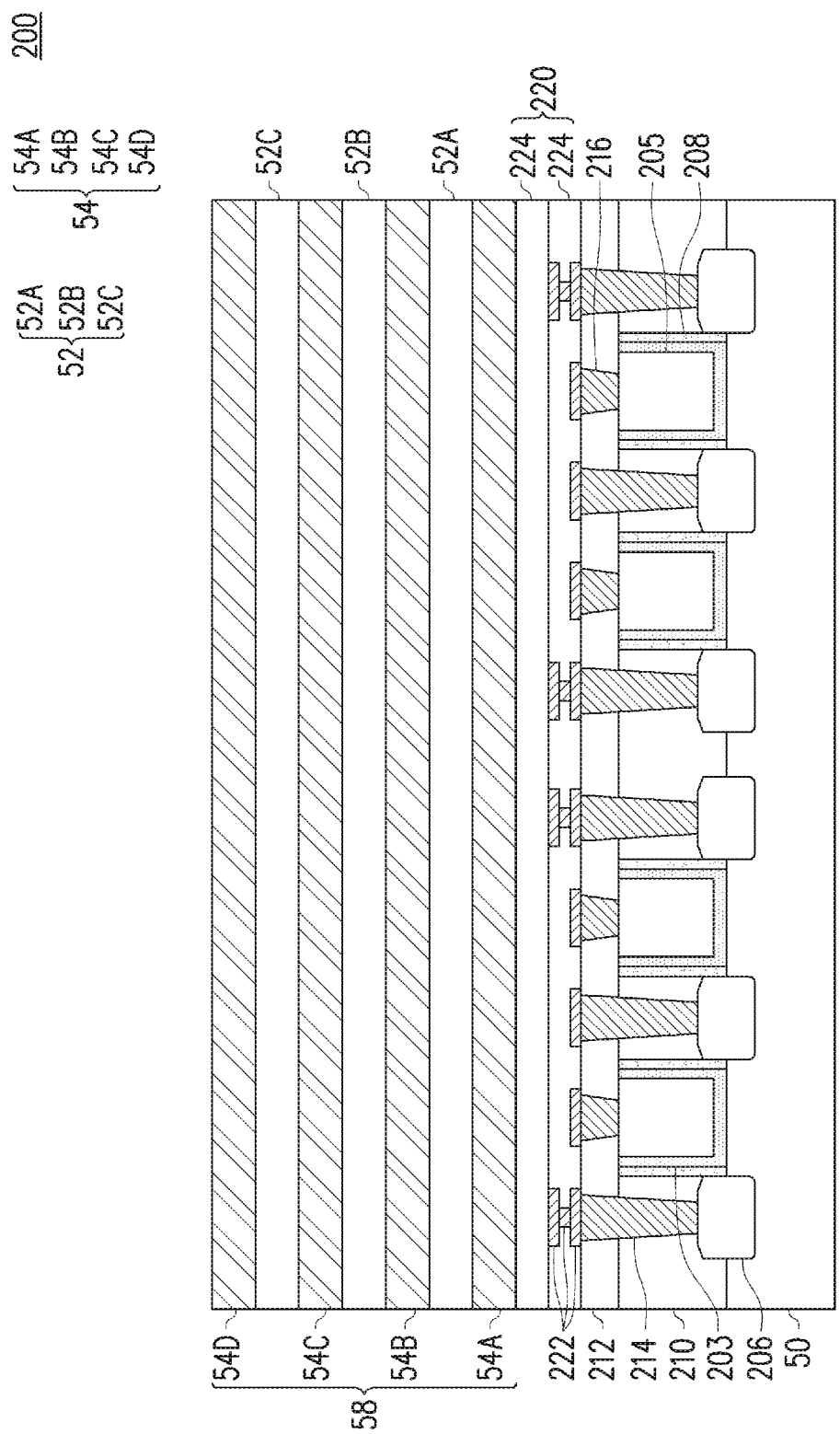

In FIGS. 3A and 3B, a multi-layer stack 58 is formed over the structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive lines 54A-D (collectively referred to as conductive layers 54) and dielectric layers 52A C (collectively referred to as dielectric layers 52). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52.

FIGS. 4 through 12B are views of intermediate stages in the manufacturing a staircase structure of the memory array 200, in accordance with some embodiments. FIGS. 4 through 11 and 12B are illustrated along reference cross-section B-B' illustrated in FIG. 1A. FIG. 12A is illustrated in a three-dimensional view.

Figure 4:
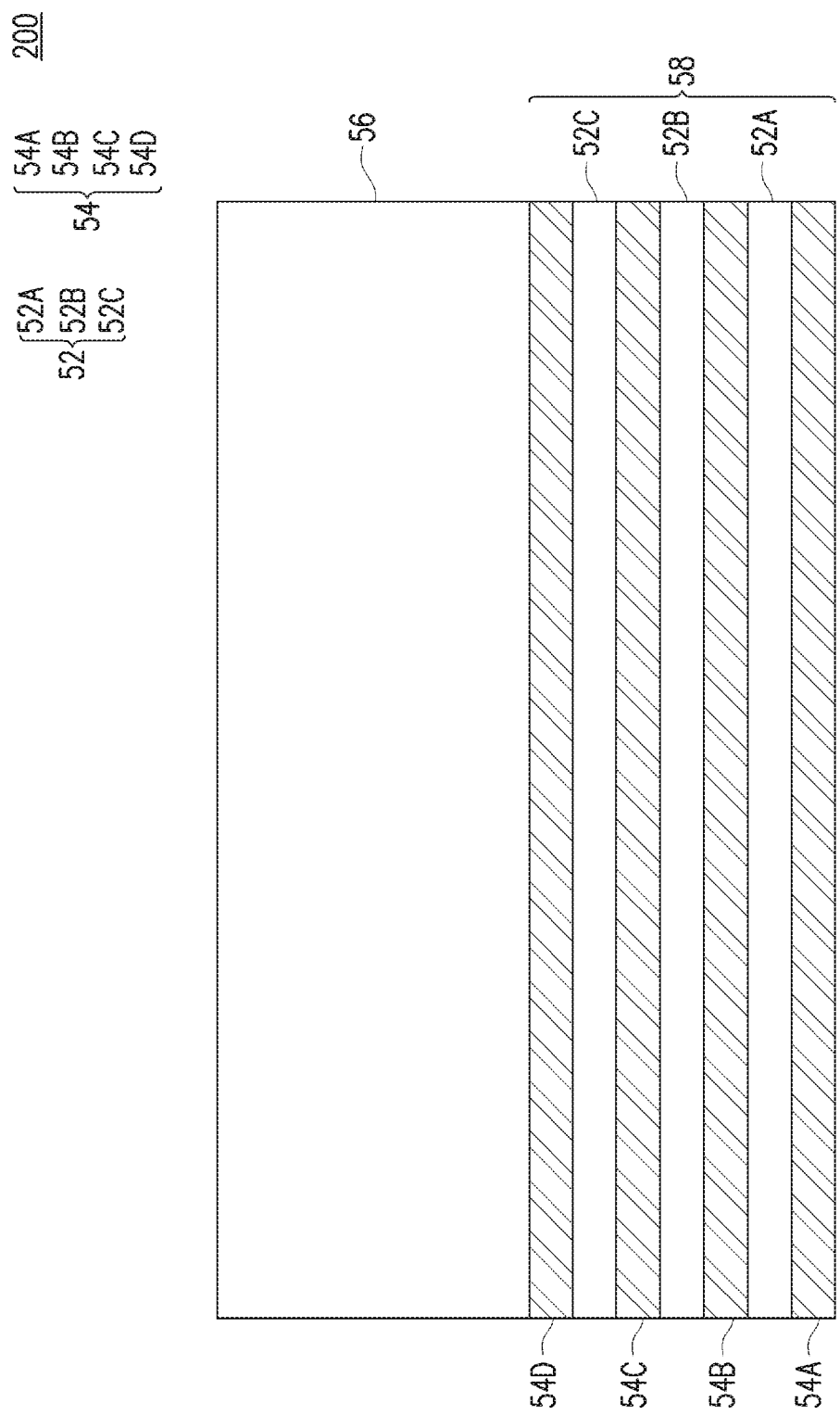

In FIG. 4 a photoresist 56 is formed over the multi-layer stack 58. As discussed above, the multi-layer stack 58 may comprise alternating layers of the conductive layers 54 (labeled 54A, 54B, 54C, and 54D) and the dielectric layers 52 (labeled 52A, 52B, and 52C). The photoresist 56 can be formed by using a spin-on technique.

Figure 5:
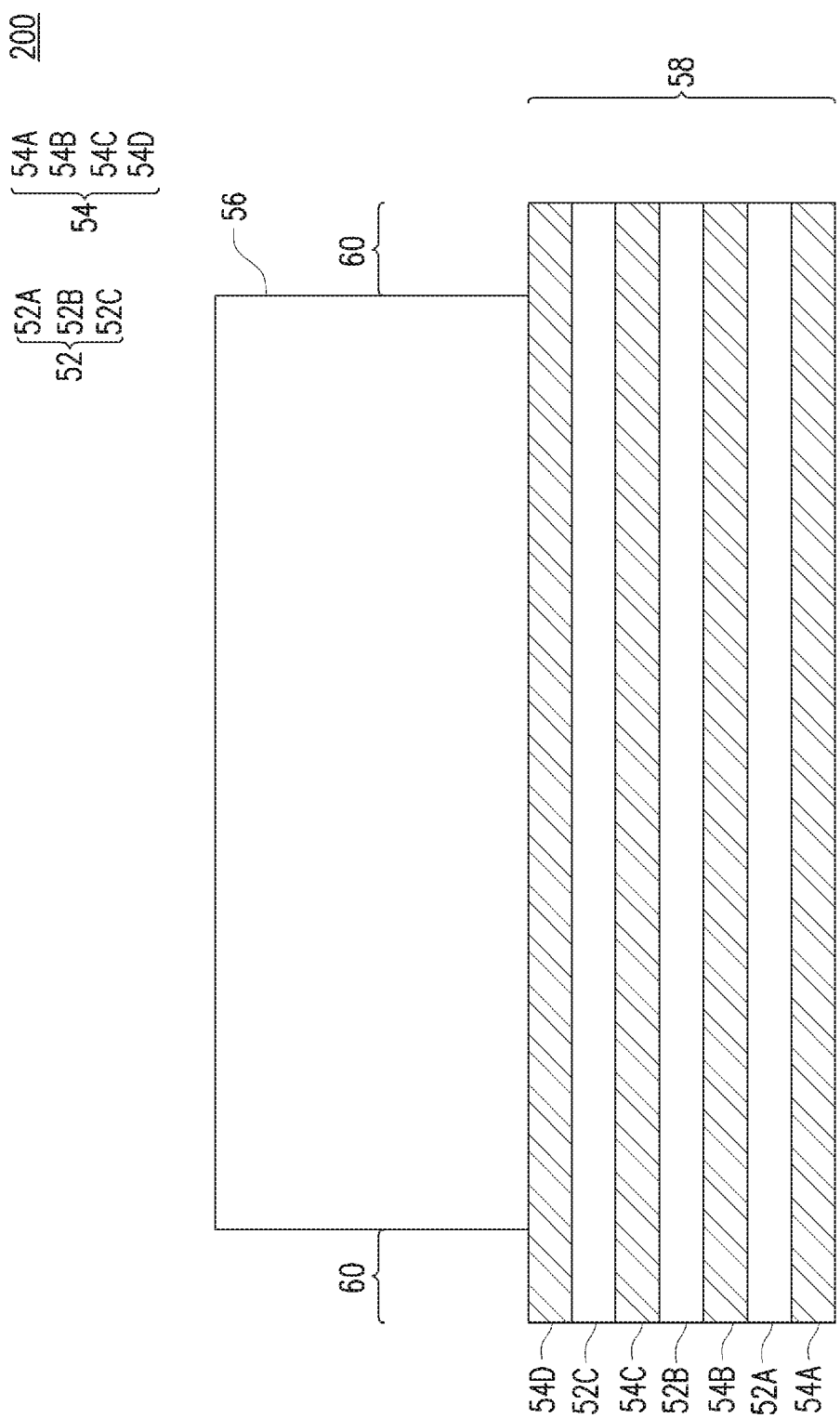

In FIG. 5, the photoresist 56 is patterned to expose the multi-layer stack 58 in regions 60 while masking remaining portions of the multi-layer stack 58. For example, a topmost layer of the multi-layer stack 58 (e.g., conductive layer 54D)

may be exposed in the regions 60. The photoresist 56 may be patterned using acceptable photolithography techniques.

Figure 6:
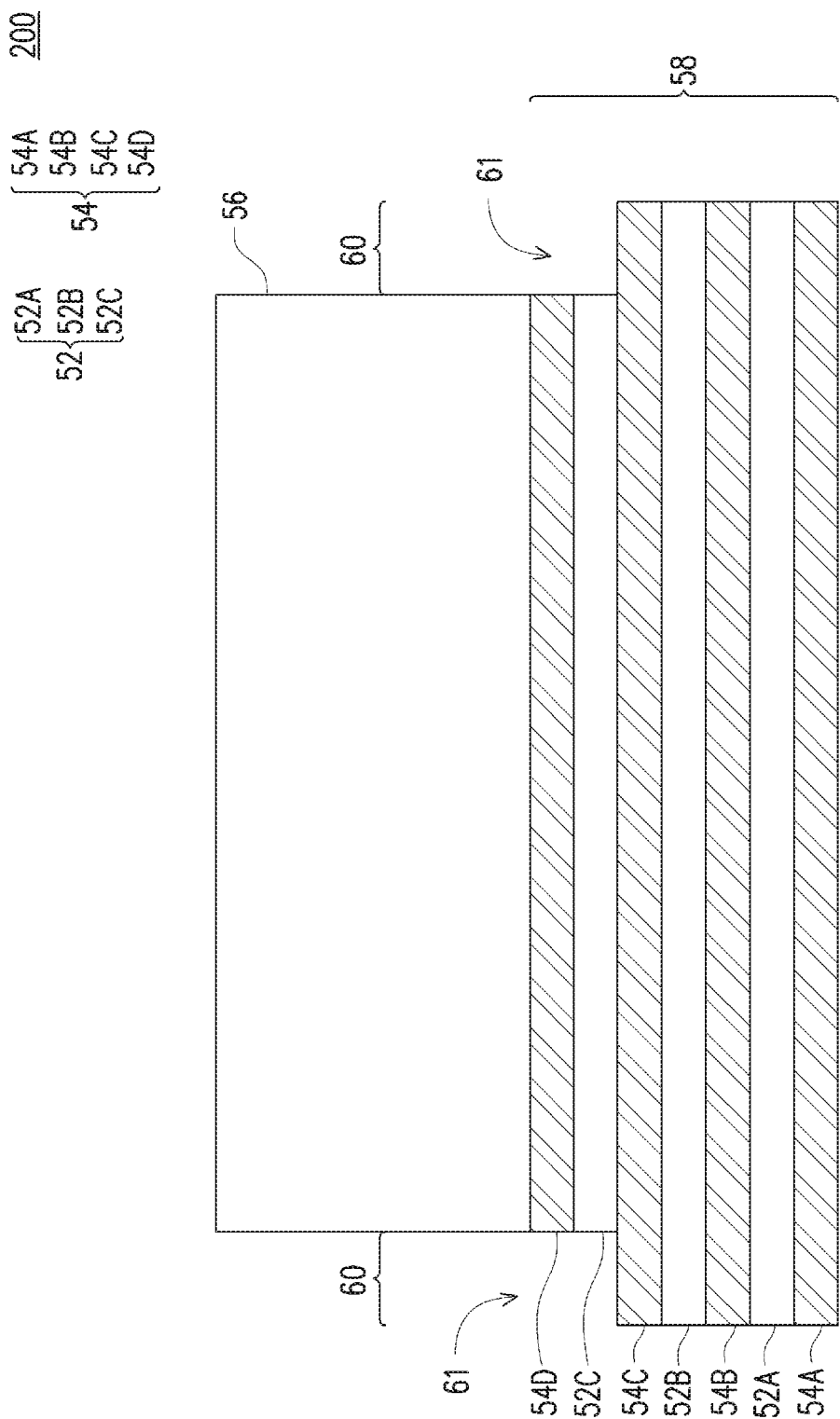

In FIG. 6, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive layer 54D and dielectric layer 52C in the regions 60 and define openings 61. Because the conductive layer 54D and the dielectric layer 52C have different material compositions, etchants used to remove exposed portions of these layers may be different. In some embodiments, the dielectric layer 52C acts as an etch stop layer while etching the conductive layer 54D, and the conductive layer 54C acts as an etch stop layer while etching dielectric layer 52C. As a result, the portions of the conductive layer 54D and the dielectric layer 52C may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive layer 54C is exposed in the regions 60.

Figure 7:
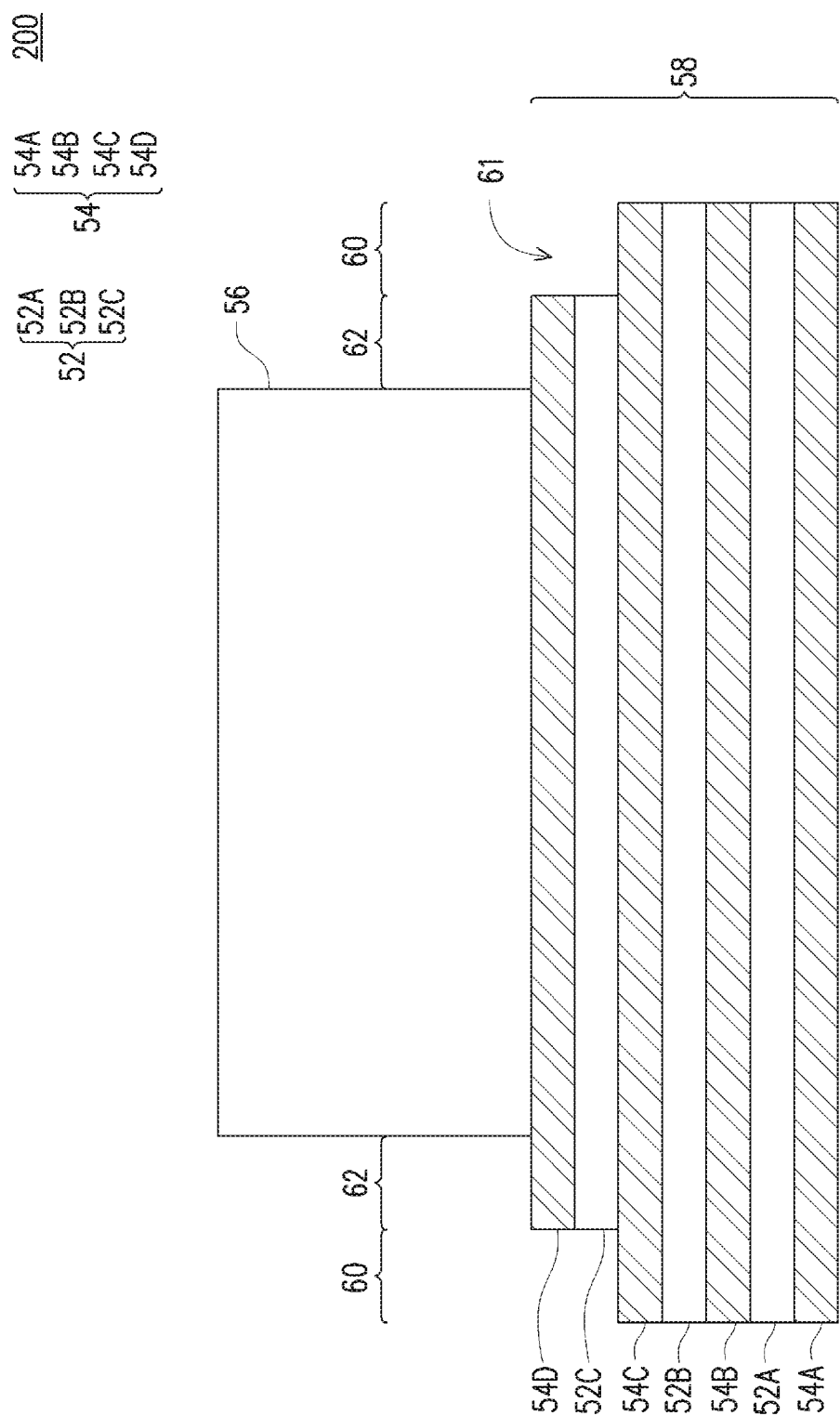

In FIG. 7, the photoresist 56 is trimmed to expose additional portions of the multi-layer stack 58. The photoresist can be trimmed using acceptable photolithography techniques. As a result of the trimming, a width of the photoresist 56 is reduced, and portions of the multi-layer stack 58 in regions 60 and 62 may be exposed. For example, a top surface of the conductive layer 54C may be exposed in the regions 60, and a top surface of the conductive layer 54D may be exposed in the regions 62.

Figure 8:
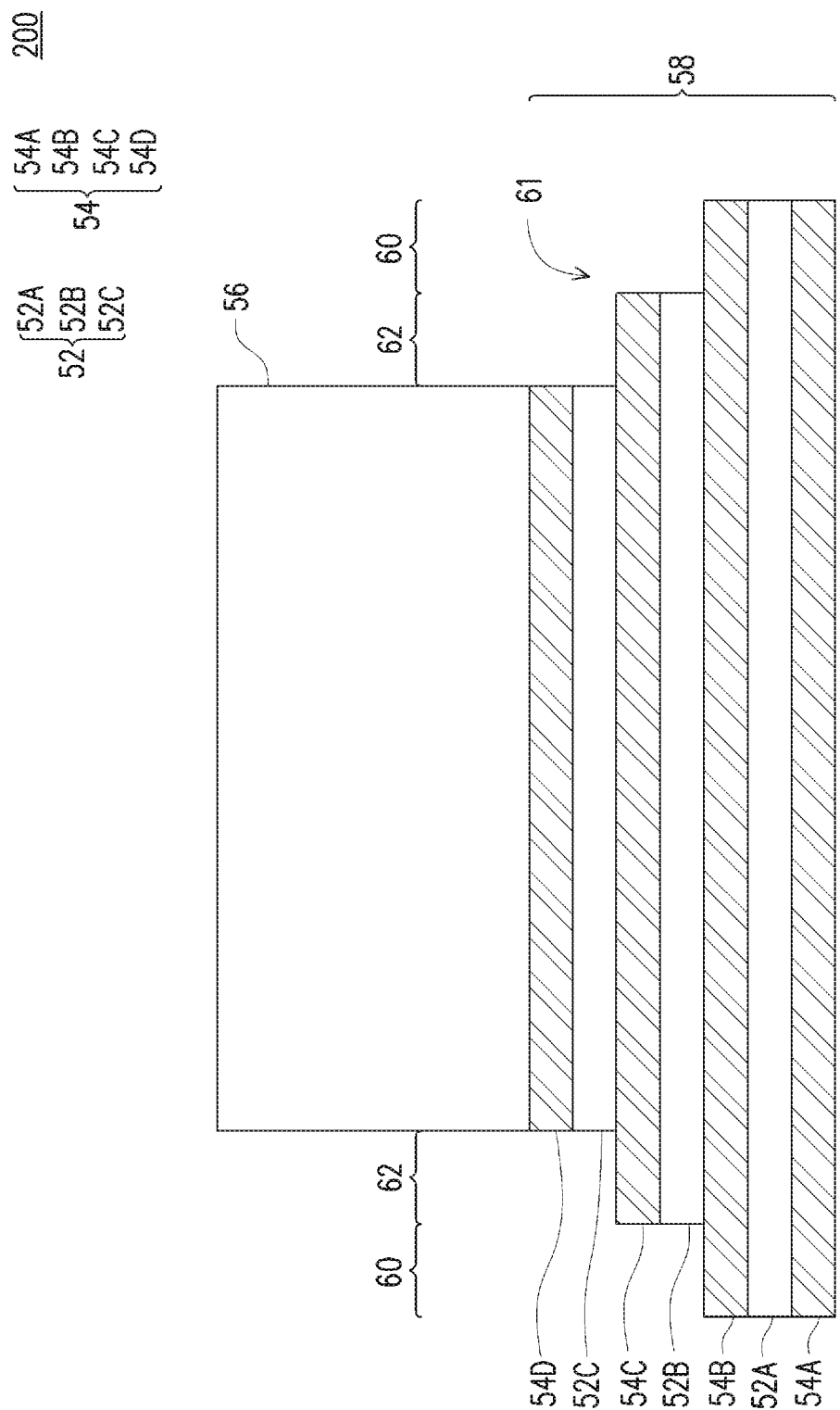

In FIG. 8, portions of the conductive layer 54D, the dielectric layer 52C, the conductive layer 54C, and the dielectric layer 52B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54D/54C and the dielectric layers 52C/52B have different material compositions, etchants used to remove exposed portions of these layers may be different. In some embodiments, the dielectric layer 52C acts as an etch stop layer while etching the conductive layer 54D; the conductive layer 54C acts as an etch stop layer while etching dielectric layer 52C; the dielectric layer 52B acts as an etch stop layer while etching the conductive layer 54C; and the conductive layer 54B acts as an etch stop layer while etching the dielectric layer 52B. As a result, portions of the conductive layers 54D/54C and the dielectric layer 52C/52B may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the conductive layer 54D and dielectric layer 52C (see FIG. 7) may be transferred to the underlying conductive layer 54C and dielectric layer 52B. In the resulting structure, the conductive layer 54B is exposed in the regions 60, and the conductive layer 54C is exposed in the regions 62.

Figure 9:
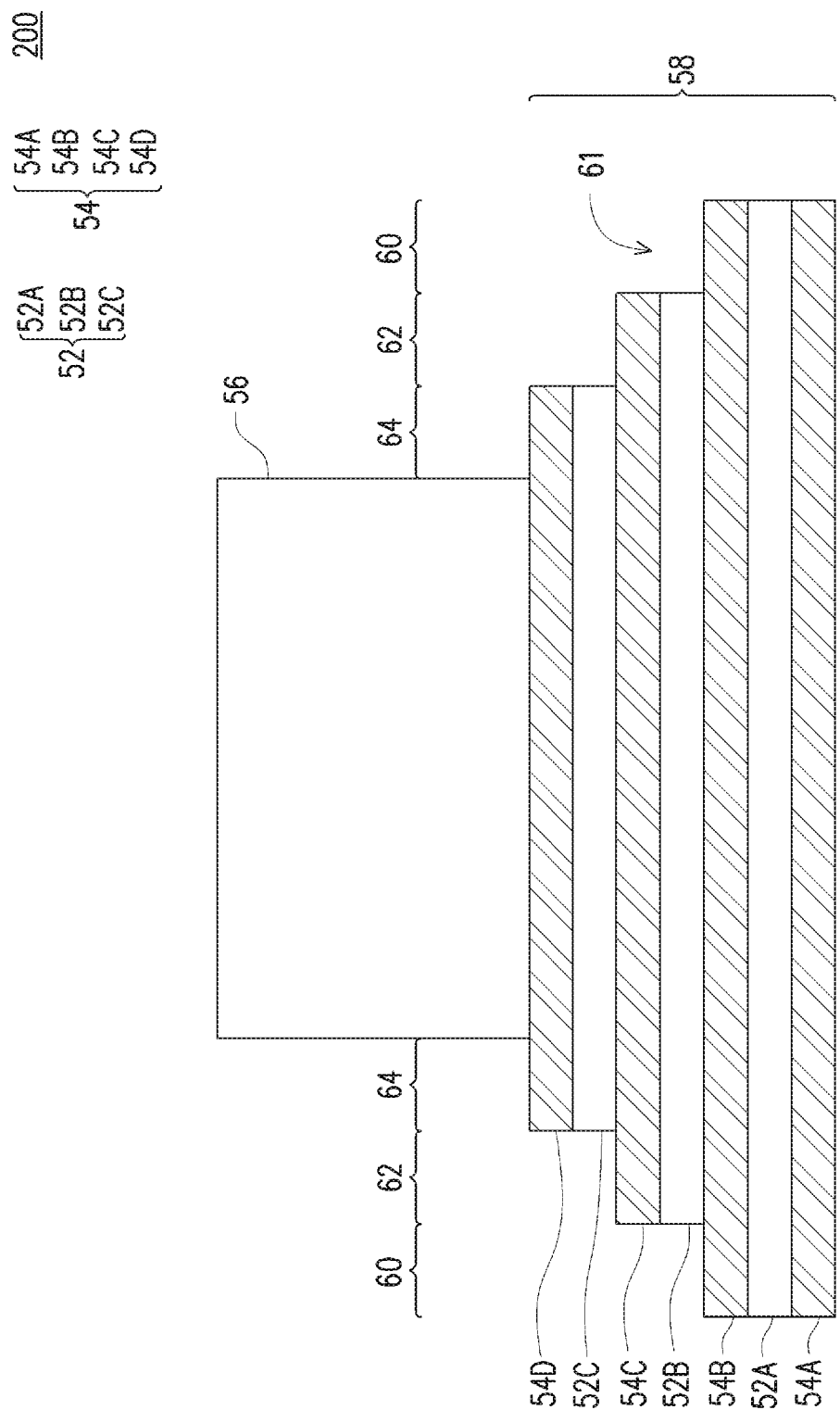

In FIG. 9, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60, 62, and 64 may be exposed. For example, a top surface of the conductive layer 54B may be exposed in the regions 60; a top surface of the conductive layer 54C may be exposed in the regions 62; and a top surface of the conductive layer 54D may be exposed in the regions 64.

Figure 10:
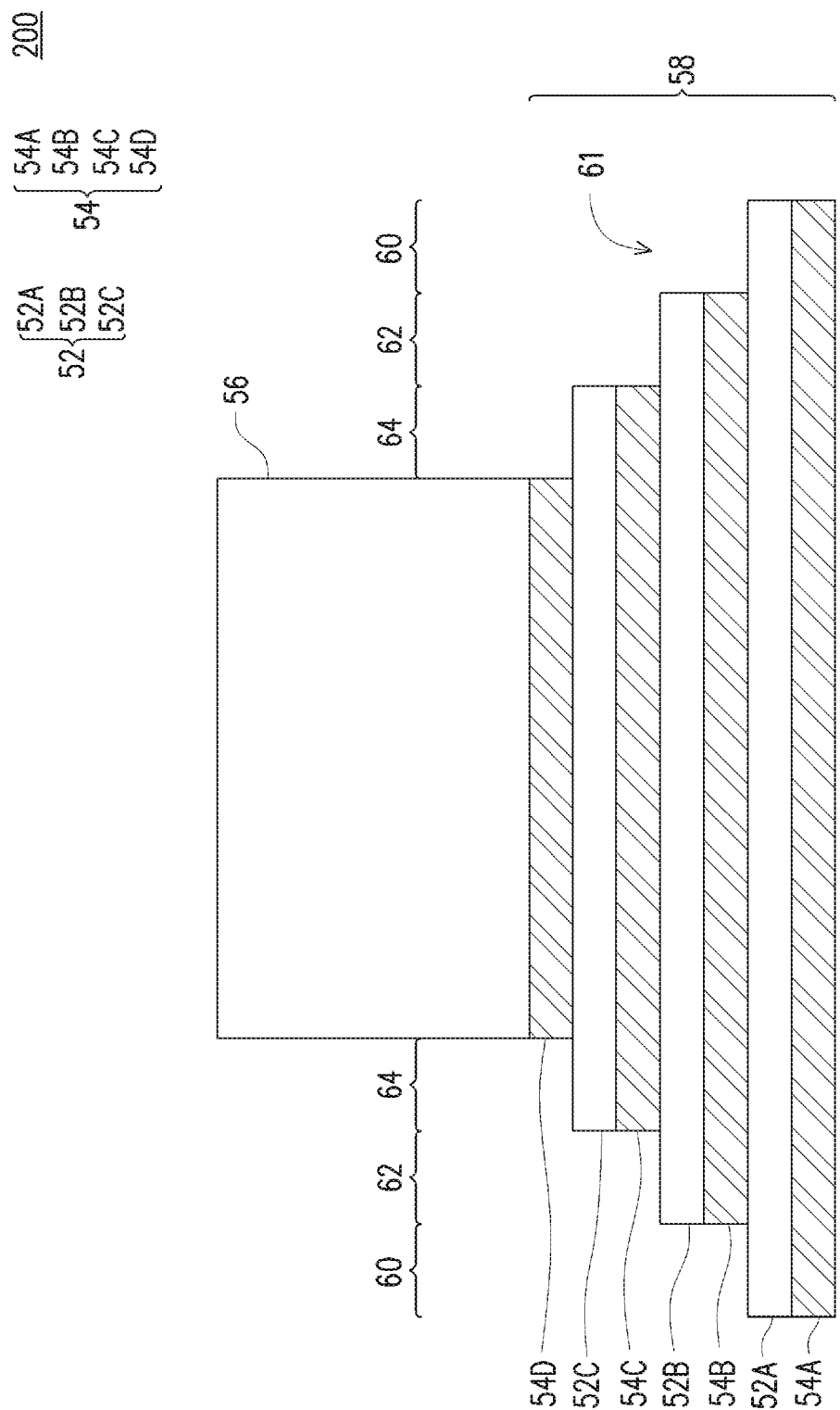

In FIG. 10, portions of the conductive layers 54D, 54C, and 54B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the dielectric layer 52C acts as an etch stop layer while etching the conductive layer 54D; the dielectric layer 52B acts as an etch stop layer while etching the conductive layer 54C; and the dielectric layer 52A acts as an etch stop layer while etching the conductive layer 54B. As a result, portions of the conductive layers 54D, 54C, and 54B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the dielectric layers 52C/52B (see FIG. 9) may be transferred to the underlying conductive layers 54C/54B. In the resulting structure, the dielectric layer 52A is exposed in the regions 60; the dielectric layer 52B is exposed in the regions 62; and the dielectric layer 52C is exposed in the regions 64.

Figure 11:
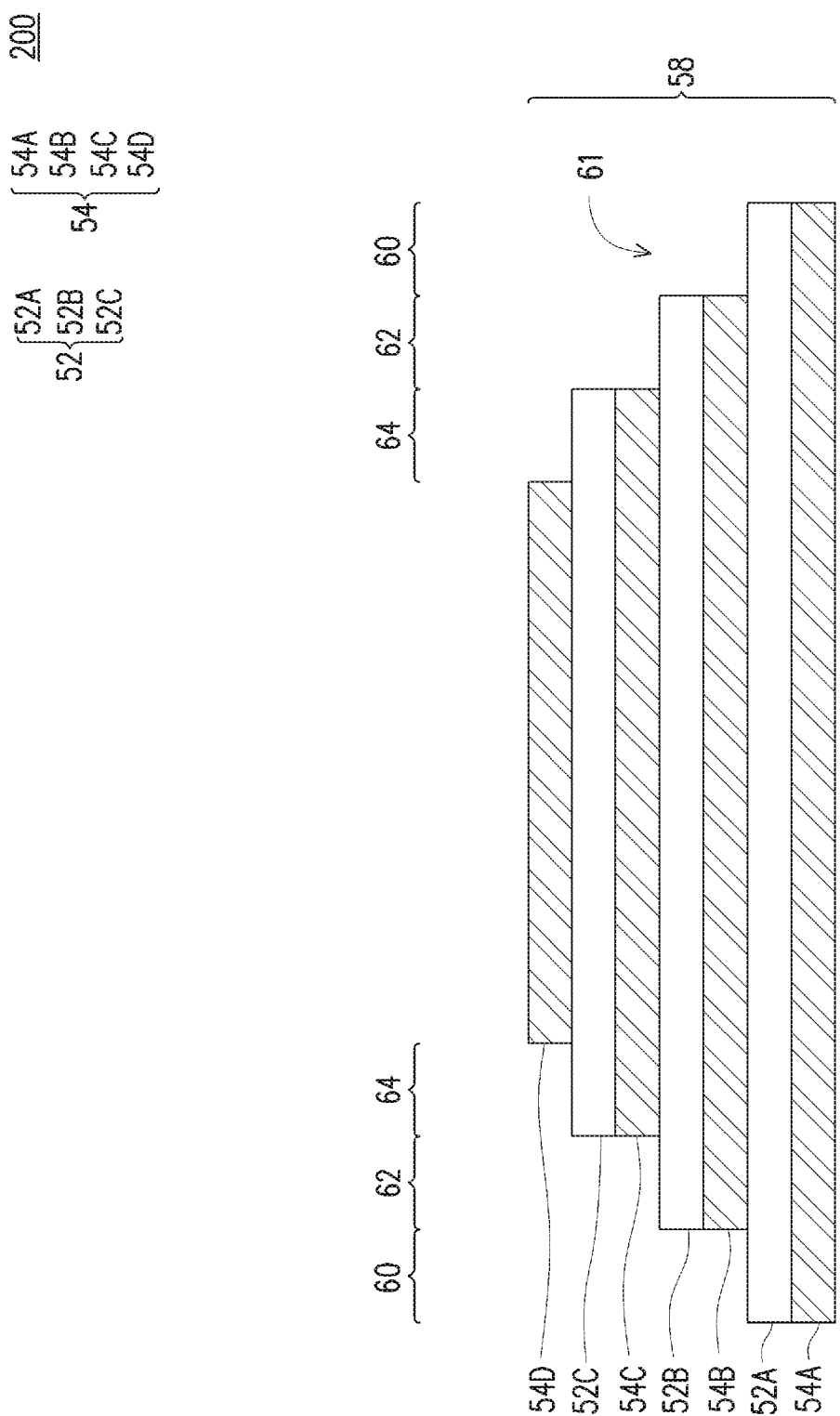

In FIG. 11, the photoresist 56 may be removed, such as by an acceptable ashing or wet strip process. Thus, a staircase structure 68 is formed. The staircase structure comprises a stack of alternating ones of the conductive layers 54 and the dielectric layers 52. Lower conductive layers 54 are wider and extend laterally past upper conductive layers 54, and a width of each of the conductive layers 54 increases in a direction towards the substrate 50. For example, the conductive layer 54A may longer than the conductive layer 54B; the conductive layer 54B may be longer than the conductive layer 54C; and the conductive layer 54C may be longer than the conductive layer 54D. As a result, conductive contacts can be made from above the staircase structure 68 to each of the conductive layers 54 in subsequent processing steps.

Figure 12A:
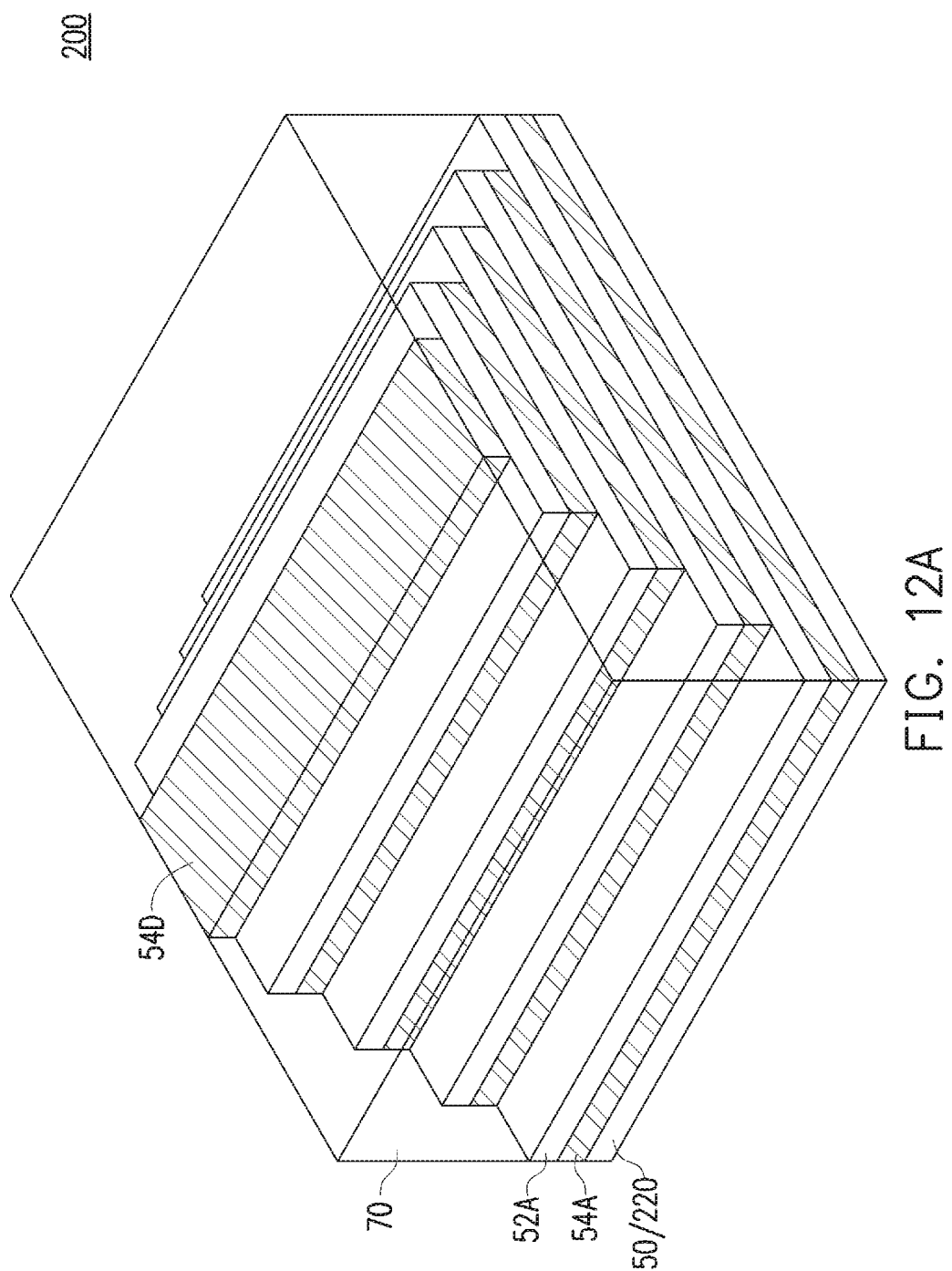

In FIGS. 12A and 12B, an inter-metal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive layers 54 as well as sidewalls of the dielectric layers 52. Further, the IMD 70 may contact top surfaces of each of the dielectric layers 52.

As further illustrated in FIGS. 12A and 12B, a removal process is then applied to the IMD 70 to remove excess dielectric material over the multi-layer stack 58. In some embodiments, a planarization process such as a chemical mechanical polish (CMP), an etch-back process, combinations thereof, or the like may be utilized. The planarization process exposes the multi-layer stack 58 such that top surfaces of the multi-layer stack 58 and IMD 70 are level after the planarization process is complete.

FIGS. 13 through 17B are views of intermediate stages in the manufacturing of the memory array 200, in accordance with some embodiments. In FIGS. 13 through 17B the multi-layer stack 58 is formed and trenches are formed in the multi-layer stack 58, thereby defining the conductive lines 72. The conductive lines 72 may correspond to word lines in the memory array 200, and the conductive lines 72 may further provide gate electrodes for the resulting transistors of the memory array 200. FIG. 17A is illustrated in a three-dimensional view. FIGS. 13 through 16 and 17B are illustrated along reference cross-section C-C' illustrated in FIG. 1A.

Figure 13:
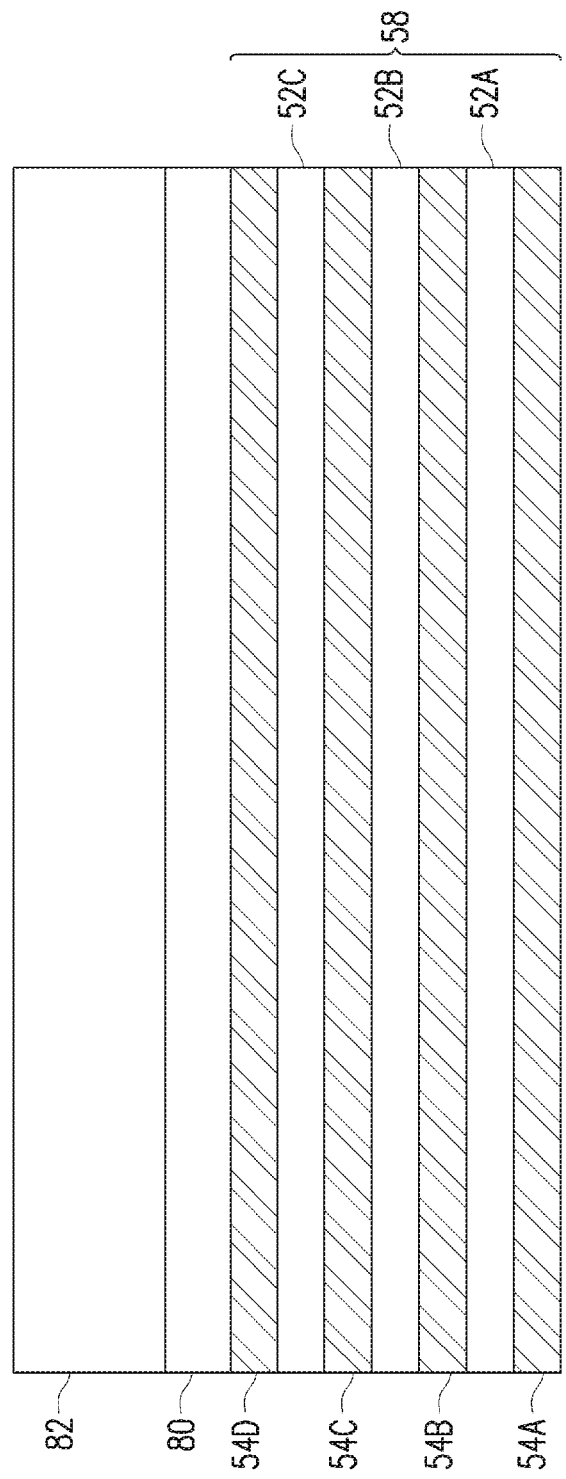

In FIG. 13, a hard mask 80 and a photoresist 82 are deposited over the multi-layer stack 58. The hard mask 80 may include, for example, silicon nitride, silicon oxynitride, or the like, which may be deposited by CVD, PVD, ALD, PECVD, or the like. The photoresist 82 can be formed by using a spin-on technique, for example.

Figure 14A:
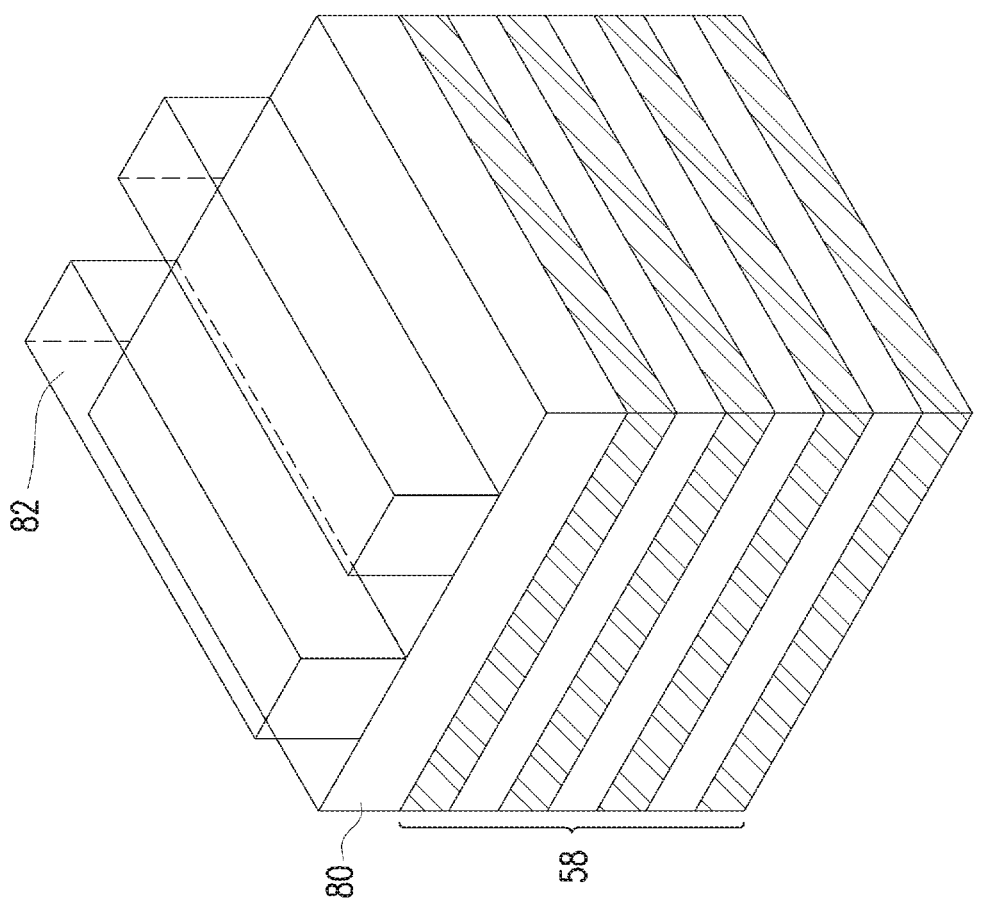
Figure 14B:
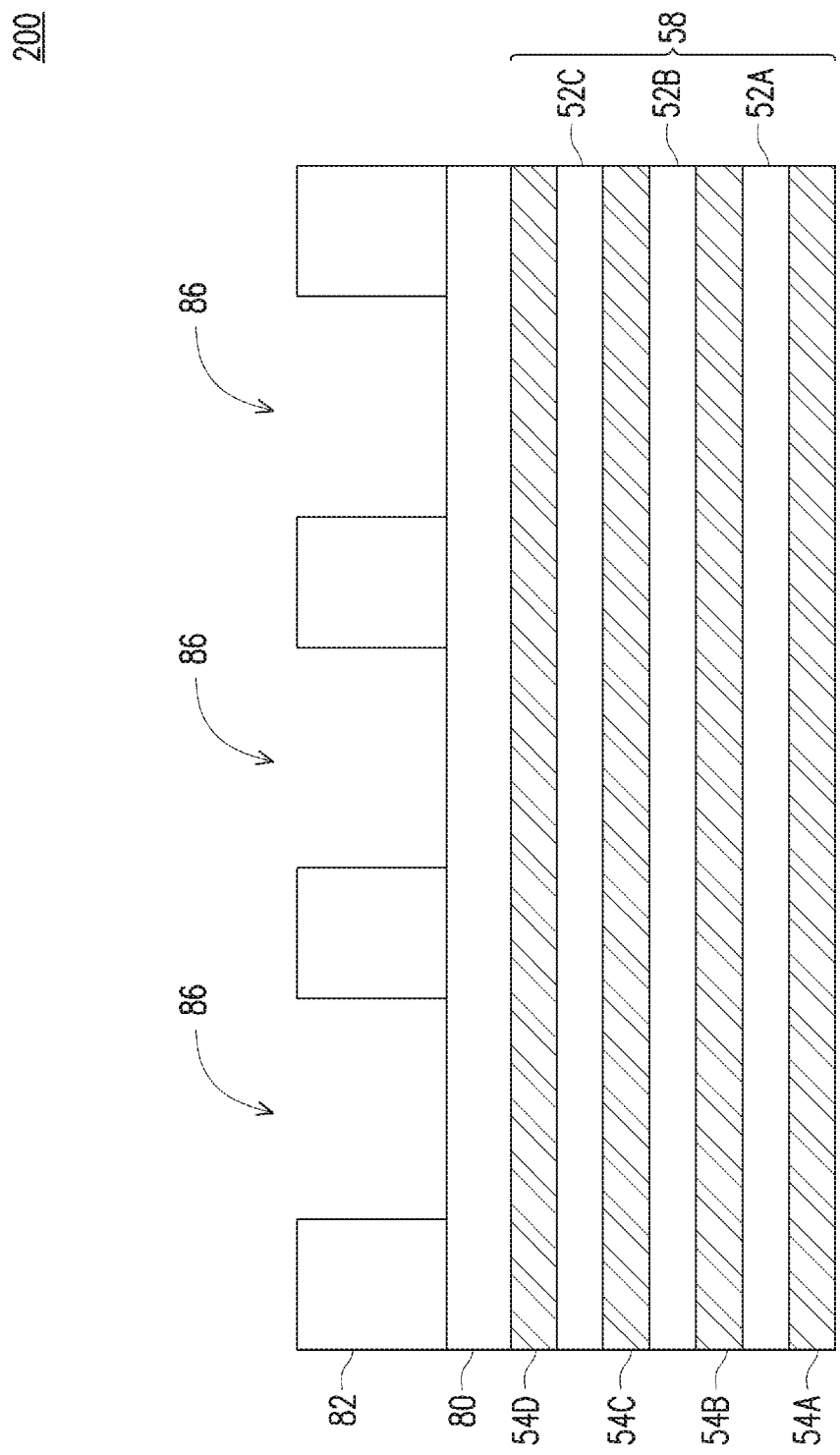

In FIGS. 14A and 14B, the photoresist 82 is patterned to form trenches 86. The photoresists can be patterned using acceptable photolithography techniques. For example, the photoresist 82 be exposed to light for patterning. After the exposure process, the photoresist 82 may be developed to remove exposed or unexposed portions of the photoresist depending on whether a negative or positive resist is used, thereby defining the pattern of the trenches 86.

Figure 15:
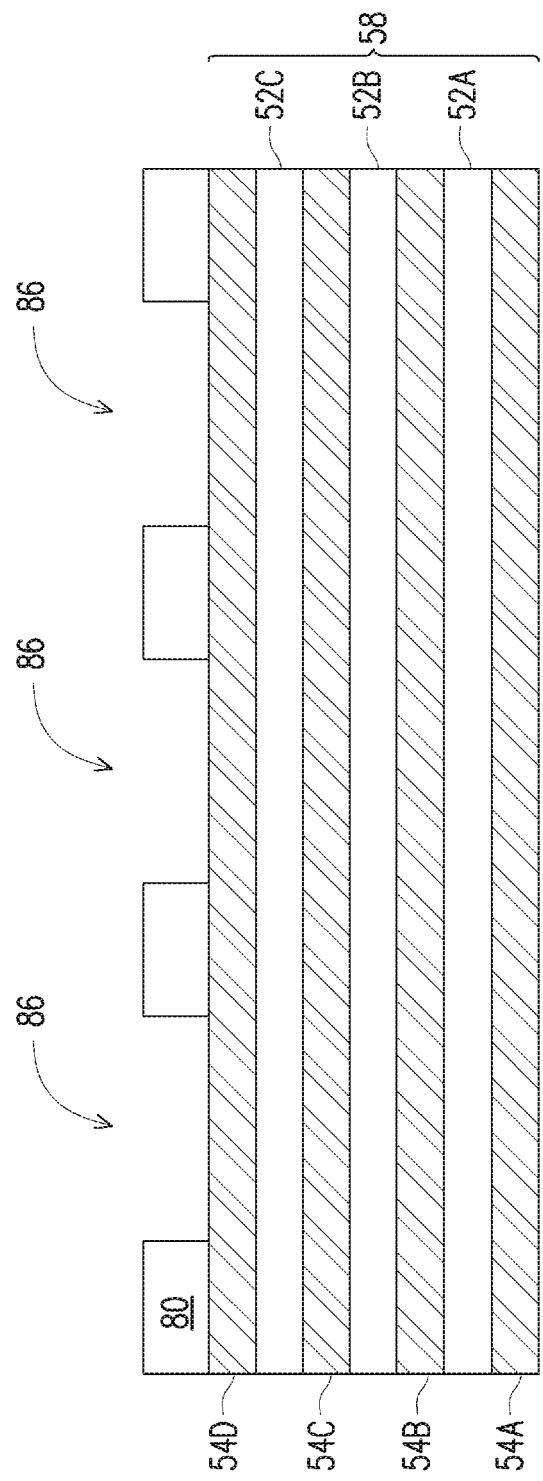

In FIG. 15, a pattern of the photoresist 82 is transferred to the hard mask 80 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 80. The photoresist 82 may be removed by an ashing process, for example.

Figure 16:
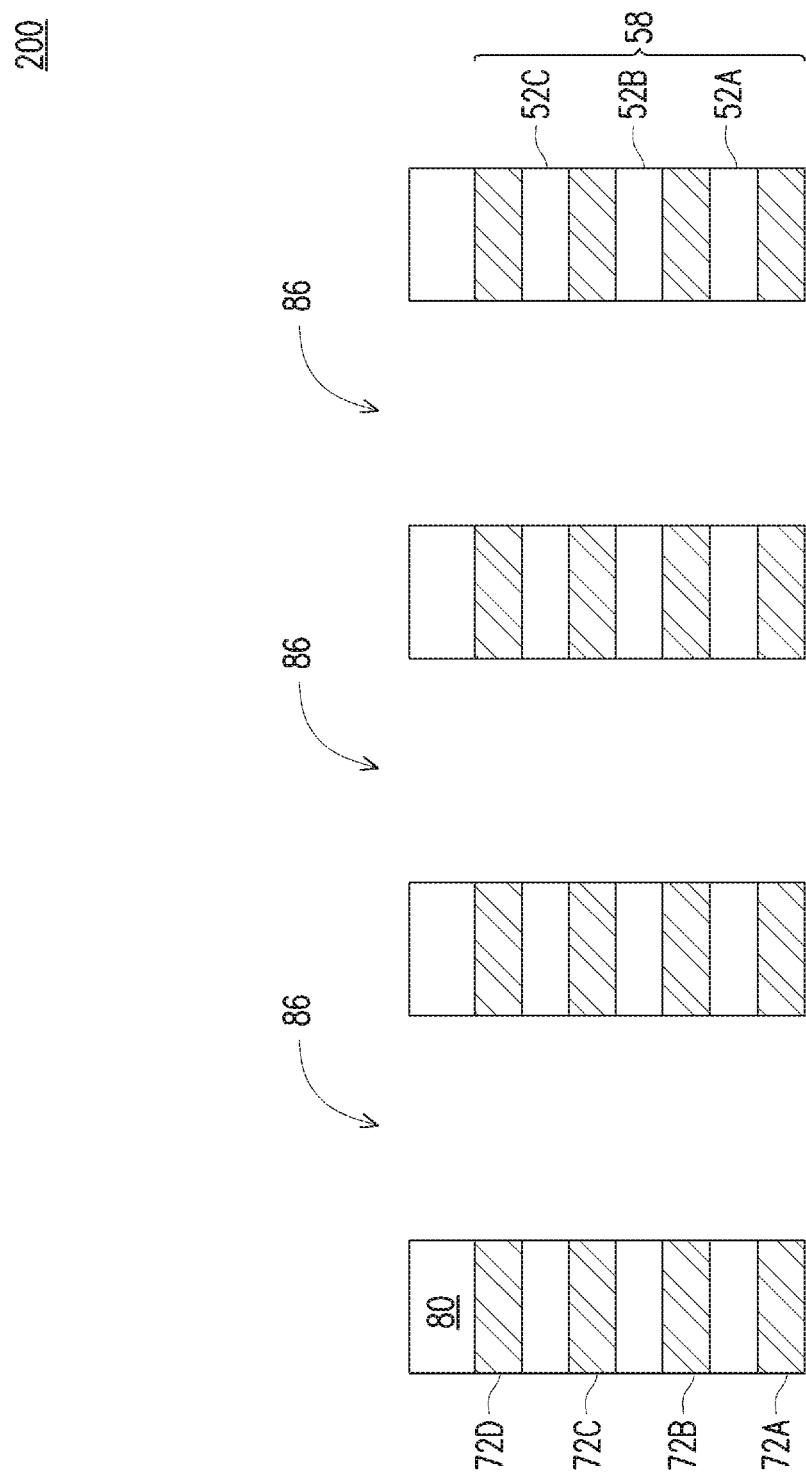
Figure 17A:
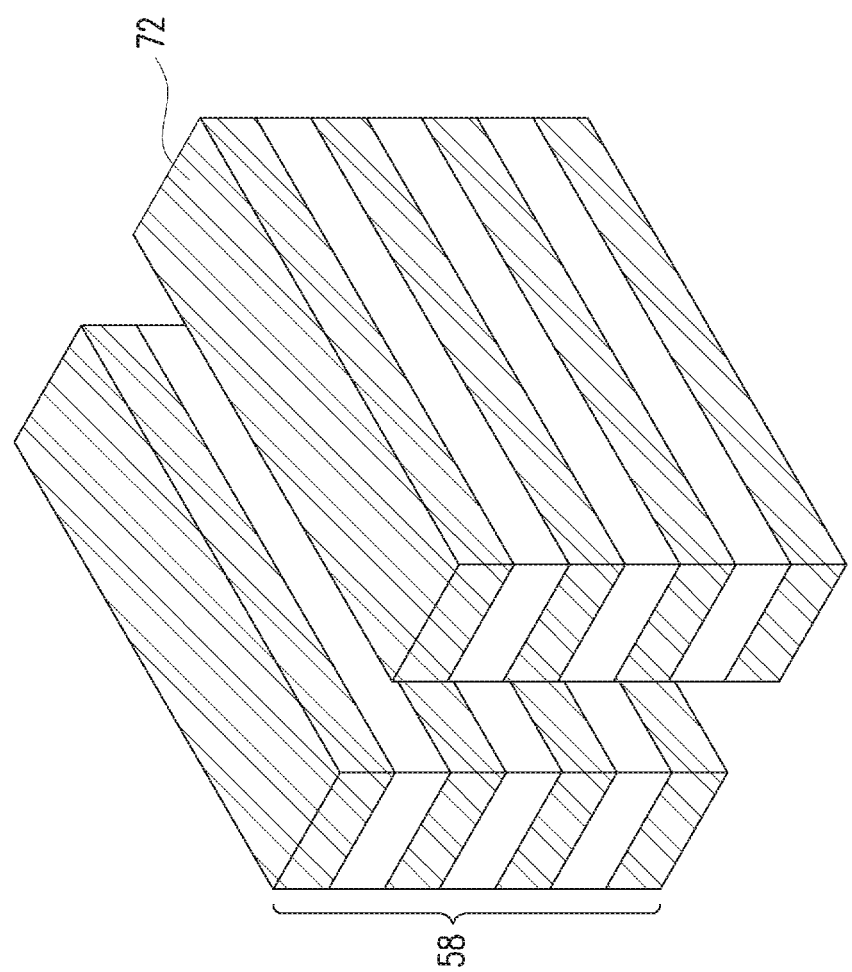
Figure 17B:
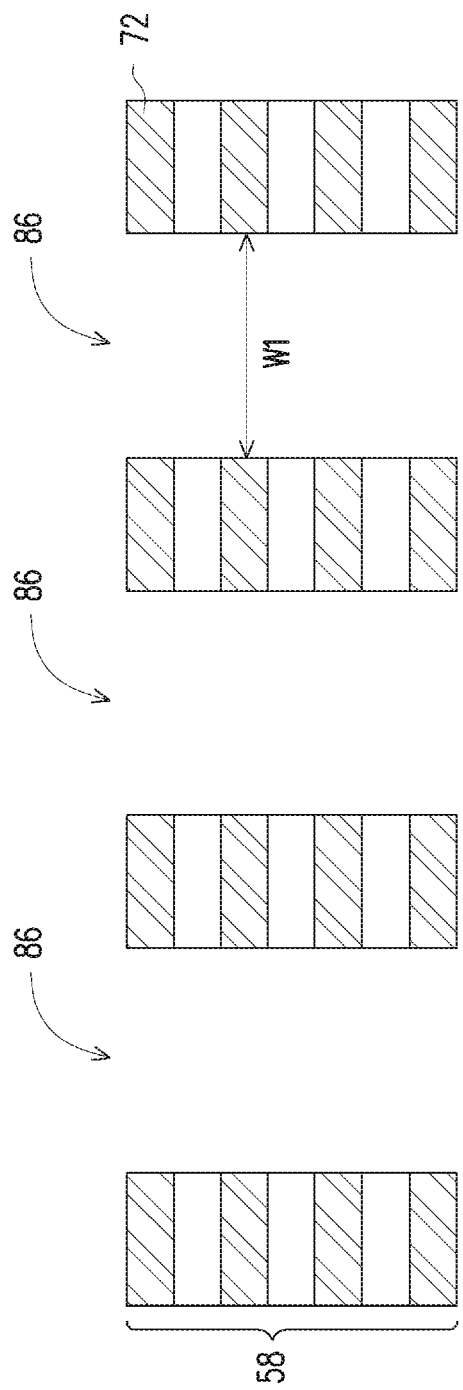

In FIG. 16, a pattern of the hard mask 80 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other. Subsequently, in FIGS. 17A and 17B, the hard mask 80 may then be removed by an acceptable process, such as a wet etching process, a dry etching process, a planarization process, combinations thereof, or the like. Due to the staircase shape of the multi-layered stack 58 (see e.g., FIG. 12A), the conductive lines 72 may have varying lengths that increase in a direction towards the substrate 50. For example, the conductive lines 72A may be longer than the conductive lines 72B; the conductive lines 72B may be longer than the conductive lines 72C; and the conductive lines 72C may be longer than the conductive lines 72D. In some embodiments, the trenches 86 may be formed having a width $W_1$ that is in the range of about 50 nm to about 100 nm, though other widths are possible.

Figure 18A:
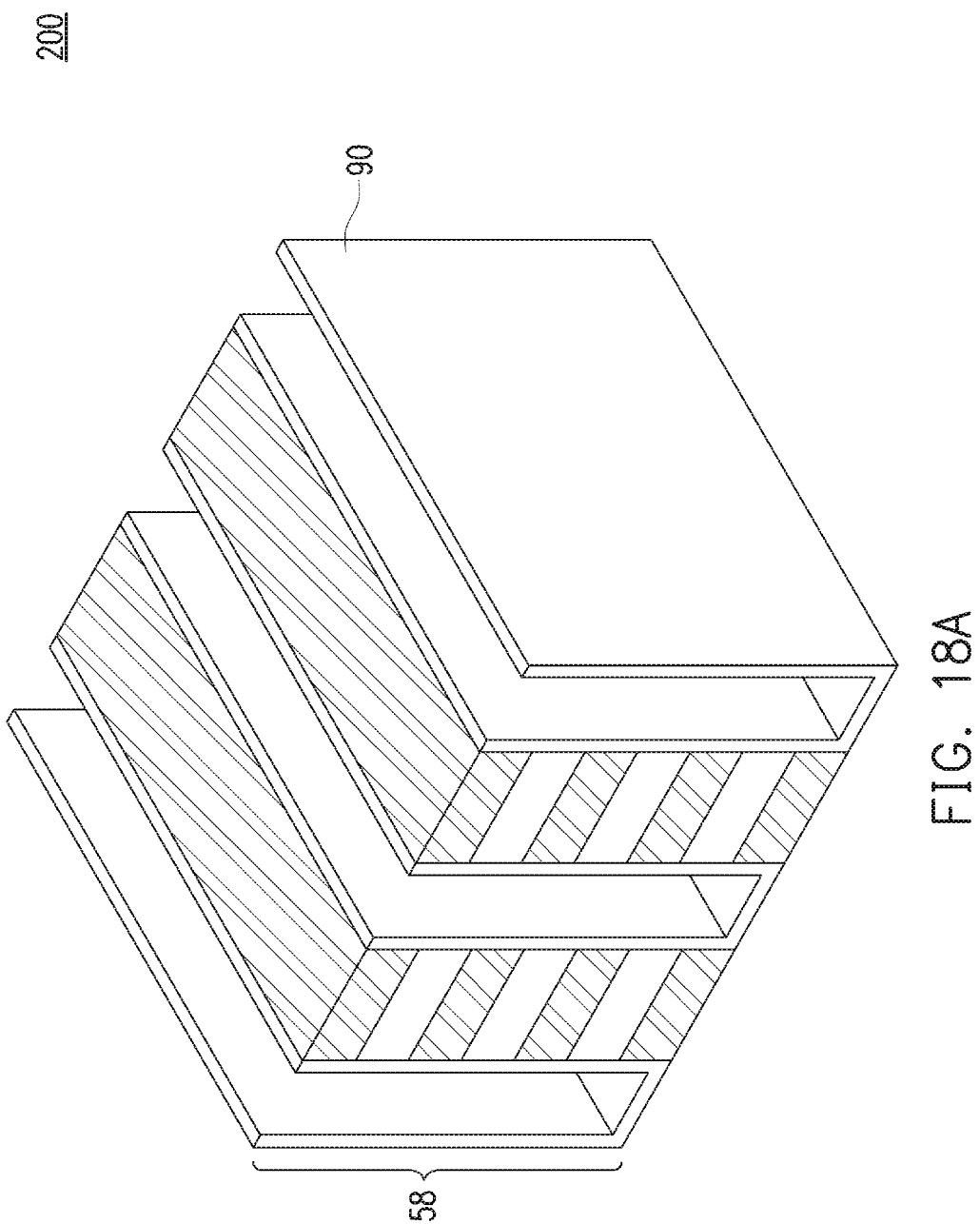
Figure 18B:
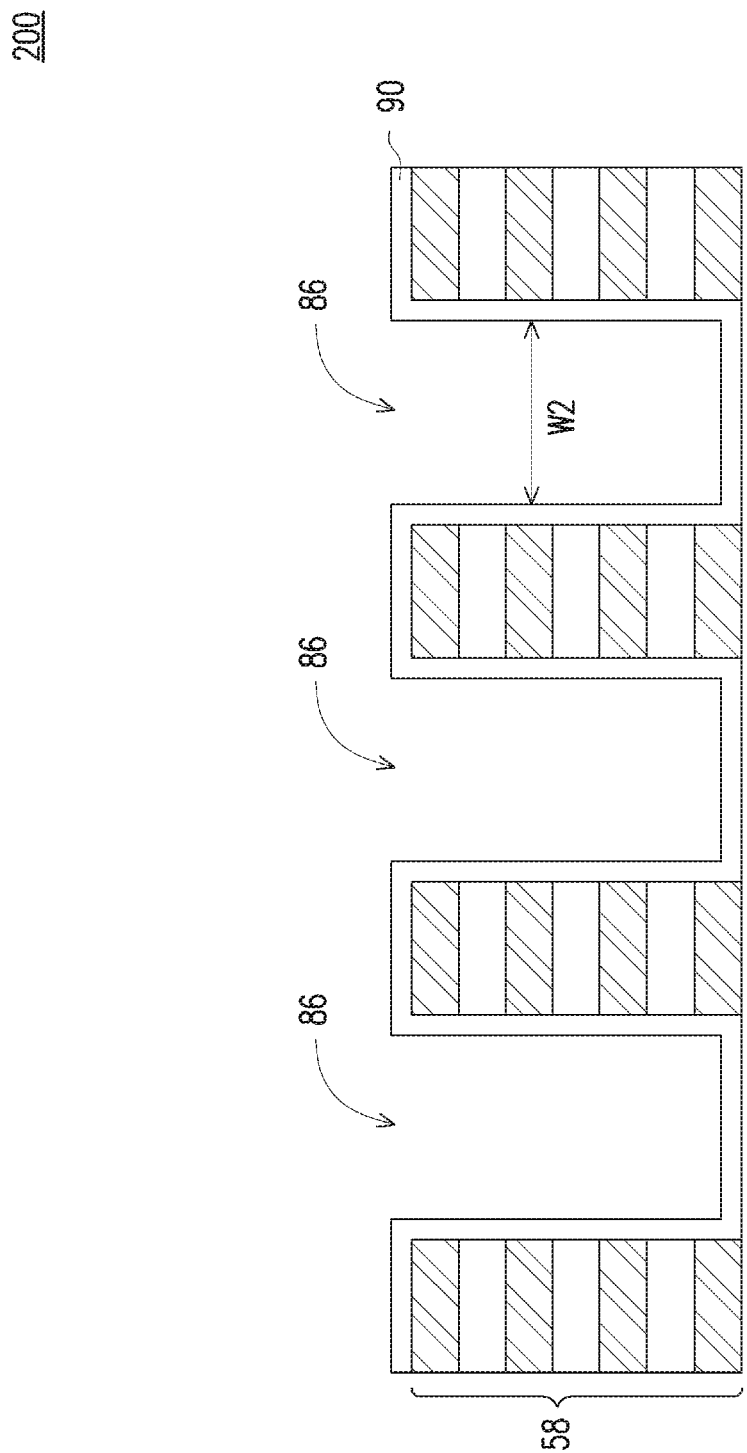
Figure 19A:
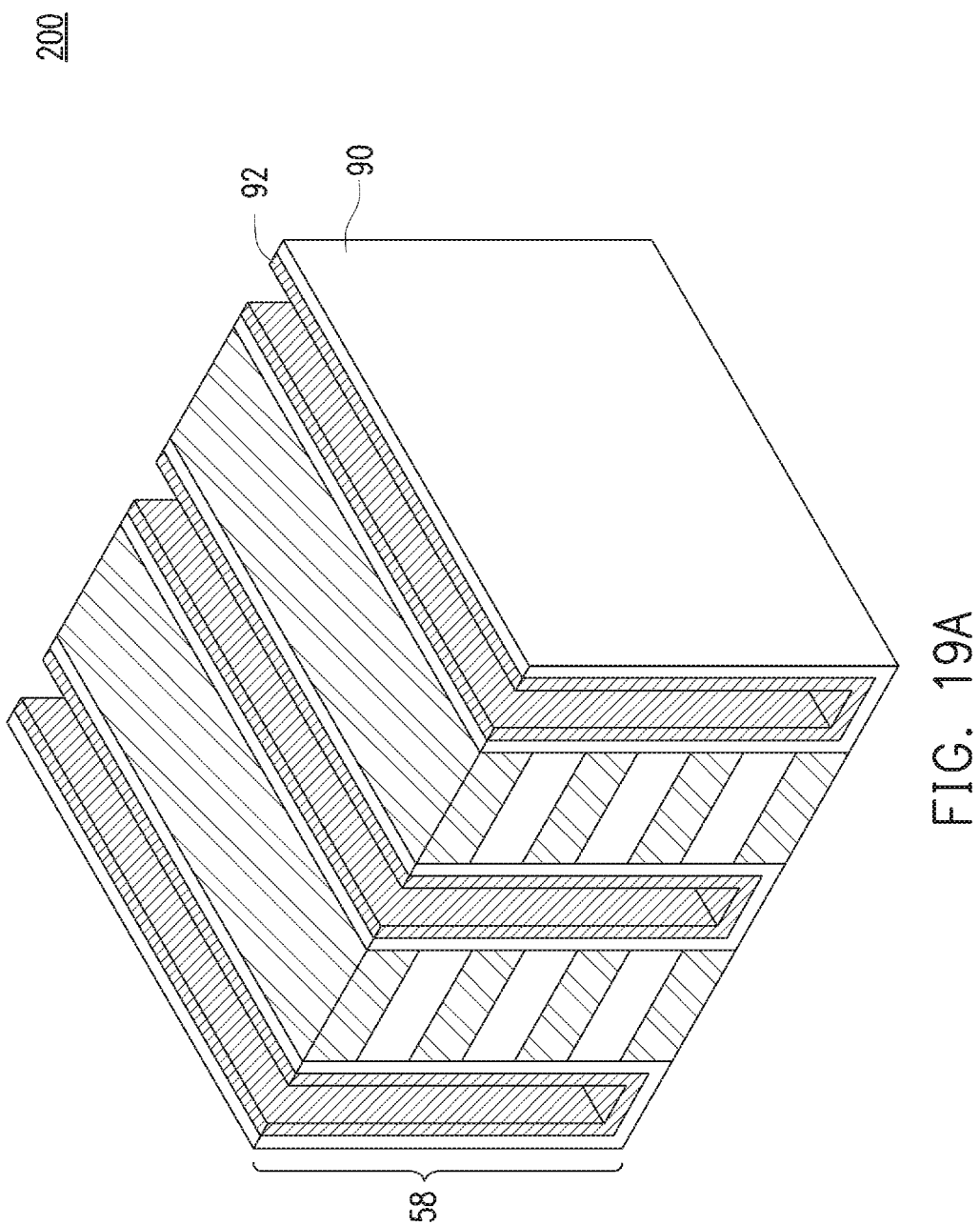
Figure 19B:
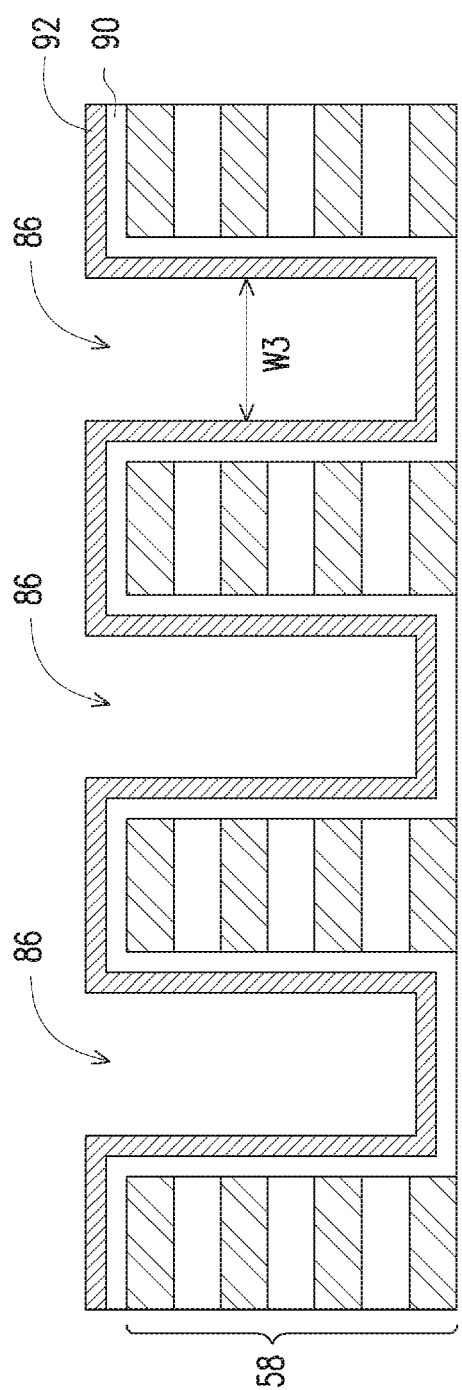
Figure 20:
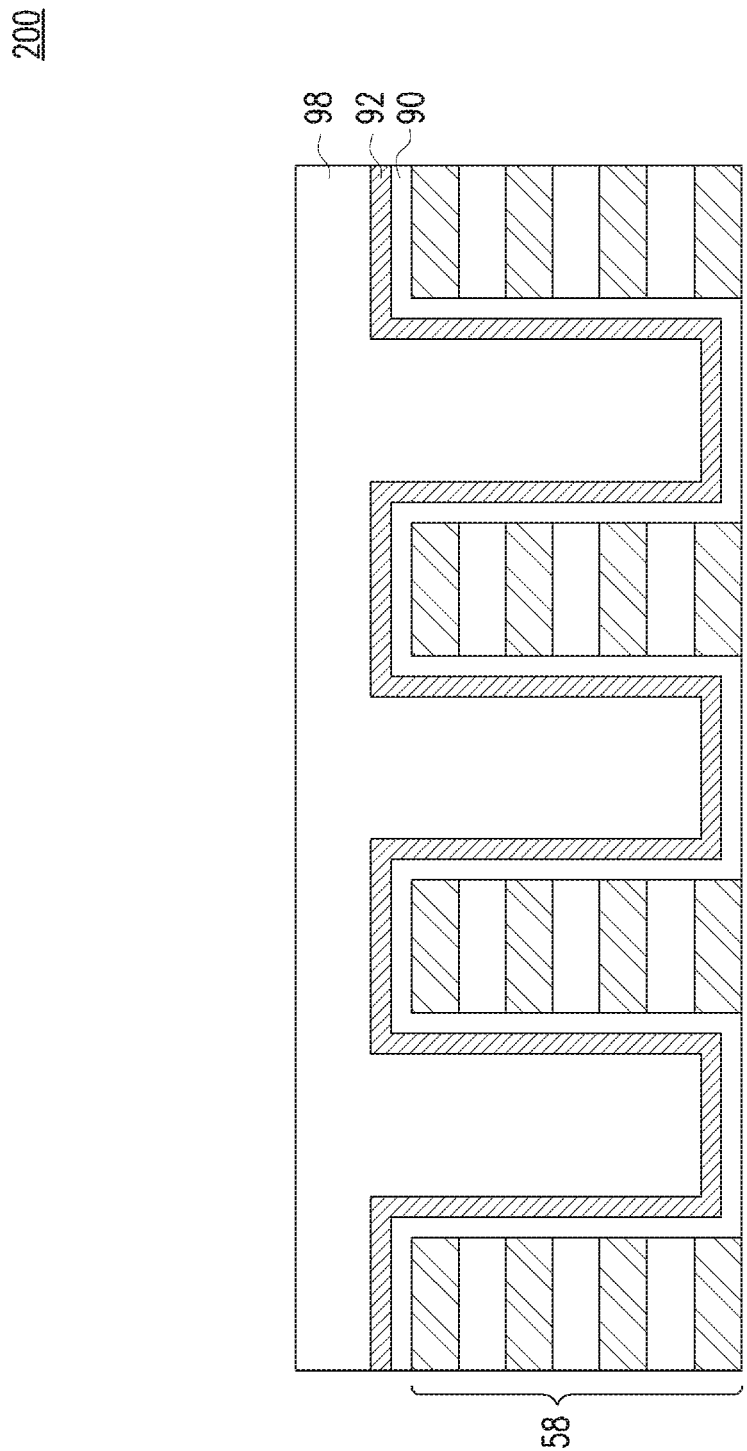

FIGS. 18A through 20 illustrate forming and patterning channel regions for the transistors 204 (see FIG. 1A) in the trenches 86. FIGS. 18A and 19A are illustrated in a three-dimensional view. FIGS. 18B, 19B, and 20 illustrate cross-sectional views along reference cross-section C-C' of FIG. 1A.

In FIGS. 18A and 18B, a memory film 90 is conformally deposited in the trenches 86. The memory film 90 may have a material that is capable of storing a bit, such as material capable of switching between two different polarization directions by applying an appropriate voltage differential across the memory film 90. For example, the polarization of the memory film 90 may change due to an electric field resulting from applying the voltage differential.

For example, the memory film 90 may be a high-k dielectric material, such as a hafnium (Hf) based dielectric material, or the like. In some embodiments, the memory film 90 comprises a ferroelectric material, such as, hafnium oxide, hafnium zirconium oxide, silicon-doped hafnium oxide, or the like. In other embodiments, the memory film 90 may be a multilayer structure comprising a layer of $SiN_x$ between two $SiO_x$ layers (e.g., an ONO structure). In still other embodiments, the memory film 90 may comprise a different ferroelectric material or a different type of memory material. The memory film 90 may be deposited by CVD, PVD, ALD, PECVD, or the like to extend along sidewalls and a bottom surface of the trenches 86. In some embodiments, after the memory film 90 is deposited, an annealing step may be performed. In some embodiments, the memory film 90 may be deposited to a thickness that is in the range of about 5 nm to about 15 nm, though other thicknesses are possible. In some embodiments, after depositing the memory film 90, the trenches 86 may have a width W2 that is in the range of about 40 nm to about 70 nm, though other widths are possible.

In FIGS. 19A and 19B, the OS layer 92 is conformally deposited in the trenches 86 over the memory film 90. The OS layer 92 comprises a material suitable for providing a channel region for a transistor (e.g., transistors 204, see FIG. 1A). In some embodiments, the OS layer 92 comprises an indium-comprising material, such as indium oxide, indium gallium zinc oxide, indium titanium oxide, indium tungsten oxide, indium tin oxide, the like, or combinations thereof. In other embodiments, a different semiconductor material than these examples may be used for the OS layer 92. For example, in other embodiments, the OS layer 92 may comprise zinc oxide or another type of oxide. The OS layer 92 may be deposited by CVD, PVD, ALD, PECVD, or the like. The OS layer 92 may extend along sidewalls and a bottom surface of the trenches 86 over the memory film 90. In some embodiments, after the OS layer 92 is deposited, an annealing step (e.g., at a temperature range of about 300° C. to about 450° C.) in oxygen-related ambient may be performed to activate the charge carriers of the OS layer 92. In some embodiments, the OS layer 92 may be deposited to a thickness that is in the range of about 1 nm to about 15 nm, though other thicknesses are possible. In some embodiments, after depositing the OS layer 92, the trenches 86 may have a width W3 that is in the range of about 20 nm to about 70 nm, though other widths are possible.

In FIG. 20, a dielectric material 98 is deposited on sidewalls and a bottom surface of the trenches 86 and over the OS layer 92. The dielectric material 98 may comprise, for example, silicon oxide, silicon nitride, silicon oxynitride, or the like, which may be deposited by CVD, PVD, ALD, PECVD, or the like. As shown in FIG. 20, the dielectric material 98 may fill the trenches 86 and may cover the multi-layer stack 58.

Figure 21A:
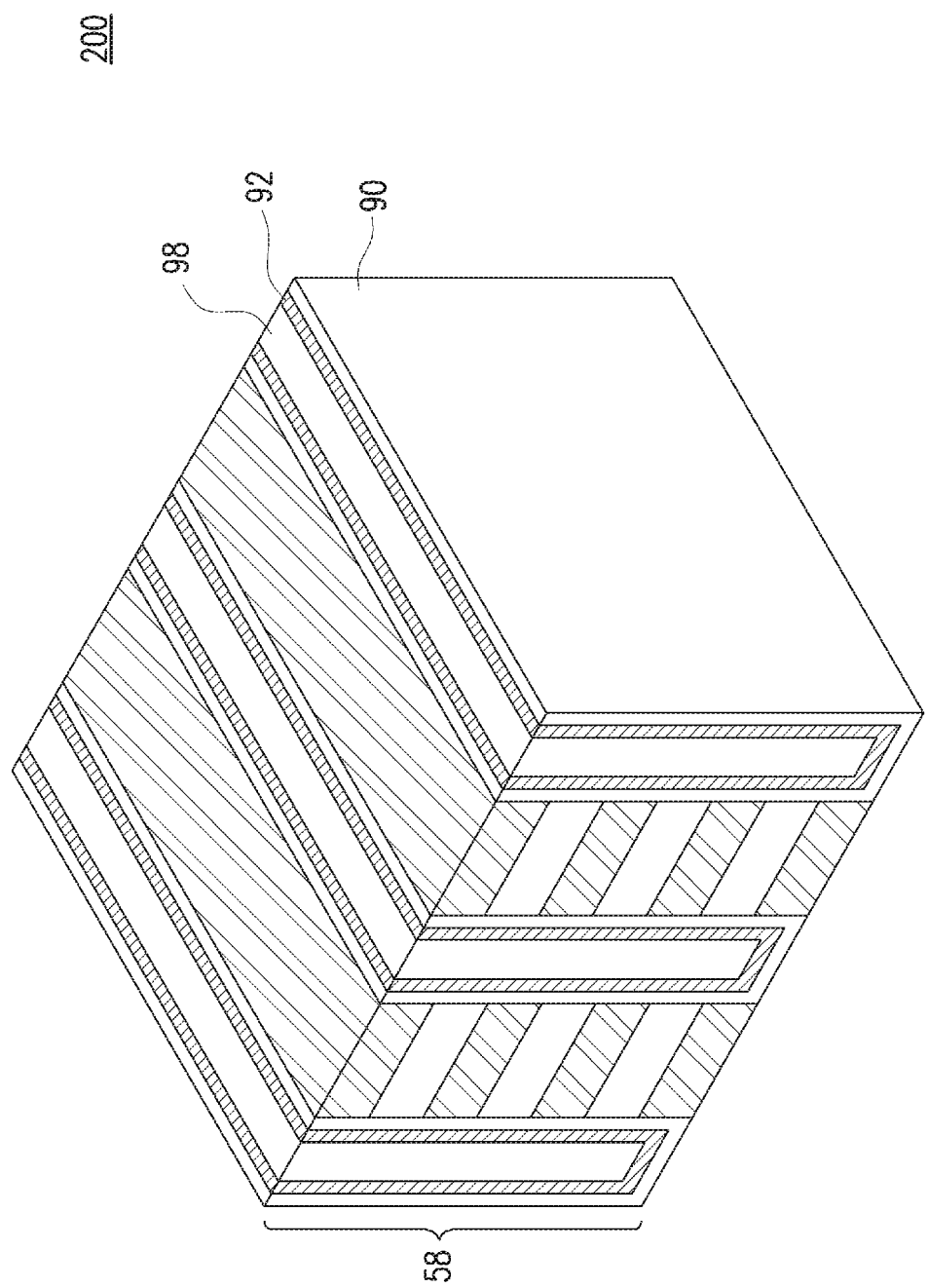
Figure 21B:
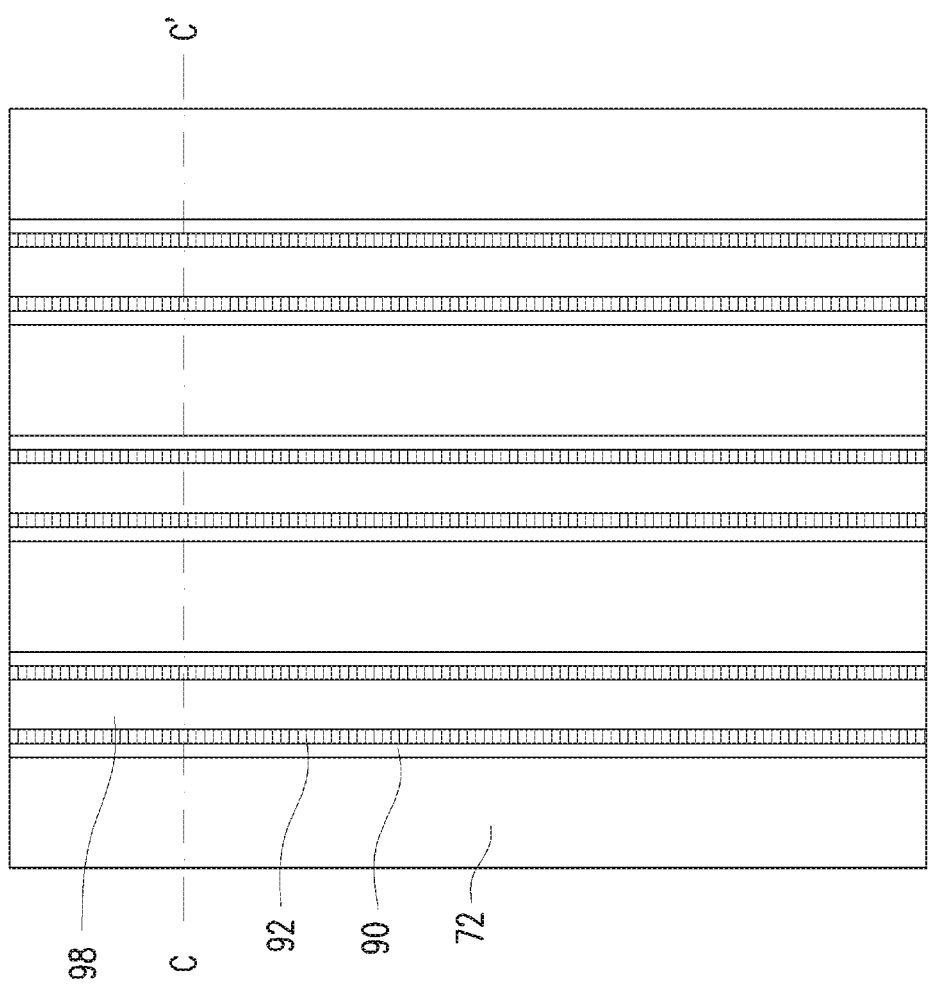
Figure 21C:
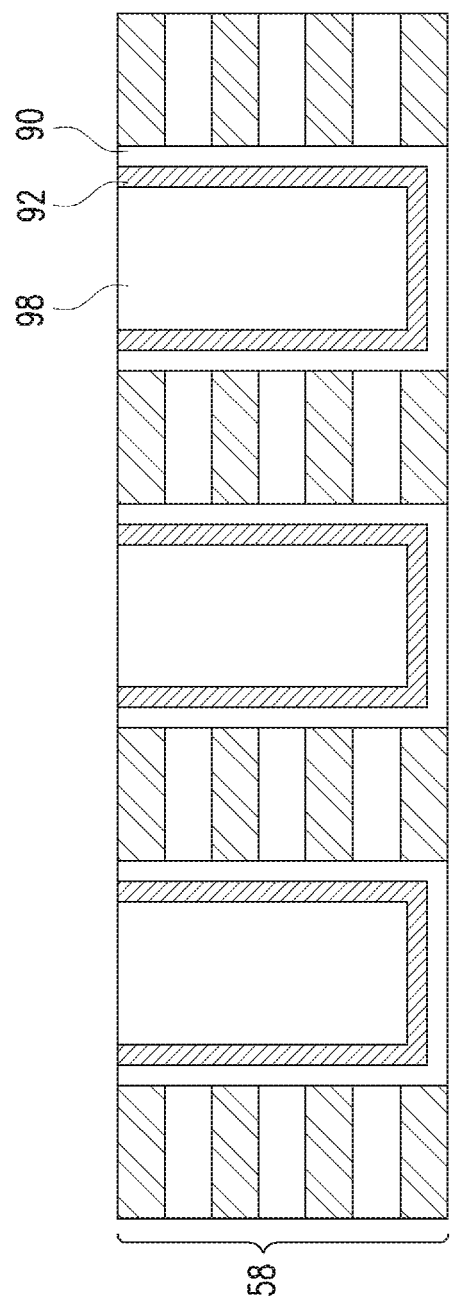

In FIGS. 21A through 21C, a removal process is then applied to the dielectric material 98, the OS layer 92, and the memory film 90 to remove excess material over the multi-layer stack 58. In some embodiments, a planarization process such as a chemical mechanical polish (CMP), a grinding process, an etch-back process, combinations thereof, or the like may be utilized. The planarization process may expose the multi-layer stack 58 such that top surfaces of the multi-layer stack 58 are level after the planarization process is complete. FIG. 21A illustrates a three-dimensional view, FIG. 21B illustrates a corresponding top-down view of the structure illustrated in FIG. 21A, and FIG. 21C illustrates a cross-sectional view through the reference cross-section C-C' shown in FIGS. 1A and 21B.

Figure 24A:
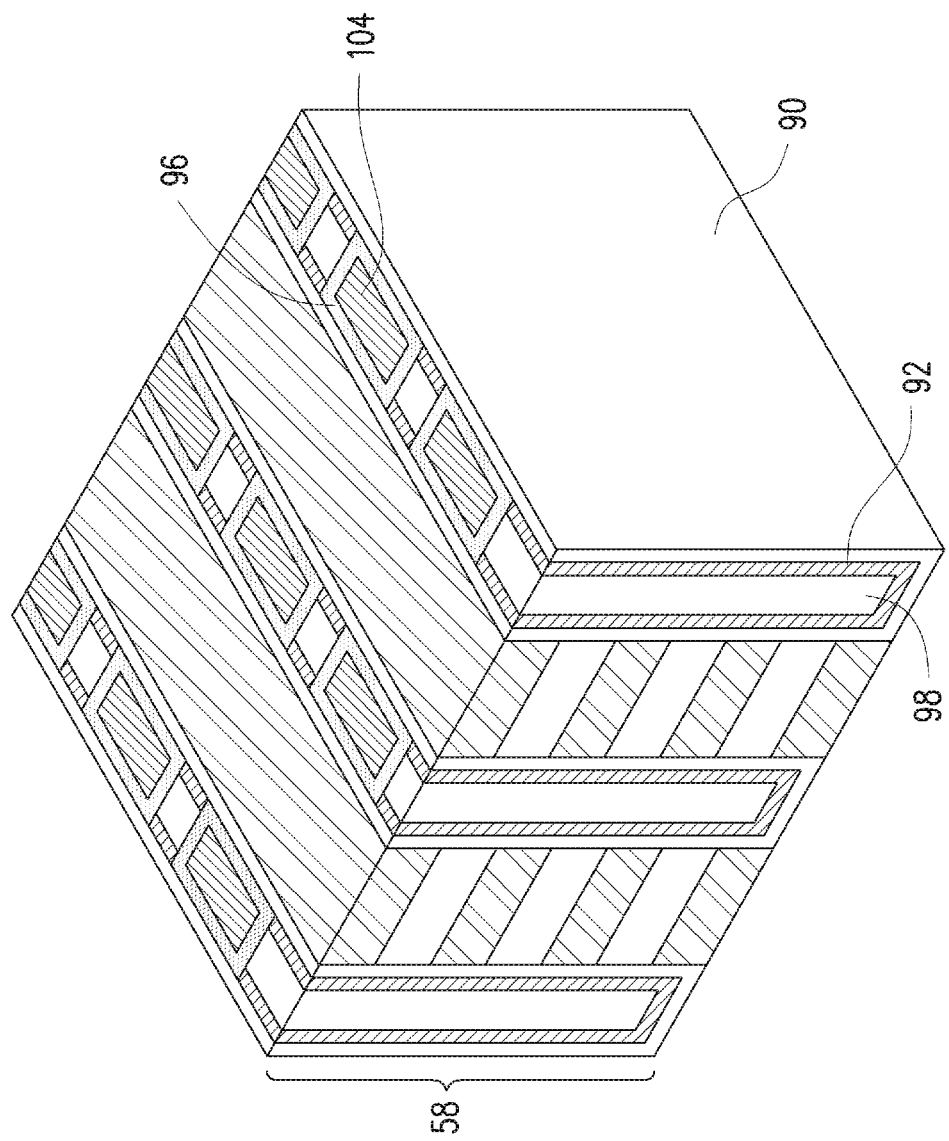
Figure 24B:
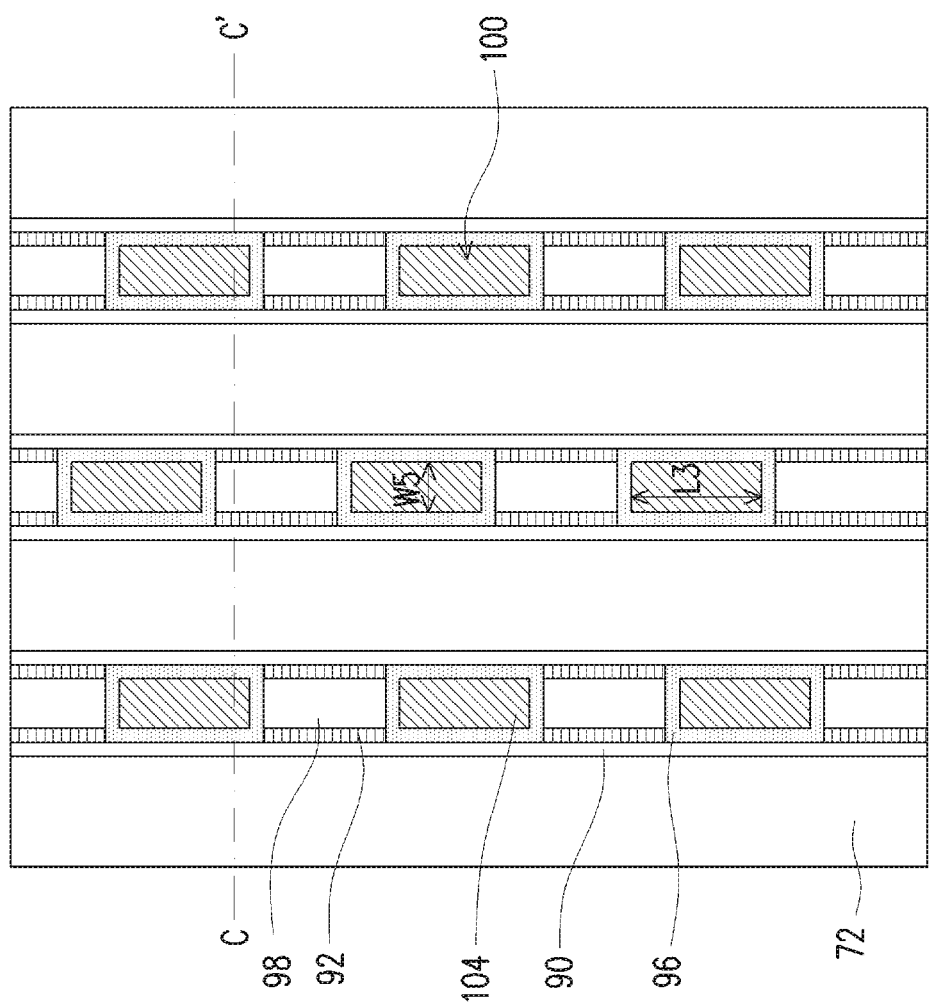
Figure 25A:
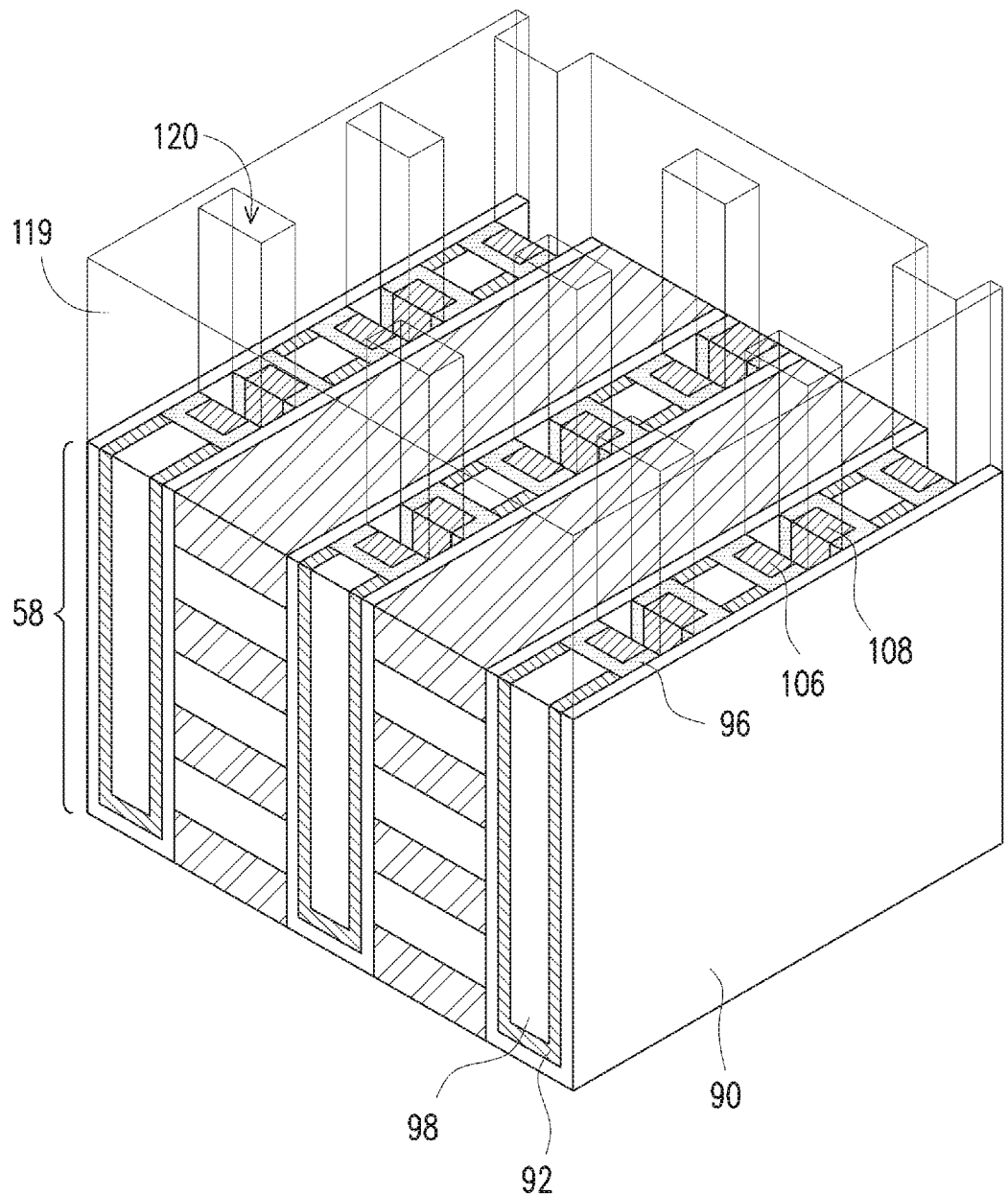
Figure 25B:
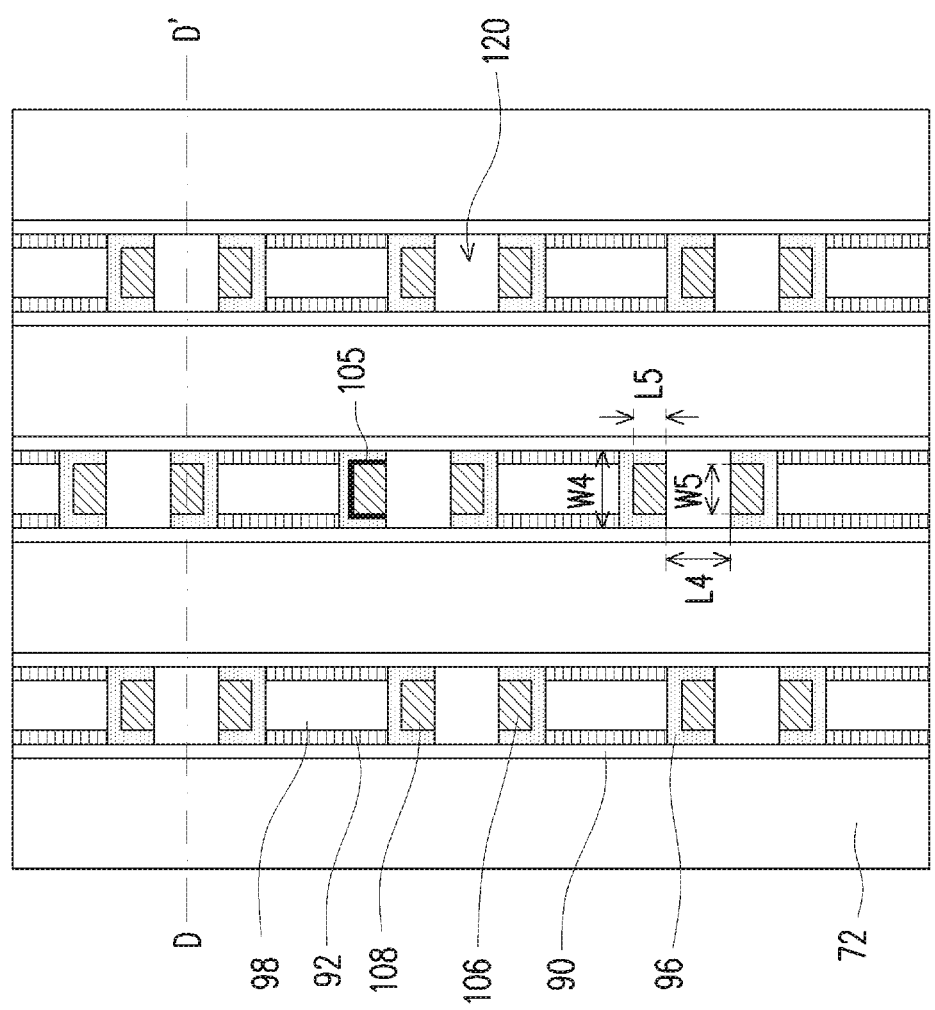
Figure 25C:
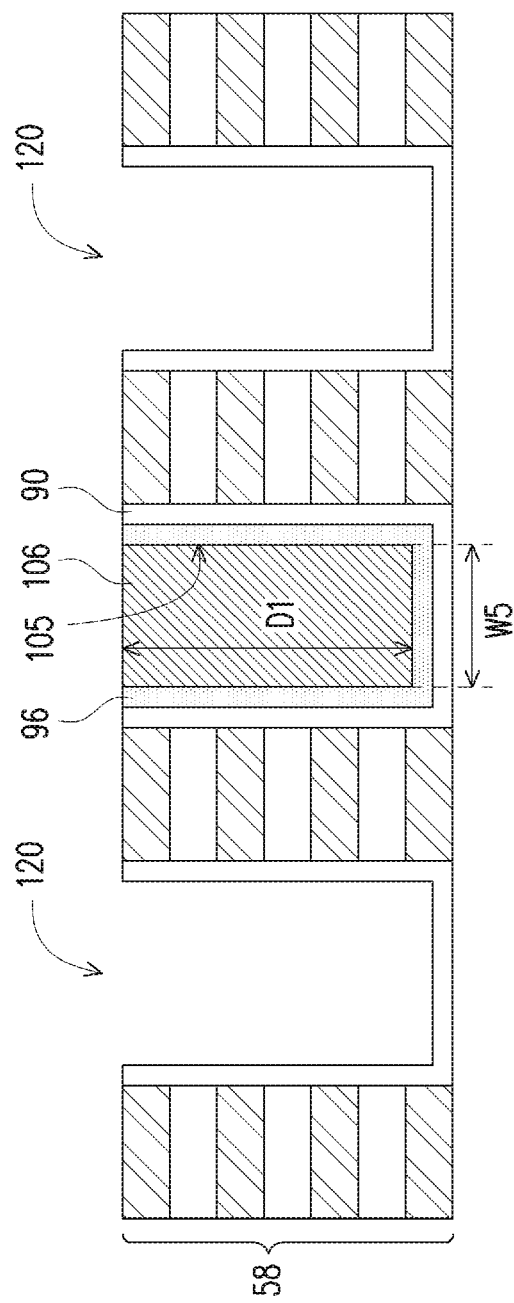
Figure 26A:
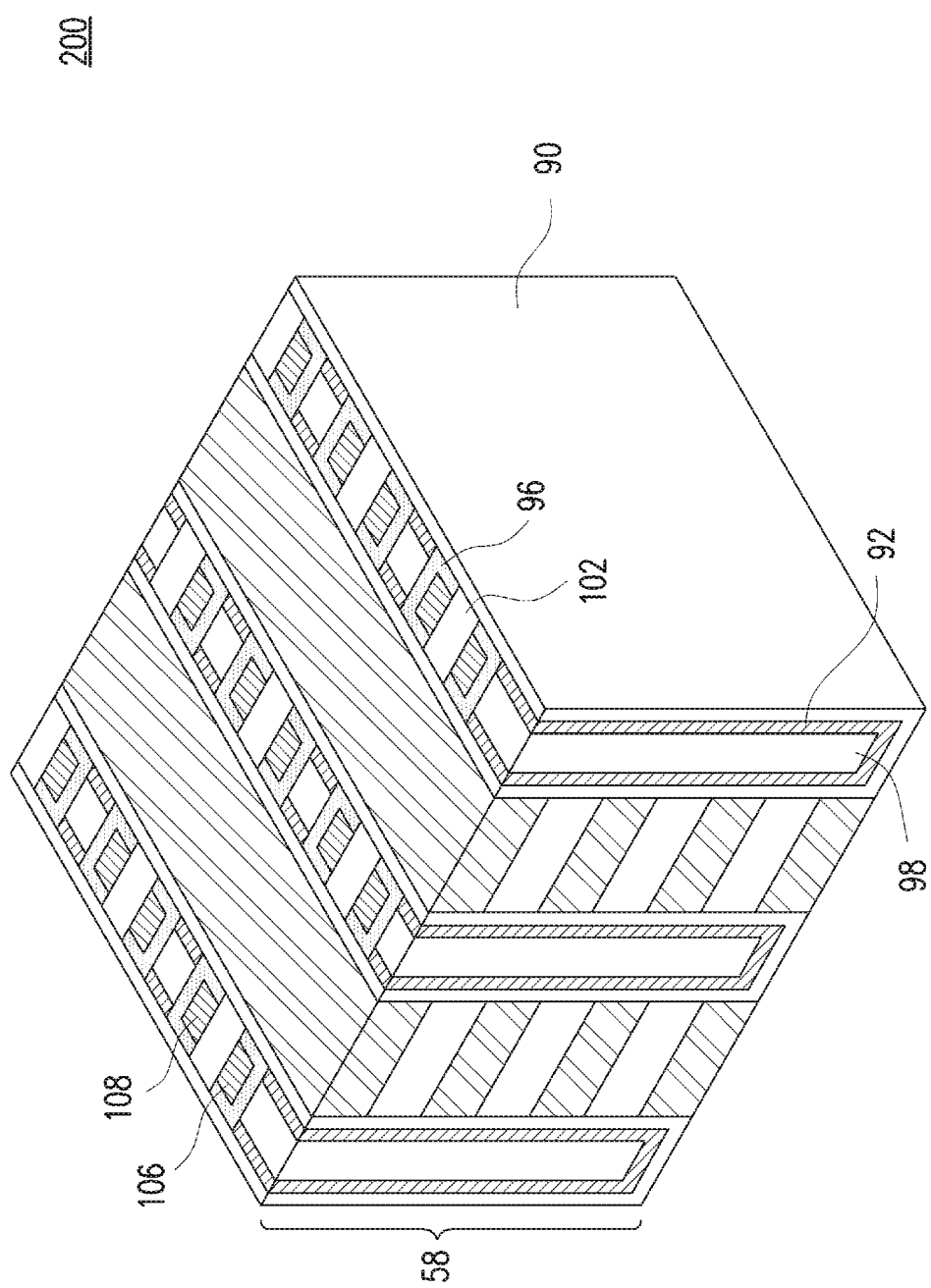
Figure 26B:
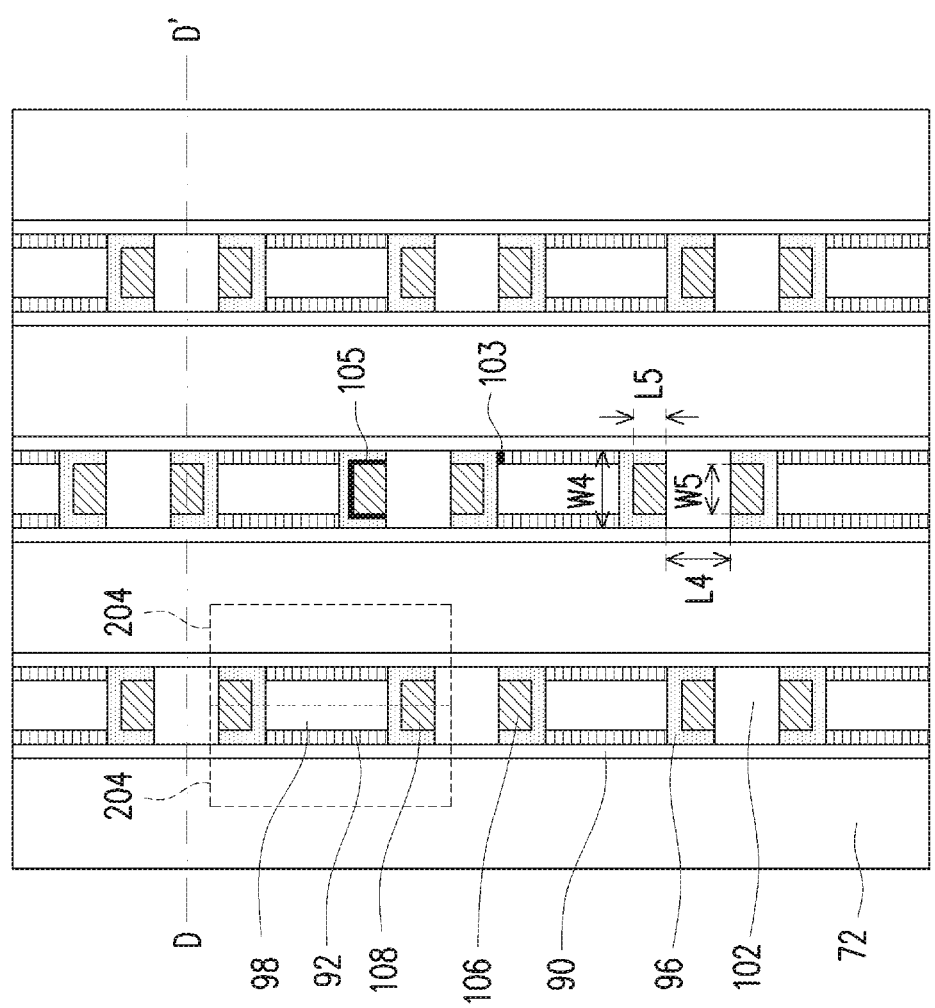
Figure 26C:
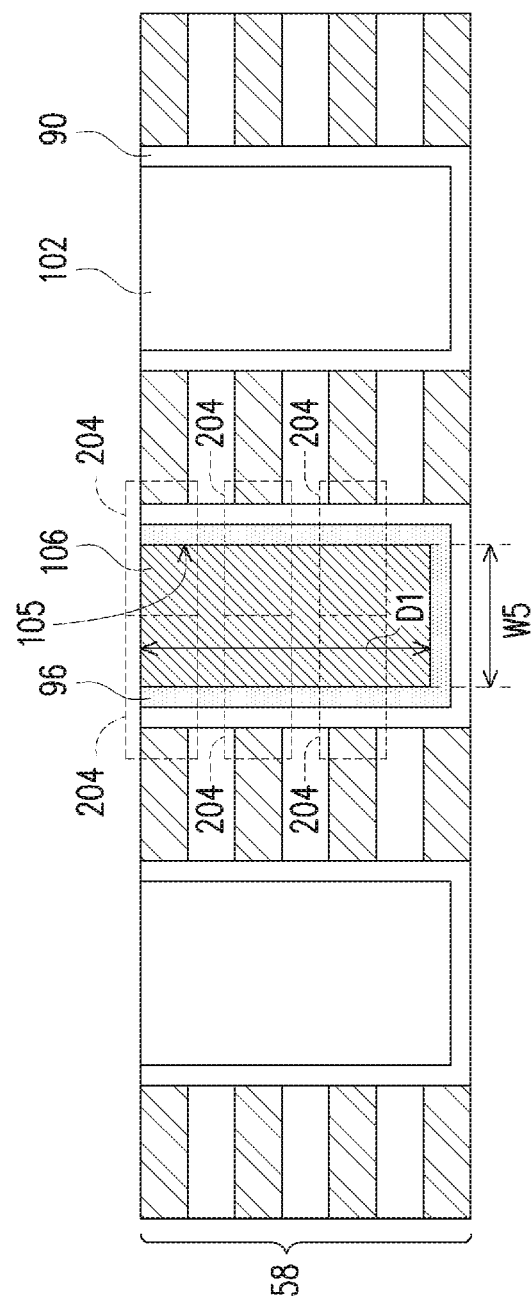

FIGS. 22A through 26C illustrate intermediate steps of manufacturing conductive lines 106 and 108 (e.g., source lines and bit lines) in the memory array 200. The conductive lines 106 and 108 may extend along a direction perpendicular to the conductive lines 72 such that individual cells of the memory array 200 may be selected for read and write operations. FIGS. 22A, 23A, 24A, 25A, and 26A illustrate a three-dimensional view. FIGS. 22B, 23B, 24B, 25B, and 26B illustrate a top down view. FIGS. 22C, 23C, and 24C illustrate cross-sectional views along the reference cross-section C-C' shown in FIG. 1A and in, for example, FIG. 22B. FIGS. 25C and 26C illustrate cross-sectional views along the reference cross-section D-D' shown in FIG. 1A and in, for example, FIG. 25B.

Figure 22A:
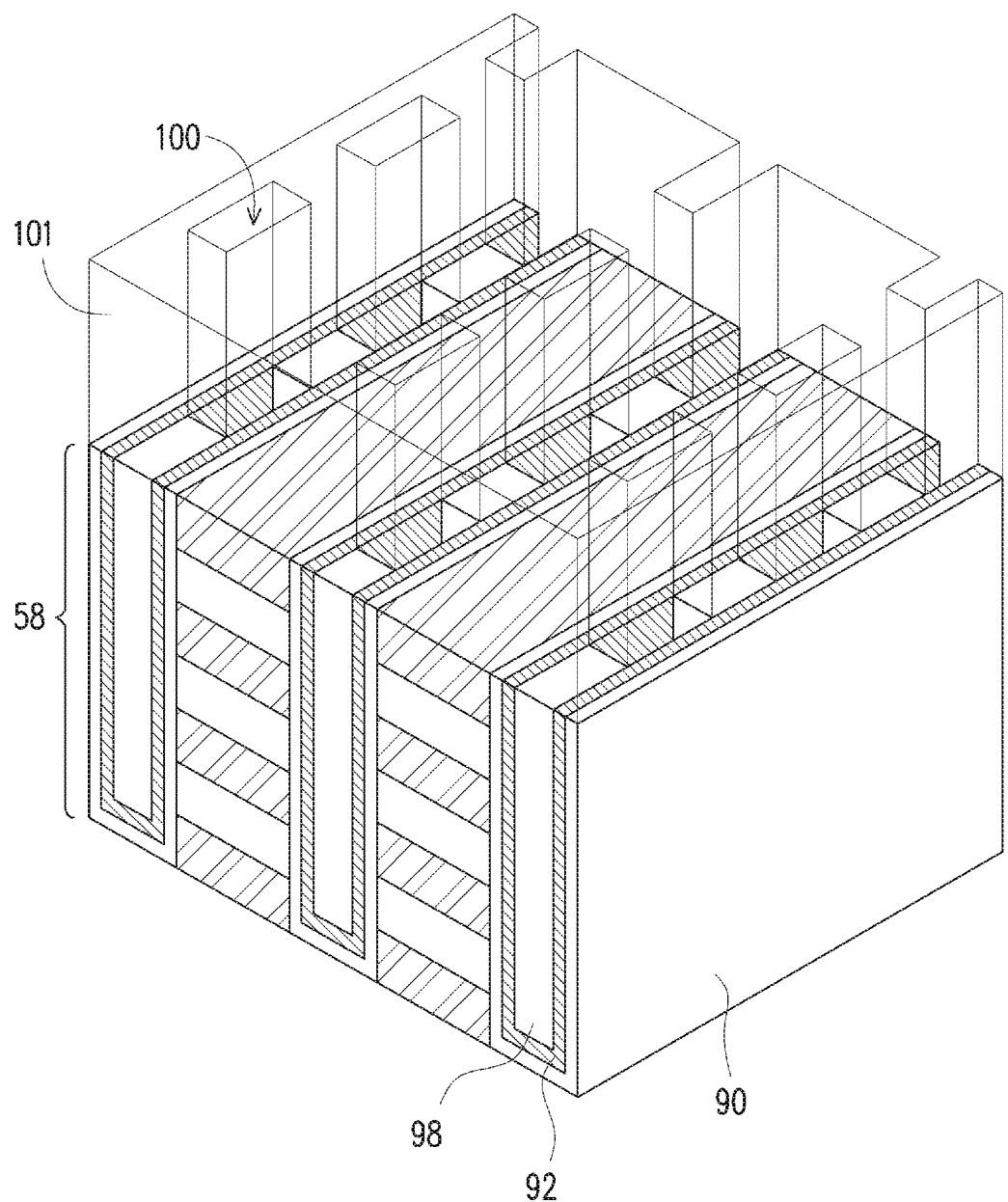
Figure 22C:
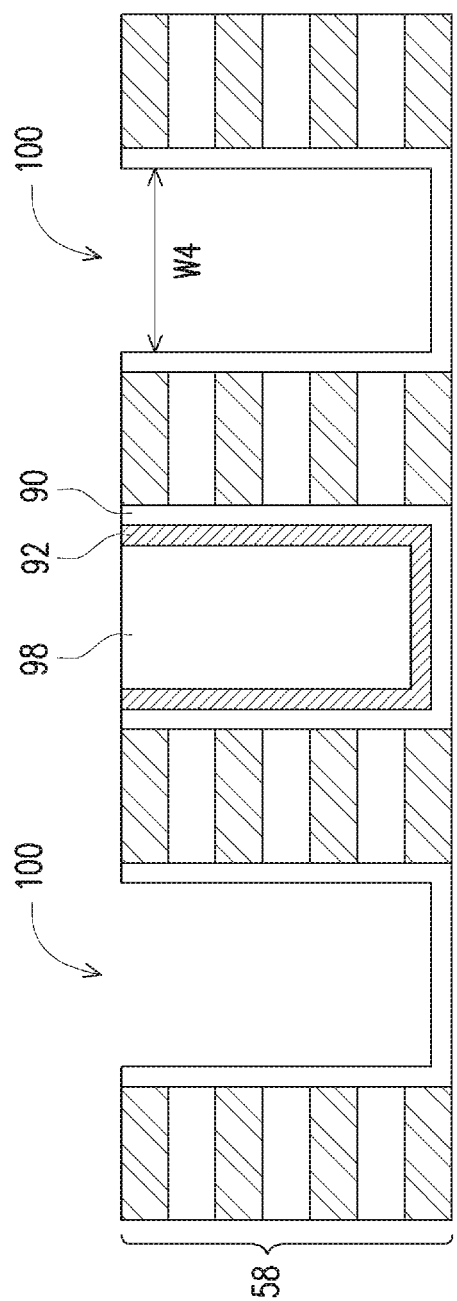

In FIGS. 22A, 22B, and 22C, trenches 100 are patterned through the dielectric material 98. The trenches 100 may be disposed between opposing sidewalls of the memory film 90, and define regions where the conductive lines 106/108 are subsequently formed. Patterning the trenches 100 may be performed through a combination of photolithography and etching, in some embodiments. For example, a photoresist 101 may be deposited over the multi-layer stack 58, the dielectric material 98, the OS layer 92, and the memory film 90. The photoresist 101 can be formed by using a suitable technique such as a spin-on technique, for example. The photoresist 101 is then patterned to define openings 100. Each of the openings 100 exposes a region of the dielectric material 98, and may expose regions of the OS layer 92. The photoresists can be patterned using acceptable photolithography techniques. For example, the photoresist 101 be exposed to light for patterning. After the exposure process, the photoresist 101 may be developed to remove exposed or unexposed portions of the photoresist depending on whether a negative or positive resist is used, thereby defining the pattern of the openings 100.

Portions of the dielectric material 98 exposed by the openings 100 may be removed by etching, forming trenches 100 in the dielectric material 98. The etching may be any acceptable etch process, such as by wet or dry etching, a reactive ion etch (RIE), neutral beam etch (NBE), the like, or a combination thereof. The etching may be anisotropic. In some embodiments, the trenches 100 may have a width W4 that is in the range of about 40 nm to about 70 nm or a length L1 that is in the range of about 80 nm to about 150 nm, though other dimensions are possible. In some embodiments, the trenches 100 are separated by a distance L2 that is in the range of about 30 nm to about 120 nm, though other distances are possible. In some embodiments, the trenches 100 may have a depth that is in the range of about 1000 nm to about 2000 nm, though other depths are possible. After the trenches 100 are patterned, the photoresist 101 may be removed by ashing, for example.

The etching may leave portions of the OS layer 92 within the trenches 100 that cover the memory film 90, or the etching may remove the OS layer 92 from the memory film 90 to expose the memory film 90 within the trenches 100. For example, FIG. 22A shows an embodiment in which portions of the OS layer 92 are left remaining after forming the trenches 100 and cover sidewalls of the memory film 90. FIGS. 22B-C show embodiments in which the OS layer 92 is removed and sidewalls of the memory film 90 are exposed. In some embodiments in which portions of the OS layer 92 are left remaining on the memory film 90 after forming the trenches 100, the remaining OS layer 92 may have a thickness in the range of about 0 nm to about 15 nm, though other thicknesses are possible.

Figure 23A:
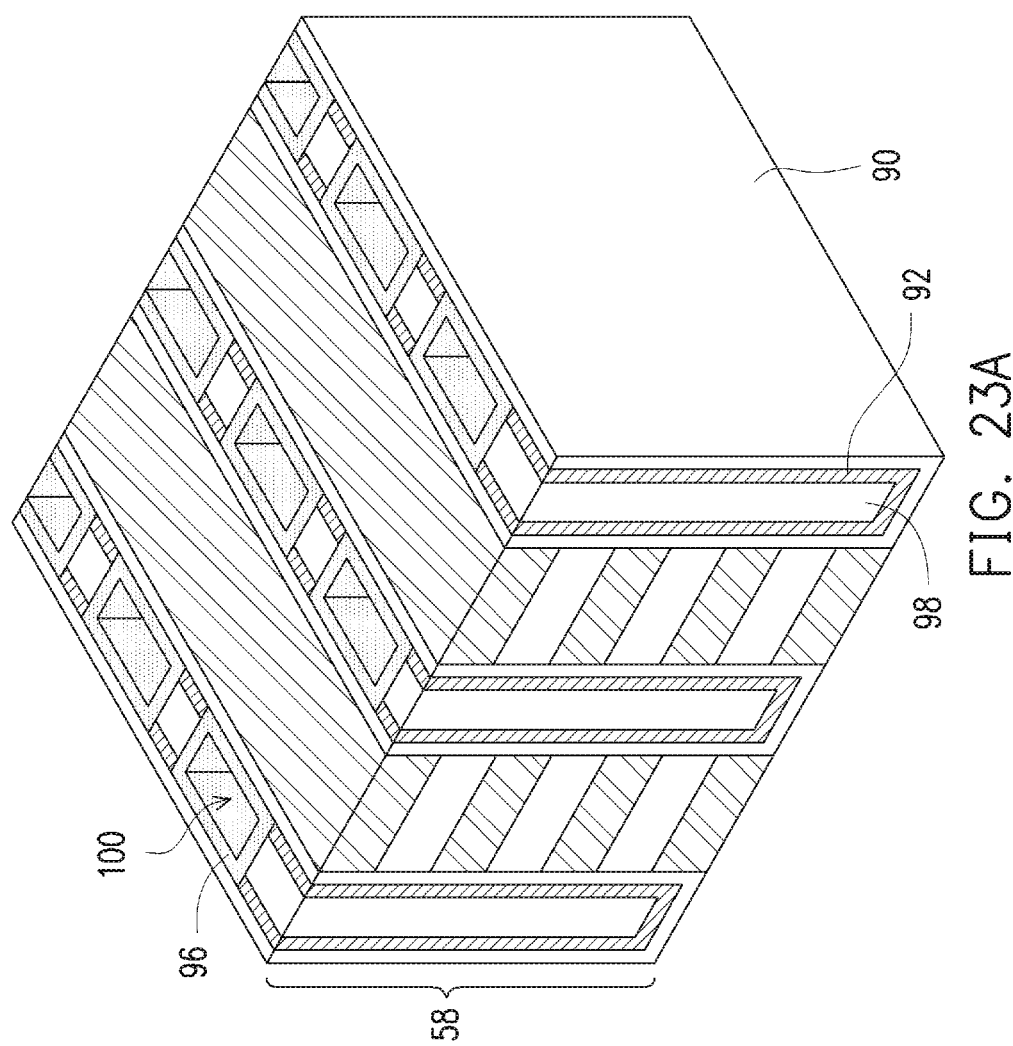
Figure 23B:
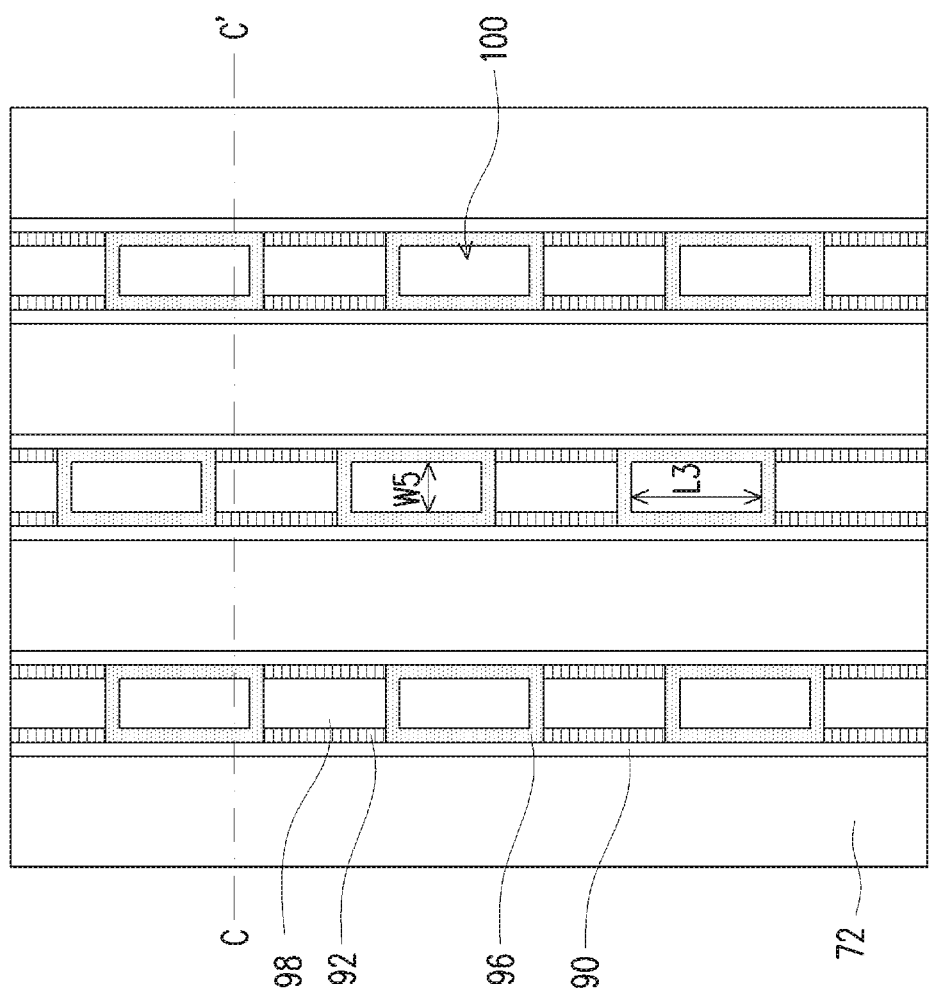
Figure 23C:
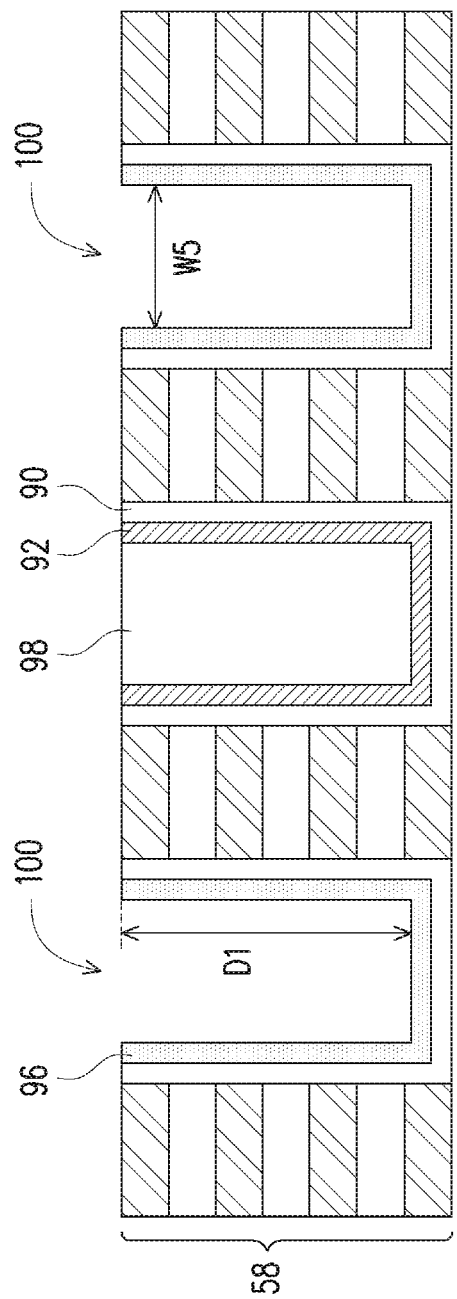

In FIGS. 23A, 23B, and 23C, a refill layer 96 is deposited in the trenches 100, in accordance with some embodiments. As shown in FIG. 23A, the refill layer 96 may be conformally deposited on surfaces of the dielectric material 98, the OS layer 92, and/or the memory film 90 within the trenches 100. FIGS. 23A-C show an embodiment in which the OS layer 92 covering the memory film 90 has been removed, and thus the refill layer 96 is deposited on surfaces of the memory film 90 within the trenches 100. The refill layer 96 may extend along sidewalls and a bottom surface of the trenches 100 over the memory film 90. In other embodiments, the refill layer 96 may be deposited on remaining portions of the OS layer 92 within the trenches 100 that cover the memory film 90. The refill layer 96 can provide increased contact area between the subsequently formed conductive lines 106/108 (see FIGS. 25A-26C) and the OS layer 92, particularly in cases in which the OS layer 92 within the trenches 100 is removed. In some embodiments, the refill layer 96 may be formed of a material that provides a less resistive contact to the conductive lines 106/108 than the material of the OS layer 92. In this manner, the refill layer 96 as described herein can reduce resistance and provide improved performance for transistors (e.g., transistors 204, see FIG. 1A).

The refill layer 96 may be deposited using similar techniques as the OS layer 92, such as CVD, PVD, ALD, PECVD, or the like. The refill layer 96 may comprise the same material or a similar material as the material of the OS layer 92, in some embodiments. For example, In some embodiments, the refill layer 96 comprises an indium-comprising material, such as indium oxide, indium gallium zinc oxide, indium titanium oxide, indium tungsten oxide, indium tin oxide, the like, or combinations thereof. In other embodiments, a different semiconductor material than these examples or the OS layer 92 may be used for the refill layer 96. For example, in other embodiments, the refill layer 96 may comprise zinc oxide or another type of oxide.

In some embodiments, the refill layer 96 may be a material having a greater concentration of carriers than the material of the OS layer 92. In this manner, the refill layer 96 can provide a less resistive contact between the conductive lines 106/108 and the OS layer 92. For example, in some embodiments, the OS layer 92 may be formed from a material such as indium gallium zinc oxide, indium titanium oxide, indium tungsten oxide, zinc oxide, or indium oxide, and the refill layer 96 may be formed from a material with a relatively greater carrier concentration such as indium titanium oxide, indium tungsten oxide, zinc oxide, or indium oxide. In some embodiments, the OS layer 92 may have a carrier concentration that is between about $10^{15}$ cm$^{-3}$ and about $10^{17}$ cm$^{-3}$ and the refill layer 96 may have a carrier concentration that is between about $10^{19}$ cm$^{-3}$ and about $10^{22}$ cm$^{-3}$.

In some embodiments, the refill layer 96 may be deposited to a thickness that is in the range of about 1 nm to about 15 nm, though other thicknesses are possible. The refill layer 96 may have a thickness smaller than, about the same, or greater than the thickness of the OS layer 92. For example, in some embodiments, the refill layer 96 extending on the memory film 90 may have a different thickness than the OS layer 92 extending on the memory film 90. In some embodiments, after depositing the refill layer 96, the trenches 100 may have a width W5 that is in the range of about 20 nm to about 70 nm or a length L3 that is in the range of about 50 nm to about 80 nm, though other dimensions are possible. In some embodiments, after depositing the refill layer 96, the trenches 100 may have a depth D1 that is in the range of about 1000 nm to about 2000 nm, though other depths are possible. In some embodiments, a planarization process is performed after depositing the refill layer 96.

In FIGS. 24A, 24B, and 24C the trenches 100 are filled with a conductive material 104, in accordance with some embodiments. The conductive lines 106/108 are subsequently formed from the conductive material 104 (see FIGS. 25A-26C). The conductive material 104 may comprise one or more materials such as copper, titanium, titanium nitride, tantalum, tantalum nitride, tungsten, ruthenium, aluminum, molybdenum, combinations thereof, or the like, which may be each formed using, for example, CVD, ALD, PVD, PECVD, or the like. After the conductive material 104 is deposited, a planarization process may be performed to remove excess portions of the conductive material 104. The planarization process may also remove excess portions of the refill layer 96, in some embodiments. In the resulting structure, top surfaces of the multi-layer stack 58, the memory film 90, the OS layer 92, the refill layer 96, and the conductive material 104 may be substantially level (e.g., coplanar within process variations).

In FIGS. 25A, 25B, and 25C, trenches 120 are patterned in the conductive material 104, forming conductive lines 106 and conductive lines 108, in accordance with some embodiments. FIG. 25C illustrates a cross-sectional view of line D-D' in FIG. 25B. The trenches 120 are patterned by patterning the conductive material 104 using a combination of photolithography and etching. For example, a photoresist 119 may be deposited over the multi-layer stack 58, the dielectric material 98, the OS layer 92, the refill layer 96, the memory film 90, and the conductive material 104. The photoresist 119 can be formed by using a spin-on technique, for example. The photoresist 119 is patterned to define openings 120. Each of the openings 120 may overlap corresponding regions of the conductive material 104 and the refill layer 96. The openings 120 do not completely overlap the conductive material 104, and the portions of the conductive material 104 that the openings 120 do not overlap define the portions of the conductive material 104 that form the conductive lines 106/108. The photoresist 119 can be patterned using acceptable photolithography techniques. For example, the photoresist 119 be exposed to light for patterning. After the exposure process, the photoresist 119 may be developed to remove exposed or unexposed portions of the photoresist 119 depending on whether a negative or positive resist is used, thereby defining the openings 120.

Portions of the conductive material 104 and the refill layer 96 exposed by the openings 120 may be removed by etching, forming trenches 120. The etching may be any acceptable etch process, such as by wet or dry etching, a reactive ion etch (RIE), neutral beam etch (NBE), the like, or a combination thereof. The etching may be anisotropic. In this way, each of the trenches 120 may define a pattern of a conductive line 106 of conductive material 104 and an adjacent conductive line 108 of conductive material 104 that are separated by that trench 120. The conductive lines 106 may correspond to bit lines in the memory array, and the conductive lines 108 may correspond to source lines in the memory array 200. Although FIG. 25C illustrates a cross-sectional view that only shows the conductive lines 106, a cross-sectional view of the conductive lines 108 may be similar. After the trenches 120 are patterned, the photoresist 119 may be removed by ashing, for example.

In some embodiments, the trenches 120 may have a length L4 that is in the range of about 30 nm to about 100 nm, though other dimensions are possible. After etching the trenches 120, the remaining portions of the conductive material 104 that form the conductive lines 106/108 may have a length L5 that is in the range of about 20 nm to about 50 nm, though other dimensions are possible. In some cases, a conductive line 106 and a conductive line 108 adjacent the same trench 120 may have different lengths (e.g., lengths L5). In some embodiments, the length L5 of the conductive lines 106/108 can be controlled by controlling the length L4 of the trenches 120 (e.g., by controlling the patterning of the trenches 120). In this manner, controlling the size of the trenches 120 can control the size of the conductive lines 106/108. Additionally, controlling the length L4 of the trenches 120 can also control the area of the contact between the conductive lines 106/108 and the refill layer 96. An example contact region 105 between a conductive line 106 and a refill layer 96 is indicated in FIG. 25B. The size of the contact region between the conductive lines 106/108 and the refill layer 96 (e.g. contact region 105) is discussed in greater detail below for FIGS. 26A-C and FIG. 27.

In FIGS. 26A, 26B, and 26C, a dielectric material 102 is deposited in and fills the trenches 120, in accordance with some embodiments. FIG. 26C illustrates a cross-sectional view of line D-D' in FIG. 26B. The dielectric material 102 may comprise, for example, silicon oxide, silicon nitride, silicon oxynitride, the like, or combinations thereof. The material of the dielectric material 102 may be the same as or different from the material of the dielectric material 98. The dielectric material 102 may be deposited using a suitable technique, such as CVD, PVD, ALD, PECVD, or the like. The dielectric material 102 may extend along sidewalls and a bottom surface of the trenches 120 over the memory film 90. After deposition, a planarization process (e.g., a CMP, etch back, or the like) may be performed to remove excess portions of the dielectric material 102. In the resulting structure, top surfaces of the multi-layer stack 58, the memory film 90, the conductive lines 106/108, the refill layer 96, the OS layer 92, and the dielectric material 102 may be substantially level. In this manner, adjacent conductive lines 106 and conductive lines 108 are separated by an isolation region formed from the dielectric material 102. The adjacent conductive lines 106/108 are separated by length L4, which can be controlled by controlling the corresponding length L4 of the trenches 120.

An example contact region 105 between a conductive line 106 and a refill layer 96 is indicated in FIG. 26B. In some cases, forming a refill layer 96 between the conductive lines 106/108 and the OS layer 92 as described herein can improve conduction between the conductive lines 106/108 and the OS layer 92. For example, in embodiments in which the OS layer 92 is removed from the memory film 90 during the etching of the trenches 100 (see FIGS. 22A-C), without the presence of the refill layer 96, the contact area between the conductive lines 106/108 and the OS layer 92 would be limited by the thickness of the OS layer 92, shown in FIG. 26B by example contact region 103. By partially surrounding the conductive lines 106/108 with the refill layer 96, the effective contact area between the conductive lines 106/108 and the OS layer 92 may be increased, shown in FIG. 26B by contact region 105. The area of a contact region 105 may be approximately defined by the depth D1, the width W5, and the length L5 of the conductive lines 106/108. In some embodiments, the area of a contact region 105 may be in the range of about 1800 nm² to about 8500 nm², though other contact areas are possible. In some embodiments, the use of a refill layer 96 can increase the effective contact area between the conductive lines 106/108 and the OS layer 92 by between about 33% and about 500%, though other percentages are possible. By forming contact regions 105 having a larger area, the contact resistance between the conductive lines 106/108 and the OS layer 92 can be reduced. Additionally, as described previously, the material of the refill layer 96 may be chosen to further reduce contact resistance. In some cases, the contact resistance when using a refill layer 96 is between about 30% and about 100% of the contact resistance when no refill layer 96 is present.

Because the area of the contact regions 105 may be approximately defined by the depth D1, the width W5, and the length L5 of the conductive lines 106/108, controlling the dimensions D1, W5, and/or L5 of the conductive lines 106/108 can also control the size of the contact regions 105. An example is shown in FIG. 27, in which the trenches 120 (see FIGS. 25A-C) have been formed having a length L4 that is smaller than the length L4 of the trenches 120 formed for FIGS. 26A-C. By forming trenches 120 having a smaller length L4, the size of the conductive lines 106/108 and the area of the contact regions 105 may be increased. This is also shown in FIG. 27, in which the conductive lines 106/108 have a larger length L5 than the conductive lines in FIGS. 26A-C. In this manner, a smaller length L4 of the trenches 120 can result in a larger length L5 of the conductive lines 106/108, which results in a correspondingly larger area of the contact regions 105. Forming larger conductive lines 106/108 or a larger area of the contact regions 105 can reduce resistance, which can improve device performance, such as by improving power efficiency or reducing heating, for example.

Turning back to FIGS. 26A-C, stacked transistors 204 may be formed in the memory array 200. Each transistor 204 comprises a gate electrode (e.g., a portion of a corresponding conductive line 72), a gate dielectric (e.g., a portion of a corresponding memory film 90), a channel region (e.g., a portion of a corresponding OS layer 92 and refill layer 96), and source and drain electrodes (e.g., portions of corresponding conductive lines 106 and 108). The dielectric material 102 isolates adjacent transistors 204 in a same column and at a same vertical level. The transistors 204 may be disposed in an array of vertically stacked rows and columns.

Figure 28A:
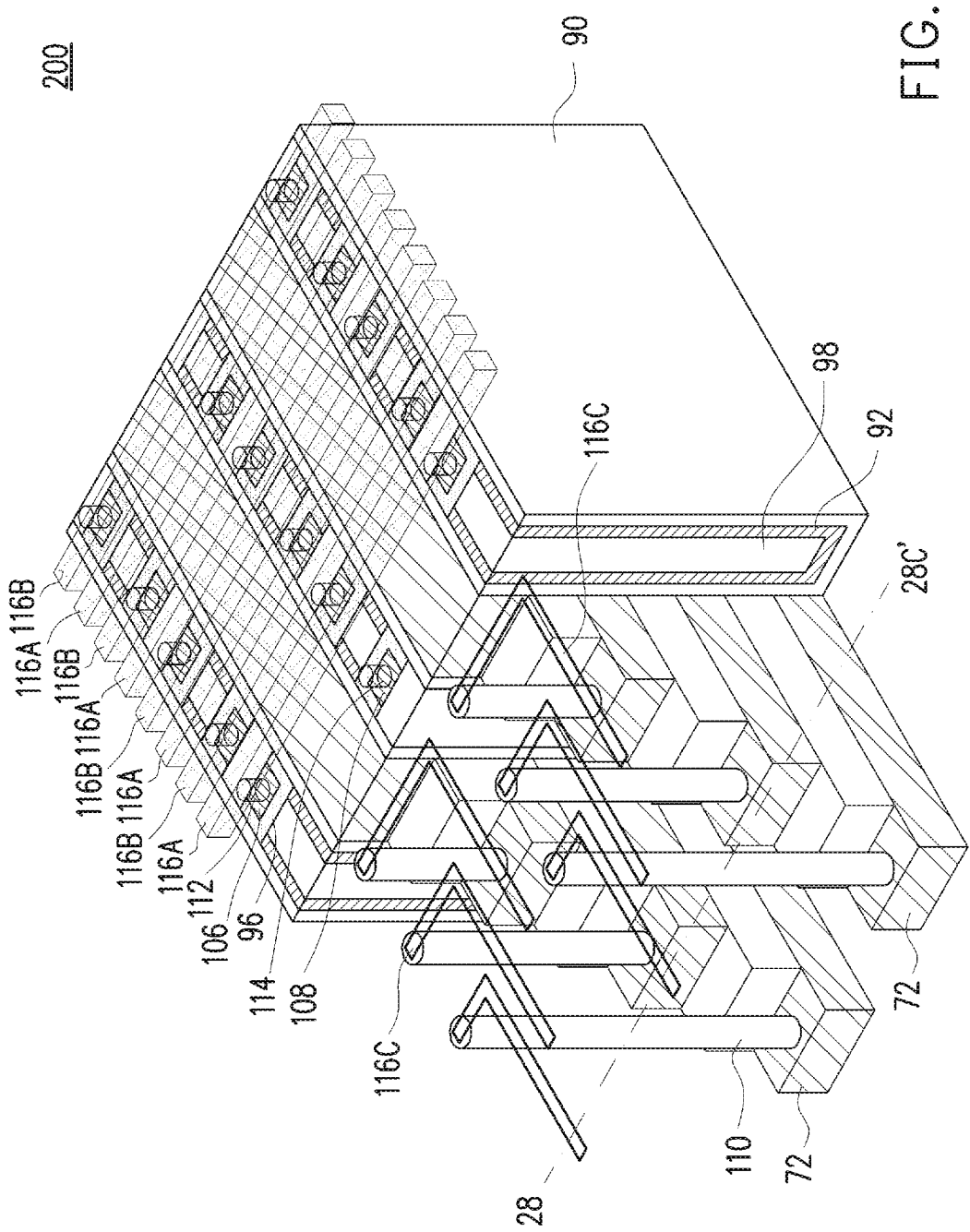
Figure 28C:
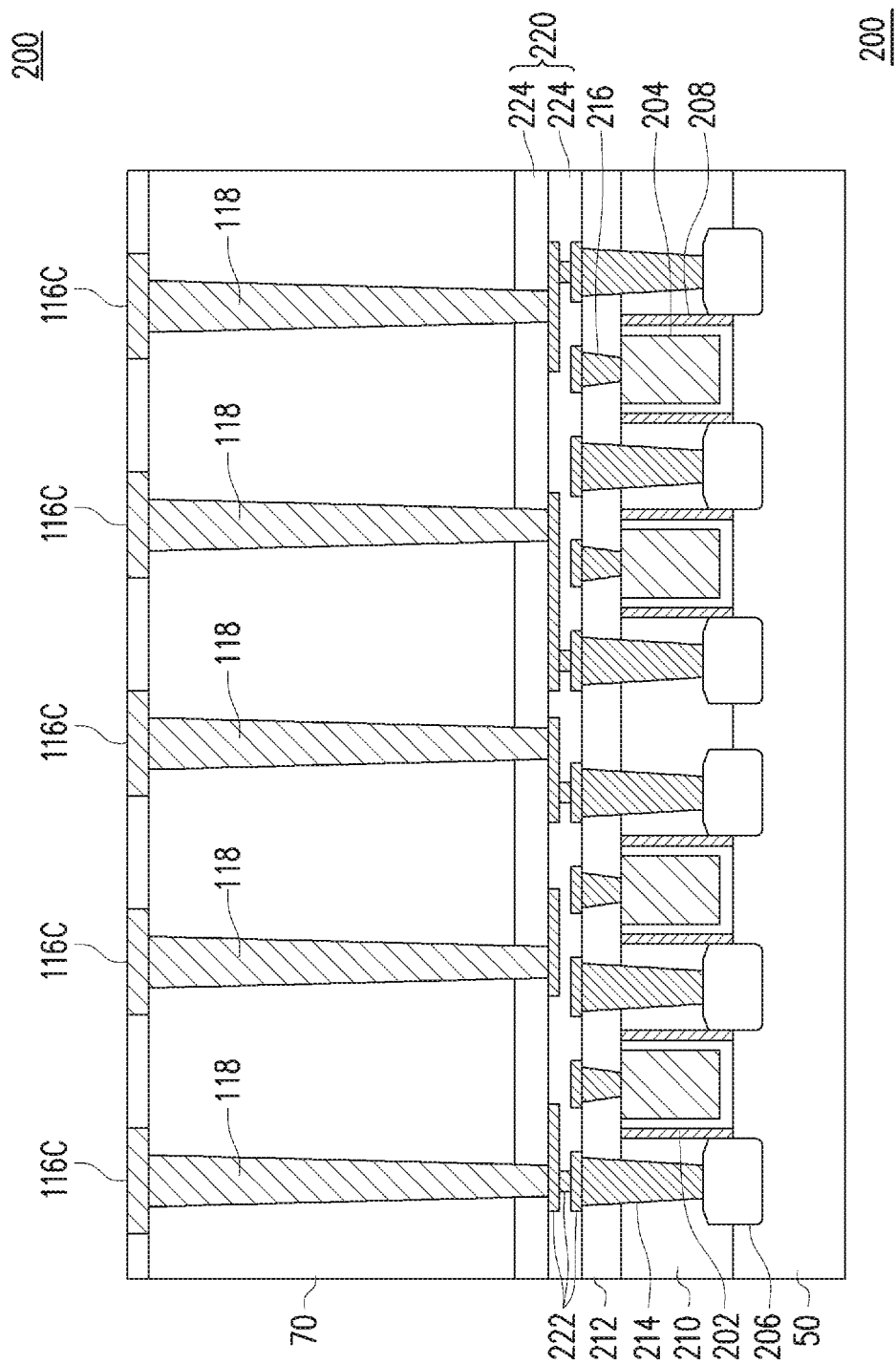
Figure 28D:
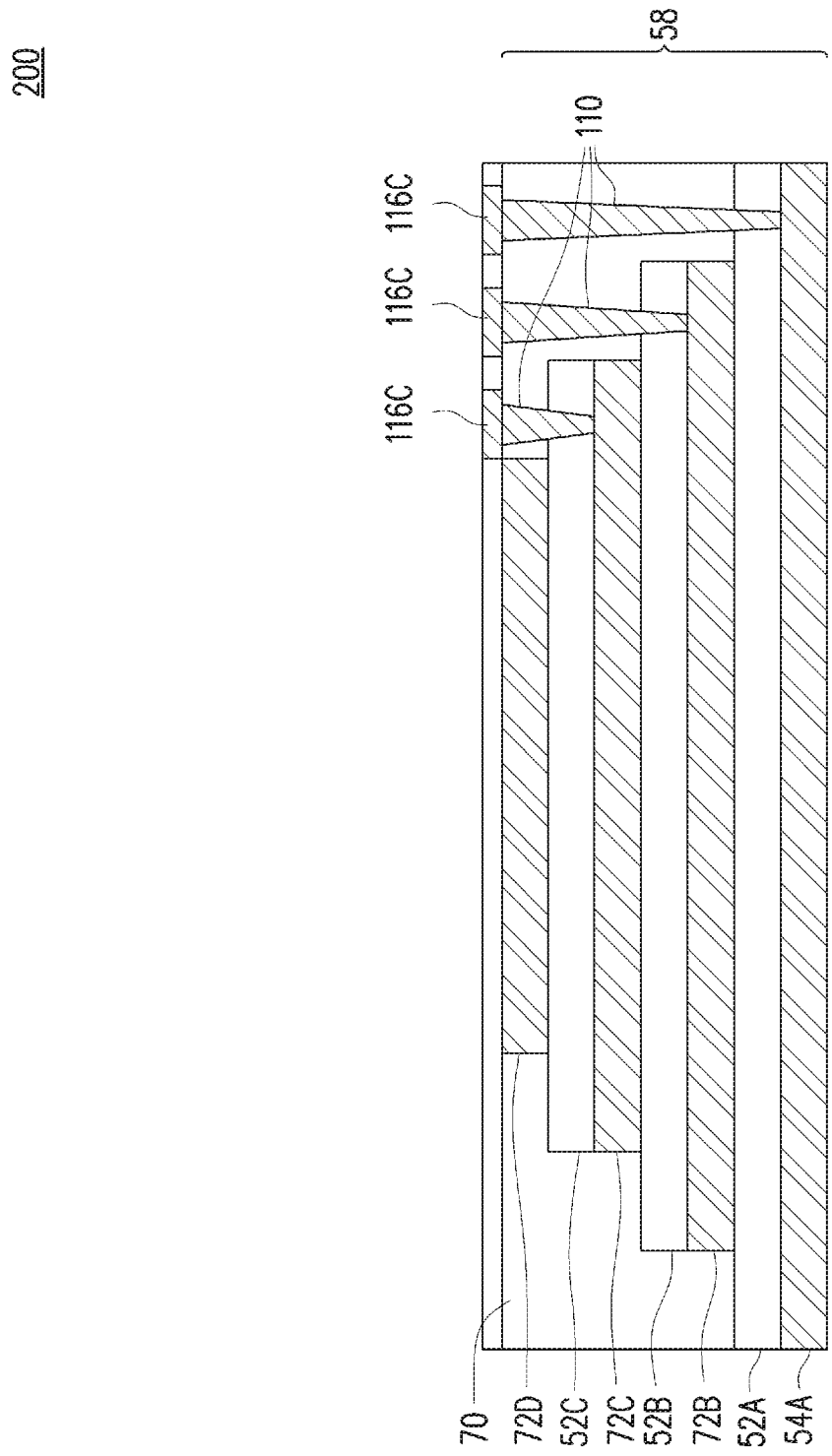

In FIGS. 28A, 28B, 28C, and 28D, contacts 110 are made to the conductive lines 72, the conductive lines 106, and the conductive lines 108. FIG. 28A illustrates a perspective view of the memory array 200; FIG. 28B illustrates a top-down view of the memory array 200; and FIG. 28C illustrates a cross-sectional view of the device and underlying substrate alone the line 28-28C' of FIG. 28A; and FIG. 28D illustrates a cross-sectional view of the device along reference cross-section B-B' of FIG. 1A. In some embodiments, the staircase shape of the conductive lines 72 may provide a surface on each of the conductive lines 72 for the conductive contacts 110 to land on. Forming the contacts 110 may include patterning openings in the IMD 70 and the dielectric layers 52 to expose portions of the conductive layers 54 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the contacts 110 in the openings.

As also illustrated by the perspective view of FIG. 28A, conductive contacts 112 and 114 may also be made to the conductive lines 106 and the conductive lines 108, respectively. The conductive contacts 110, 112, and 114 may be electrically connected to conductive lines 116A, 116B, and 116C, respectively, which connect the memory array to an underlying/overlying circuitry (e.g., control circuitry) and/or signal, power, and ground lines in the semiconductor die. For example, conductive vias 118 may extend through the IMD 70 to electrically connect conductive lines 116C to the underlying circuitry of the interconnect structure 220 and the active devices on the substrate 50 as illustrated by FIG. 28C. Other conductive vias may be formed through the IMD 70 to electrically connect the conductive lines 116A and 116B to the underlying circuitry of the interconnect structure 220. In alternate embodiments, routing and/or power lines to and from the memory array may be provided by an interconnect structure formed over the memory array 200 in addition to or in lieu of the interconnect structure 220. Accordingly, the memory array 200 may be completed.

Although the embodiments of FIGS. 2 through 28B illustrate a particular pattern for the conductive lines 106 and 108, other configurations are also possible. For example, in these embodiments, the conductive lines 106/108 have a staggered pattern. In some embodiments, the conductive lines 106/108 that are in a same row of the array are all aligned with each other. The refill layers 96 may be formed on the conductive lines 106/108 as appropriate, using the techniques described herein.

FIGS. 29, 30, 31, and 32 illustrate plan views of intermediate steps in the formation of a memory array 200, in accordance with some embodiments. The process shown in FIGS. 29-32 is similar to the process described for FIGS. 22A through 26C, except that the OS layer 92 partially remains on the memory film 90 after the etching of the trenches 100. This incomplete etching of the OS layer 92 can produce trenches 100 having a round shape, an example of which is shown in FIG. 29. The memory film 90 is exposed by the trenches 100, but remaining portions of the OS layer 92 cover larger portions of the memory film 90 than for the trenches 100 shown in FIG. 22B. In some embodiments, the incomplete etching of the OS layer 92 exposes a larger area of the OS layer 92 within the trenches, which can increase the contact area between the subsequently formed refill layer 96 (see FIG. 30) and the OS layer 92. In some cases, increasing the contact area between the OS layer 92 and the refill layer 96 can reduce resistance. The trenches 100 shown in FIGS. 22B and 29 are examples, and trenches 100 having other shapes are possible.

Figure 30:
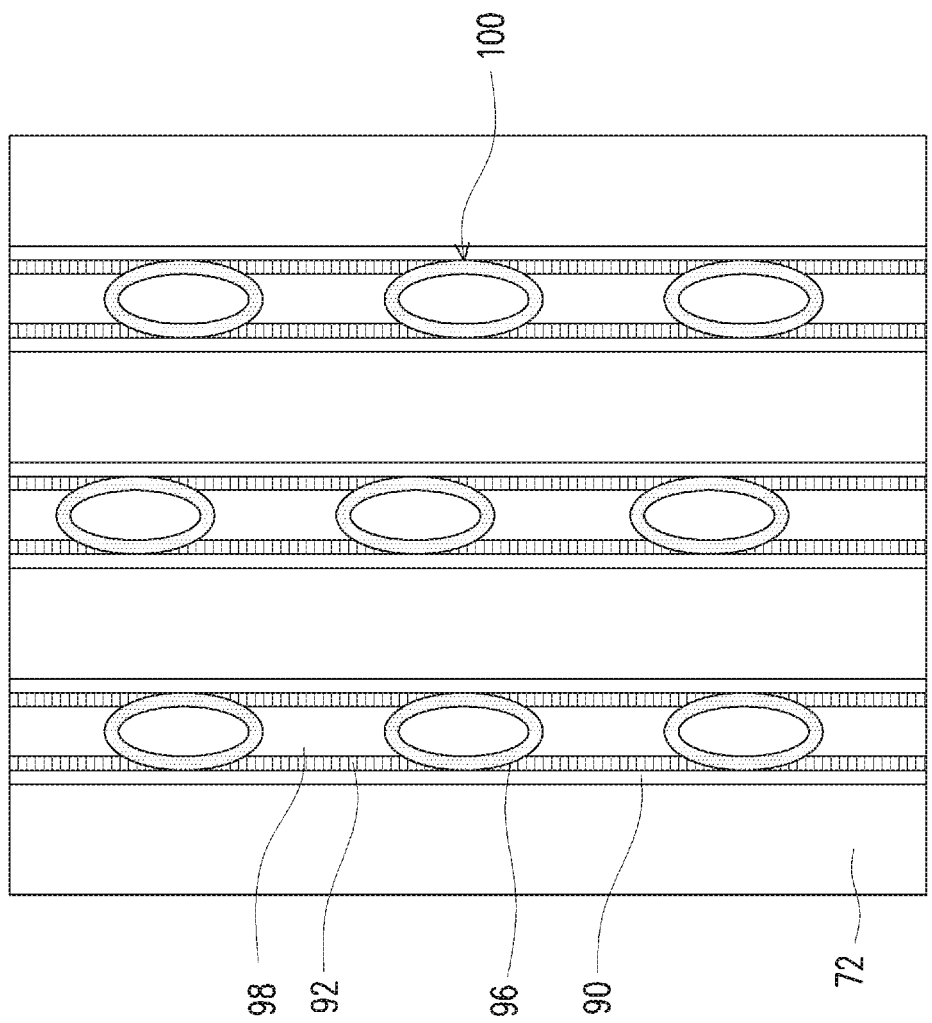
Figure 31:
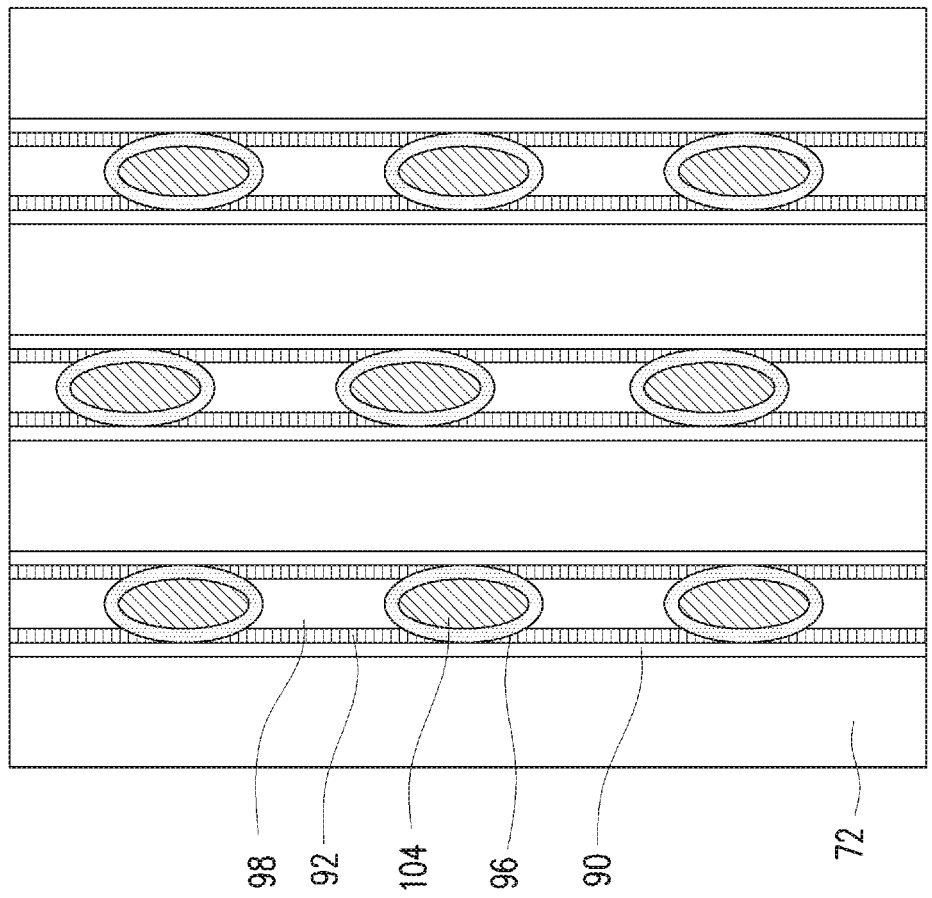
Figure 32:
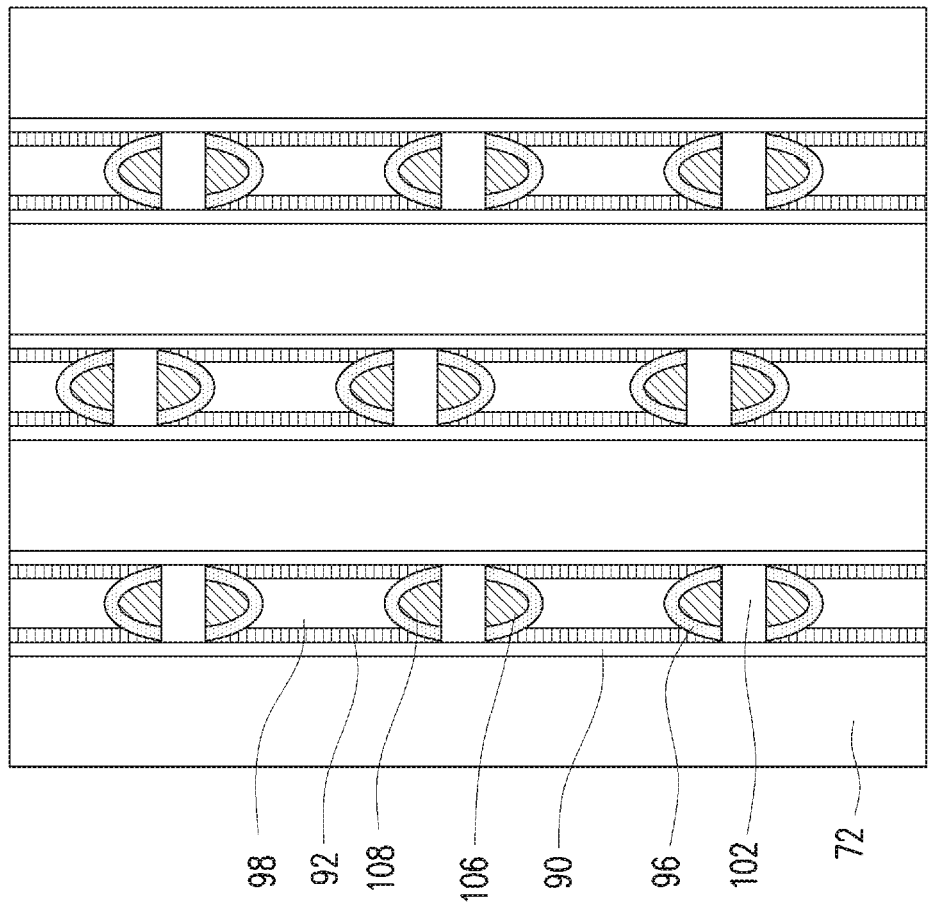

In FIG. 30, the refill layer 96 is deposited within the trenches 100, in accordance with some embodiments. The refill layer 96 may be similar to the refill layer 96 described previously for FIGS. 23A-C, and may be formed in a similar manner. In FIG. 31, the conductive material 104 is deposited within the trenches 100 and on the refill layer 96. The conductive material 104 may be similar to the conductive material 104 described previously for FIGS. 24A-C, and may be formed in a similar manner. In FIG. 32, trenches are formed in the conductive material 104 and the refill layer 96, and a dielectric material 102 is deposited in the trenches. The trenches may be similar to the trenches 120 described previously for FIGS. 25A-C, and may be formed in a similar manner. The dielectric material 102 may be similar to the dielectric material 102 described previously for FIGS. 26A-C, and may be formed in a similar manner. In this manner, conductive lines 106 and conductive lines 108 are formed. The conductive lines 106/108 make electrical contact to the OS layer 92 through the refill layer 96, which can reduce contact resistance as described previously.

FIGS. 33, 34, 35, and 36 illustrate plan views of intermediate steps in the formation of a memory array 200, in accordance with some embodiments. The process shown in FIGS. 33-36 is similar to the process described for FIGS. 22A through 26C, except that the refill layer 96 is selectively deposited on the memory film 90. Selectively depositing the refill layer 96 in this manner can increase the size (e.g., the length L5) of the conductive lines 106/108 while still providing improved contact resistance between the conductive lines 106/108 and the OS layer 92. Increasing the size of the conductive lines 106/108 can improve conductivity of the conductive lines 106/108 and improve device performance.

Figure 33:
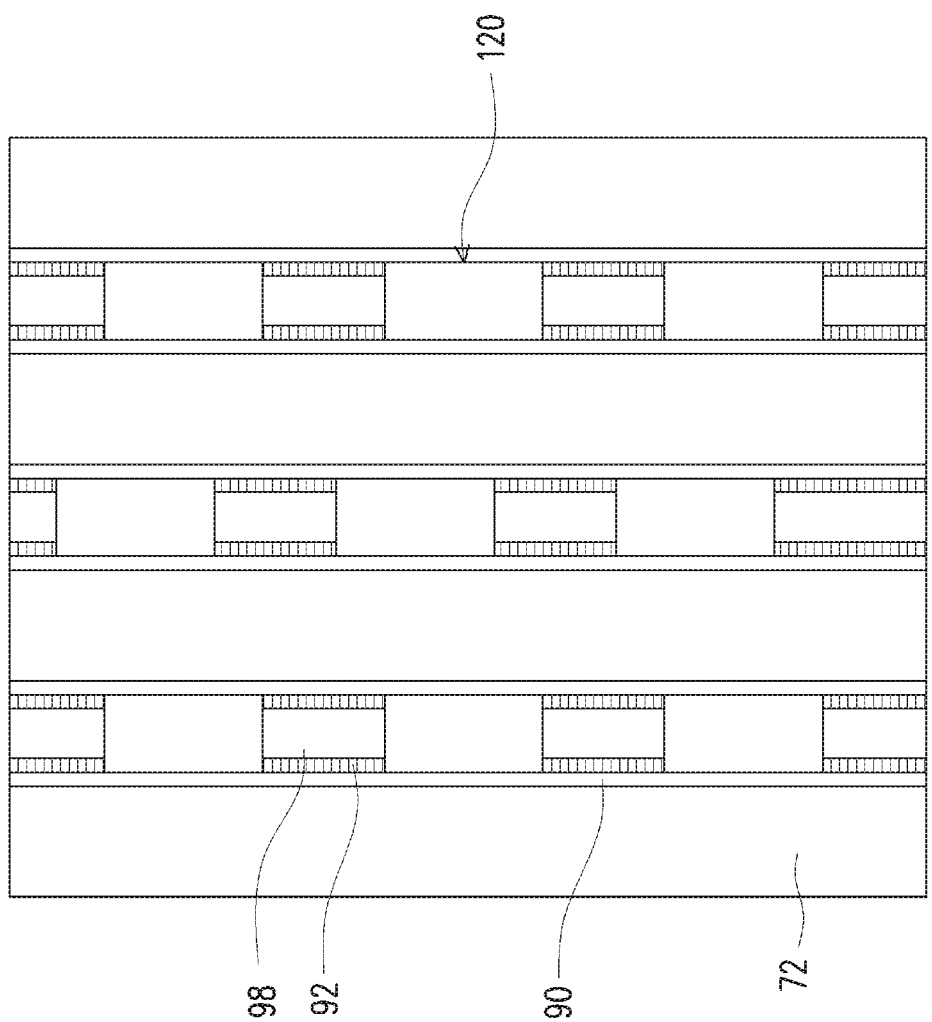
FIGS. 33, 34, 35, and 36 illustrate varying views of intermediate steps in the manufacture of a memory array, in accordance with some embodiments.
Figure 34:
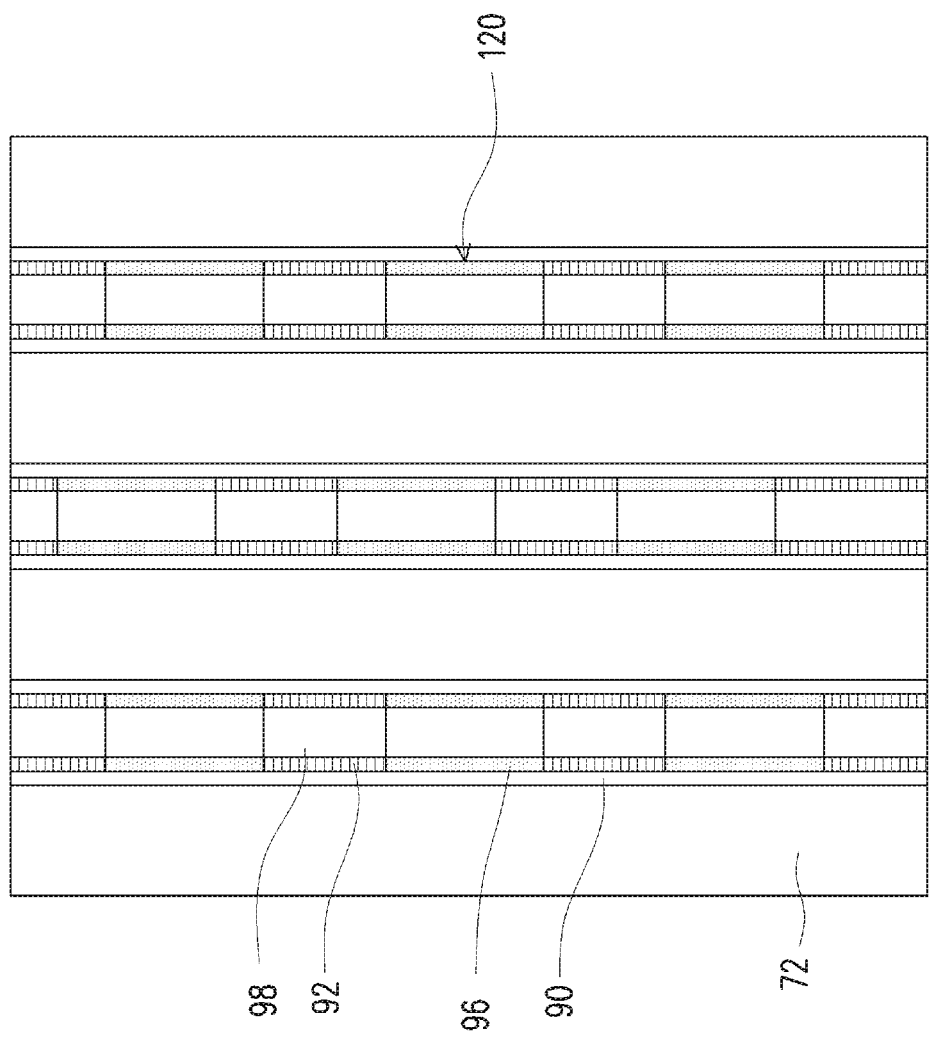

FIG. 33 shows a plan view after the trenches 100 have been formed, similar to the plan view shown in FIG. 22B. In FIG. 34, the refill layer 96 is deposited within the trenches 100, in accordance with some embodiments. As shown in FIG. 34, the refill layer 96 is formed using a selective deposition process such that the refill layer 96 is formed on exposed portions of the memory film 90 and not formed on the dielectric material 98. In some embodiments, the selectively deposited refill layer 96 is a material such as ITO, IWO, ZnO, $In_2O_3$, the like, or combinations thereof though other materials are possible. The refill layer 96 may be formed using a selective deposition process, such as selective ALD, CVD, the like, or other selective deposition processes. For example, the refill layer 96 may be $In_2O_3$ deposited using ALD by $In(CH_3)_3$ and $H_2O$ at a temperature of about 200° C. This example process deposits the refill layer 96 on the memory film 90 but not on the dielectric material 98, though other materials or processes are possible. The refill layer 96 may be a material similar to those described previously for FIGS. 23A-C, or may be a different material.

Figure 35:
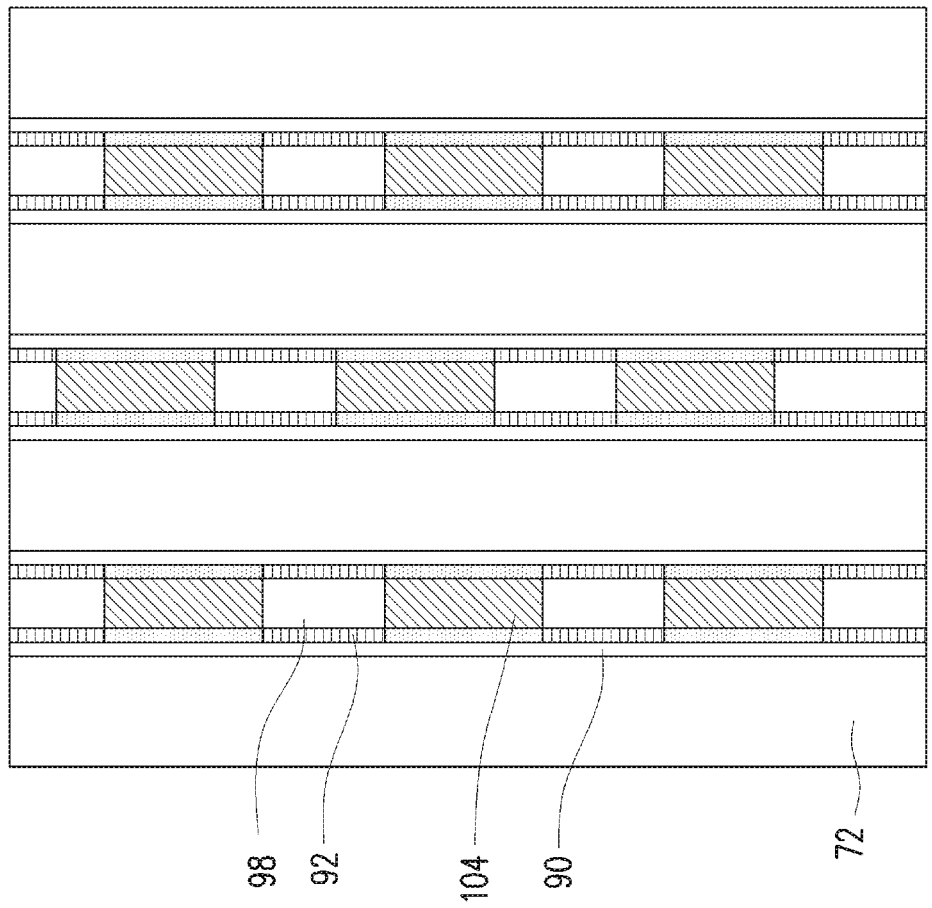
Figure 36:
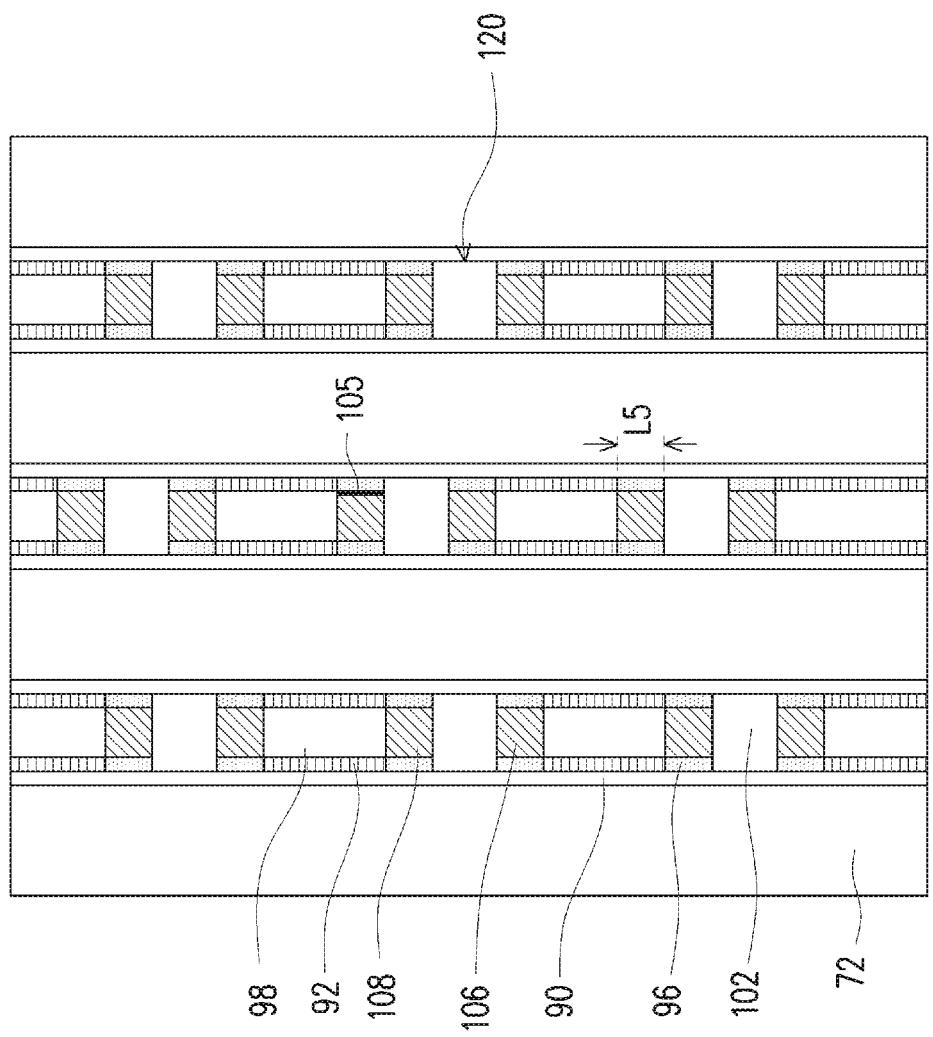

In FIG. 35, the conductive material 104 is deposited within the trenches 100 and on the refill layer 96. The conductive material 104 may be similar to the conductive material 104 described previously for FIGS. 24A-C, and may be formed in a similar manner. Because the refill layer 96 does not cover the dielectric material 98, the conductive material 104 is deposited on portions of the dielectric material 98 within the trenches 100. In FIG. 36, trenches are formed in the conductive material 104 and the refill layer 96, and a dielectric material 102 is deposited in the trenches. The trenches may be similar to the trenches 120 described previously for FIGS. 25A-C, and may be formed in a similar manner. The dielectric material 102 may be similar to the dielectric material 102 described previously for FIGS. 26A-C, and may be formed in a similar manner. In this manner, conductive lines 106 and conductive lines 108 are formed. The conductive lines 106/108 make electrical contact to the OS layer 92 through the refill layer 96, which can reduce contact resistance as described previously.

Various embodiments provide a 3D memory array with vertically stacked memory cells. The memory cells each comprise a transistor with a memory film, gate dielectric material and an oxide semiconductor channel region. The transistor comprises source/drain electrodes, which are also source lines and bits lines in the memory array. A dielectric material is disposed between and isolates adjacent ones of the source/drain electrodes. In some embodiments, etching the trenches in which the source/drain electrodes are formed, a refill layer is deposited on surfaces of the trenches to provide improved contact between the source/drain electrodes and the oxide semiconductor channel regions. For example, in some cases, oxide semiconductor channel material is removed during the trench etching process, which can reduce the possible contact area between the oxide semiconductor channel material and the source/drain electrodes. By depositing a refill material within the trenches, the removed oxide semiconductor channel material can be replaced. Additionally, the refill material can provide an increased effective contact area between the oxide semiconductor channel material and the source/drain electrodes. By increasing the effective contact area, the contact resistance between the oxide semiconductor channel material and the source/drain electrodes can be reduced. In some embodiments, the refill material may be formed of a material that provides an improved contact, such as a material having a higher carrier concentration than the oxide semiconductor channel material. By reducing the contact resistance in this manner, device performance can be improved. For example, the techniques described herein can allow for an improved on current ($I_{on}$) of a memory cell, improved power efficiency, and other benefits.

In accordance with an embodiment of the present disclosure, a memory cell includes a semiconductor substrate; and a transistor over the semiconductor substrate, the transistor including a memory film extending along a word line, wherein the memory film contacts the word line; a channel layer extending along the memory film, wherein the memory film is between the channel layer and the word line; a source line extending along the memory film, wherein the memory film is between the source line and the word line; a first contact layer on the source line, wherein the first contact layer contacts the channel layer and the memory film, wherein the first contact layer includes a first material; a bit line extending along the memory film, wherein the memory film is between the bit line and the word line; a second contact layer on the bit line, wherein the second contact layer contacts the channel layer and the memory film, wherein the second contact layer includes the first material; and an isolation region between the source line and the bit line. In an embodiment, the isolation region contacts the source line and the bit line. In an embodiment, the first contact layer extends between the source line and the isolation region, and wherein the second contact layer extends between the bit line and the isolation region. In an embodiment, the channel layer includes the first material. In an embodiment, the first material has a higher carrier concentration than the channel layer. In an embodiment, the first material includes an oxide. In an embodiment, the channel layer has a first thickness, the first contact layer has a second thickness, and the second contact layer has the second thickness, wherein the first thickness is different from the second thickness.

In accordance with an embodiment of the present disclosure, a device includes a semiconductor substrate; a first memory cell over the semiconductor substrate, the first memory cell including a first transistor, wherein the first transistor includes a gate electrode including a portion of a first word line; a first portion of a ferroelectric material, wherein the first portion of the ferroelectric material is on a sidewall of the first word line; and a first channel region on a sidewall of the first portion of the ferroelectric material; a source line, wherein a first portion of the source line provides a first source/drain electrode for the first transistor; a first contact layer on the source line, wherein the source line makes electrical contact to the first channel region through the first contact layer; a bit line, wherein a first portion of the bit line provides a second source/drain electrode for the first transistor; a second contact layer on the bit line, wherein the bit line makes electrical contact to the first channel region through the second contact layer; a first dielectric material separating the source line and the bit line; and a second memory cell over the first memory cell. In an embodiment, the second memory cell includes a second transistor, wherein a second portion of the source line provides a first source/drain electrode for the second transistor, and wherein a second portion of the bit line provides a second source/drain electrode for the second transistor. In an embodiment, the device includes a second word line under the first word line, wherein a gate electrode of the second transistor includes a portion of the second word line, and wherein the first word line is longer than the second word line. In an embodiment the first dielectric material physically contacts the first channel region, the first contact layer, and the second contact layer. In an embodiment, the first contact layer and the second contact layer include a first material, and wherein the first channel region includes a second material that is different from the first material. In an embodiment, the contact area between the source line and the first contact layer is greater than the contact area between the first contact layer and the first channel region. In an embodiment, the first portion of the ferroelectric material physically contacts the first contact layer and the second contact layer. In an embodiment, the first channel region extends between a portion of the first contact layer and the first portion of the ferroelectric material. In an embodiment, a sidewall of the source line is free of the first contact layer.

In accordance with an embodiment of the present disclosure, a method includes patterning a first trench extending through a first conductive line; depositing a memory film along sidewalls and a bottom surface of the first trench; depositing an oxide semiconductor (OS) layer over the memory film, wherein the OS layer extends along the sidewalls and the bottom surface of the first trench; depositing a first dielectric material on the OS layer, wherein the first dielectric material fills the remaining portion of the first trench; patterning a second trench in the first dielectric material and the OS layer, wherein patterning the second trench exposes a sidewall surface of the memory film and a sidewall surface of the OS layer; depositing a refill layer along sidewalls and a bottom surface of the second trench, wherein the refill layer physically contacts the sidewall surface of the OS layer; depositing a conductive material on the refill layer, wherein the conductive material fills the remaining portion of the second trench; patterning a third trench in the conductive material and the refill layer, wherein patterning the third trench exposes the sidewall surface of the memory film and a sidewall surface of the refill layer; and depositing a second dielectric material in the third trench, wherein the second dielectric material fills the third trench. In an embodiment, depositing the refill layer includes performing a selective deposition process that selectively deposits the refill layer on surfaces of the memory film and on surfaces of the OS layer more than on surfaces of the first dielectric material. In an embodiment, the refill layer has a different composition than the OS layer. In an embodiment, the refill layer is deposited to a different thickness than the OS layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
    a semiconductor substrate; and
    a transistor over the semiconductor substrate, the transistor comprising:
        a memory film extending along a word line, wherein the memory film contacts the word line;
        a channel layer extending along the memory film, wherein the memory film is between the channel layer and the word line;
        a source line extending along the memory film, wherein the memory film is between the source line and the word line;
        a first contact layer on the source line, wherein the first contact layer contacts the channel layer and the memory film, wherein the first contact layer comprises a first material;
        a bit line extending along the memory film, wherein the memory film is between the bit line and the word line;
        a second contact layer on the bit line, wherein the second contact layer contacts the channel layer and the memory film, wherein the second contact layer comprises the first material; and
        an isolation region between the source line and the bit line.

2. The memory cell of claim 1, wherein the isolation region contacts the source line and the bit line.

3. The memory cell of claim 1, wherein the first contact layer extends between the source line and the isolation region, and wherein the second contact layer extends between the bit line and the isolation region.

4. The memory cell of claim 1, wherein the channel layer comprises the first material.

5. The memory cell of claim 1, wherein the first material has a higher carrier concentration than the channel layer.

6. The memory cell of claim 1, wherein the first material comprises an oxide.

7. The memory cell of claim 1, wherein the channel layer has a first thickness, the first contact layer has a second thickness, and the second contact layer has the second thickness, wherein the first thickness is different from the second thickness.

8. A device comprising:
    a semiconductor substrate;
    a first memory cell over the semiconductor substrate, the first memory cell comprising a first transistor, wherein the first transistor comprises:
        a gate electrode comprising a portion of a first word line;
        a first portion of a ferroelectric material, wherein the first portion of the ferroelectric material is on a sidewall of the first word line; and
        a first channel region on a sidewall of the first portion of the ferroelectric material;
    a source line, wherein a first portion of the source line provides a first source/drain electrode for the first transistor;

a first contact layer on the source line, wherein the source line makes electrical contact to the first channel region through the first contact layer, wherein the first contact layer physically contacts the first portion of the ferroelectric material;

a bit line, wherein a first portion of the bit line provides a second source/drain electrode for the first transistor;

a second contact layer on the bit line, wherein the bit line makes electrical contact to the first channel region through the second contact layer, wherein the second contact layer physically contacts the first portion of the ferroelectric material;

a first dielectric material separating the source line and the bit line; and a second memory cell over the first memory cell.

9. The device of claim 8, wherein the second memory cell comprises a second transistor, wherein a second portion of the source line provides a first source/drain electrode for the second transistor, and wherein a second portion of the bit line provides a second source/drain electrode for the second transistor.

10. The device of claim 9 further comprising a second word line under the first word line, wherein a gate electrode of the second transistor comprises a portion of the second word line, and wherein the first word line is longer than the second word line.

11. The device of claim 8, wherein the first dielectric material physically contacts the first channel region, the first contact layer, and the second contact layer.

12. The device of claim 8, wherein the first contact layer and the second contact layer comprise a first material, and wherein the first channel region comprises a second material that is different from the first material.

13. The device of claim 8, wherein the contact area between the source line and the first contact layer is greater than the contact area between the first contact layer and the first channel region.

14. The device of claim 8 further comprising a second dielectric material on the first portion of the ferroelectric material, wherein the second dielectric material physically contacts the first contact layer and the source line.

15. The device of claim 8, wherein the first channel region extends between a portion of the first contact layer and the first portion of the ferroelectric material.

16. The device of claim 8, wherein a sidewall of the source line is free of the first contact layer.

17. A device comprising:

a stack of word lines;

a memory film extending on the sidewalls of the word lines in the stack of word lines;

an oxide semiconductor (OS) layer over the memory film;

a first insulating material over the OS layer;

a bit line extending on the memory film, comprising:

a first conductive material physically contacting the memory film, the OS layer, and the first insulating material; and a second conductive material physically contacting the first conductive material; and a second insulating material extending on the memory film, wherein the second insulating material physically contacts the memory film, the first conductive material, and the second conductive material.

18. The device of claim 17, wherein the first insulating material is separated from the second insulating material by the bit line.

19. The device of claim 17, wherein the memory film comprises a ferroelectric material.

20. The device of claim 17, wherein the word lines extend in a horizontal direction and the bit line extends in a vertical direction.

* * * * *